United States Patent

Murakami et al.

US010410597B2

(10) Patent No.: US 10,410,597 B2
(45) Date of Patent: Sep. 10, 2019

(54) SHIFT REGISTER

(71) Applicant: SHARP KABUSHIKI KAISHA, Sakai, Osaka (JP)

(72) Inventors: Yuhichiroh Murakami, Sakai (JP); Shige Furuta, Sakai (JP); Hidekazu Yamanaka, Sakai (JP); Yasushi Sasaki, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 99 days.

(21) Appl. No.: 15/570,291

(22) PCT Filed: Apr. 21, 2016

(86) PCT No.: PCT/JP2016/062603
§ 371 (c)(1),
(2) Date: Oct. 27, 2017

(87) PCT Pub. No.: WO2016/175117
PCT Pub. Date: Nov. 3, 2016

(65) Prior Publication Data
US 2018/0137831 A1 May 17, 2018

(30) Foreign Application Priority Data

Apr. 28, 2015 (JP) ................................. 2015-091119

(51) Int. Cl.
*G09G 3/36* (2006.01)
*G11C 19/28* (2006.01)
*G09G 3/20* (2006.01)

(52) U.S. Cl.
CPC ............. *G09G 3/3677* (2013.01); *G09G 3/20* (2013.01); *G11C 19/28* (2013.01);
(Continued)

(58) Field of Classification Search
CPC ...... G09G 3/20; G09G 3/3266; G09G 3/3674; G09G 3/3677; G09G 2300/0408;
(Continued)

(56) References Cited

U.S. PATENT DOCUMENTS 9,269,318 B2 * 2/2016 Sasaki .................. G09G 3/3677
9,632,527 B2 * 4/2017 Sasaki ..................... G11C 19/28
(Continued)

FOREIGN PATENT DOCUMENTS

JP 2004-524639 A 8/2004
WO 2009/084267 A1 7/2009
(Continued)

OTHER PUBLICATIONS

Co-pending letter which recites a co-pending application.

*Primary Examiner* — Patrick O Neill
(74) *Attorney, Agent, or Firm* — ScienBiziP, P.C.

(57) ABSTRACT

A unit circuit 11 of a shift register is provided with a transistor Tr10 for supplying an off potential to a node n1 via a drain terminal when performing an all-on output. An all-on control signal AON is supplied to a gate terminal of the transistor Tr10. Instead of a low level potential VSS supplied from a power supply circuit, an initialization signal INIT which becomes a low level when performing the all-on output supplied to a source terminal of the transistor Tr10. Since the all-on signal AON and the initialization signal INIT are supplied from an outside, even if noise is imposed on the low level potential VSS when performing the normal operation, the transistor Tr10 does not turn on and charge does not escape from the node 1. With this, it is possible to prevent malfunction of the shift register due to noise imposed on the off potential supplied from the power supply circuit.

19 Claims, 38 Drawing Sheets

(52) U.S. Cl.
CPC ............... *G09G 2310/0267* (2013.01); *G09G 2310/0286* (2013.01); *G09G 2320/0219* (2013.01)

(58) Field of Classification Search
CPC ... G09G 2310/0267; G09G 2310/0286; G09G 2320/0219; G11C 19/28
See application file for complete search history.

(56) References Cited

U.S. PATENT DOCUMENTS

| | | |
|---|---|---|
| 9,715,940 B2 * | 7/2017 | Murakami ........... G09G 3/3677 |
| 9,881,688 B2 * | 1/2018 | Sasaki ................. G11C 19/184 |
| 2002/0149318 A1 | 10/2002 | Jeon et al. |
| 2010/0259525 A1 | 10/2010 | Ohkawa et al. |
| 2013/0155044 A1 | 6/2013 | Ohkawa et al. |
| 2013/0156148 A1 | 6/2013 | Sasaki et al. |
| 2016/0018844 A1 | 1/2016 | Sasaki et al. |
| 2016/0240159 A1 | 8/2016 | Ohkawa et al. |
| 2016/0253977 A1 | 9/2016 | Ohkawa et al. |

FOREIGN PATENT DOCUMENTS

| | | |
|---|---|---|
| WO | 2012/029799 A1 | 3/2012 |
| WO | 2012/029876 A1 | 3/2012 |
| WO | 2014/148171 A1 | 9/2014 |
| WO | 2015/012207 A1 | 1/2015 |
| WO | 2015/052999 A1 | 4/2015 |

* cited by examiner

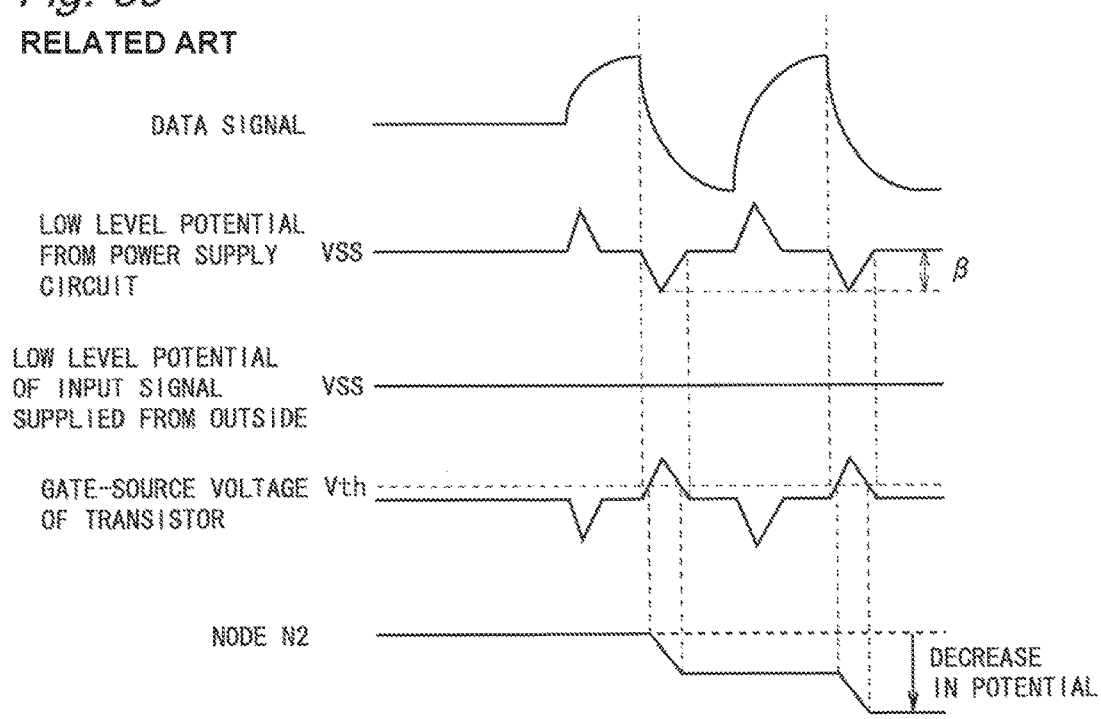

US 10,410,597 B2

SHIFT REGISTER

TECHNICAL FIELD

The present invention relates to a shift register, and especially to a shift register suitably used for a drive circuit of a display device and the like.

BACKGROUND ART

An active-matrix type display device displays an image by selecting pixel circuits arranged two-dimensionally in unit of row and writing voltages in accordance with image data to the selected pixel circuits. In order to select the pixel circuits in unit of row, a shift register for sequentially shifting an output signal based on a clock signal is used as a scanning line drive circuit. Furthermore, in a display device for performing a dot sequential drive, a similar shift register is provided inside a data line drive circuit.

In a liquid crystal display device or the like, a drive circuit of the pixel circuits may be formed integrally with the pixel circuits using a manufacturing process for forming a TFT (Thin Film Transistor) in the pixel circuit. In this case, in order to reduce a manufacturing cost, it is preferable to form the drive circuit including the shift register with transistors having a same conductive type as the TFT.

Regarding the shift register, various circuits are conventionally known. For example, Patent Document 1 describes a shift register in which unit circuits 901 shown in FIG. 38 are connected in multi-stage. The shift register performs a normal operation when an all-on control signal AON is at a low level and a negative signal AONB of the all-on control signal is at a high level. At this time, transistors Q21, Q23, Q24 turn off and a transistor Q22 turns on.

The normal operation of the unit circuit 901 will be described below. At first, when an input signal IN changes to the high level, a transistor Q1 turns on, a potential of a node N1 is increased to (VDD−Vth) (Vth is a threshold voltage of the TFT), the node N1 becomes a floating state, and transistors Q2, Q31 turn on. Since a clock signal CK is at the low level at this time, output signals OUT1, OUT2 are at the low level. Furthermore, when the input signal IN changes to the high level, a transistor Q7 turns on, and a potential of a node N2 becomes the low level. Next, when the input signal IN changes to the low level, the transistors Q1, Q7 turn off.

Next, when the clock signal CK changes to the high level, the output signals OUT1, OUT2 become the high level. At this time, the potential of the node N1 is pushed up via a capacitor C1 and parasitic capacitance of the transistors Q2, Q31, and the potential of the node N1 becomes higher than (VDD+Vth) Thus, potentials of the output signals OUT1, OUT2 become VDD. Next, when the clock signal CK changes to the low level, the potential of the node N1 returns to (VDD−Vth) and the output signals OUT1, OUT2 become the low level.

Next, when a clock signal CKB changes to the high level, a transistor Q6 turns on, the potential of the node N2 is increased to (VDD−Vth), and the node N2 becomes the floating state. Thus, transistors Q3, Q4, Q32 turn on and the potential of the node N1 becomes the low level. Next, when the clock signal CKB changes to the low level, the transistor Q6 turns off.

After that, the clock signal CKB becomes the high level and the low level in a predetermined cycle. In a high level period of the clock signal CKB, the transistor Q6 turns on and a high level potential is applied to the node N2. In a low level period of the clock signal CKB, the transistor Q6 turns off and the node N2 keeps the high level potential in the floating state.

When the all-on control signal AON is at the high level and the negative signal AONB of the all-on control signal is at the low level, the shift register performs an operation (hereinafter referred to as all-on output) for setting all of the output signal OUT1 to an on level (a level at which transistor turns on). At this time, the transistors Q21, Q23, Q24 turn on and the transistor Q22 turns off. Thus, the potential of the node N2 becomes the high level, the transistors Q4, Q32 turn on, the potential of the node N1 becomes the low level, and the transistors Q2, Q31 turn off. Furthermore, since a gate potential of the transistor Q3 becomes the low level, the transistor Q3 turns off. In this manner, since the transistors Q2, Q3 turn off and the transistor Q24 turns on, the output signal OUT1 becomes the high level. On the other hand, since the transistor Q31 turns off and the transistor Q32 turns on, the output signal OUT2 becomes the low level.

In a display device (refer to FIG. 35 described later) including the shift register as the scanning line drive circuit, the shift register performs the all-on output, for example, when a power is turned on or off. With this, it is possible to select all of the scanning lines collectively, turn on write control transistors included in all of the pixel circuits in a display area, and discharge charge accumulated in the pixel circuits to data lines. Furthermore, the shift register performs the all-on output when testing a display panel. With this, it is possible to turn on the write control transistors included in all of the pixel circuits in the display area, and write a check voltage to all of the pixel circuits collectively.

Related to the invention of this application, Patent Document 2 describes providing, to a unit circuit of a shift register, an initialization transistor having one end connected to a control terminal of an output transistor and a control terminal to which an initialization signal is supplied, and connecting the other end of the initialization transistor to a node which has an off potential when performing an initialization and has an on potential of a same level as a clock signal when the clock signal having the on potential is output.

PRIOR ART DOCUMENTS

Patent Documents

[Patent Document 1] WO2009/84267
[Patent Document 2] WO2014/148171

SUMMARY OF THE INVENTION

Problems to be Solved by the Invention

In the display device, a scanning line intersects with the data lines in the display area. Thus, when data voltages applied to the data lines change, noise is imposed on a signal on the scanning line via intersection portions. The shift register functioning as the scanning line drive circuit applies a high level potential VDD to one scanning line selected from among a plurality of the scanning lines, and applies a low level potential VSS to the remaining scanning lines. Thus, most of noise generated in the display area is imposed on the low level potential VSS.

The shift register in which the unit circuits 901 are connected in multi-stage has a problem that the shift register may malfunction due to the noise imposed on the low level potential VSS. When the shift register performs the normal operation, the transistor Q22 turns on and the transistor Q23 turns off. In the low level period of the clock signal CKB, the node N2 keeps a high level potential in the floating state. The all-on control signal AON supplied to a gate terminal of the transistor Q23 is supplied from a display control circuit (circuit other than power supply circuit) provided outside the shift register. Thus, the all-on control signal AON is not affected by the noise generated in the display area. On the other hand, the low level potential VSS applied to a source terminal of the transistor Q23 is supplied from the power supply circuit. Thus, noise is likely to be imposed on the low level potential VSS.

As shown in FIG. 39, when noise is imposed on the low level potential VSS supplied from the power supply circuit and the low level potential VSS is temporarily decreased to (VSS−β) (β is decrease amount of potential due to noise), a gate-source voltage of the transistor Q23 becomes β. When the voltage β exceeds a threshold voltage Vth of the transistor, the transistor Q23 turns on, charge accumulated at the node N2 escape, and the potential of the node N2 is decreased. Thus, the transistor Q4 turns off and the node N1 becomes the floating state in some cases. If the clock signal CK changes when the node N1 is in the floating state, coupling noise occurs in the potential of the node N1 via the parasitic capacitance of the transistors Q2, Q31. When the potential of the node N1 is increased due to the noise and the transistors Q2, Q31 turn on, the shift register malfunctions. This problem may occur in a display device which divides one horizontal period into a plurality of periods, divides the data lines into a plurality of groups, and drives the data lines in the group in each period. This is because a voltage of the data line is changed a plurality of times while a same scanning line is selected in a horizontal period. Furthermore, also in a display device which drives the data lines without dividing the horizontal period, since a number of data lines driven at once is increased and fluctuation of potential due to the noise is increased, malfunction of the shift register may occur similarly.

Furthermore, since both of the nodes N1, N2 keep the low level potential in the floating state, all of the transistors Q2, Q3, Q31, Q32 turn off and the output terminals OUT1, OUT2 become the floating state. Since various kinds of noise are likely to be imposed on the output signal OUT1, a circuit connected to a later stage of the shift register malfunctions in some cases.

Furthermore, a start signal is supplied as the input signal IN to the unit circuit 901 in a first stage of the shift register. The low level potential VSS applied to a source terminal of the transistor Q7 is supplied from the power supply circuit. On the other hand, the start signal supplied to a gate terminal of the transistor Q7 is supplied from a circuit other than the power supply circuit. Thus, a problem similar to that occurs in the transistor Q23 may also occur in the transistor Q7.

In recent display devices, noise generated in the display area becomes a problem as a resolution is increased. As a method for reducing the noise generated in the display area and imposed on the low level potential VSS supplied from the power supply circuit, there is a method of thickening a power supply line to reduce resistance. However, since it is required to narrow a frame portion around the display area while performing a counterpart against noise, the power supply line can not be thickened sufficiently in many cases.

Accordingly, an object of the present invention is to provide a shift register which prevents malfunction due to noise imposed on an off potential supplied from a power supply circuit.

Means for Solving the Problems

According to a first aspect of the present invention, there is provided a shift register having a configuration in which a plurality of unit circuits are connected in multi-stage and configured to operate in accordance with a clock signal and a control signal supplied from an outside, wherein the unit circuit includes: an output transistor having a first conduction terminal connected to a clock terminal configured to input the clock signal, a second conduction terminal connected to an output terminal configured to output the clock signal, and a control terminal connected to a first node; an output reset transistor having a first conduction terminal connected to the output terminal, a second conduction terminal to which an off potential is applied, and a control terminal connected to a second node; and a node control unit configured to control potentials of the first and second nodes, the node control unit includes a control transistor provided corresponding to at least one of the first and second nodes and configured to control a potential of a corresponding node via a first conduction terminal, and the control transistor has a control terminal to which a first control signal that is included in the control signal and becomes an off level at least when performing a normal operation is supplied, and a second conduction terminal to which a second control signal that is included in the control signal and becomes the off level when the first control signal is at an on level is supplied.

According to a second aspect of the present invention, in the first aspect of the present invention, the first control signal is an all-on control signal which becomes the on level when performing an all-on output, and the second control signal is one of an initialization signal which becomes the on level when performing an initialization, a negative signal of the all-on control signal, and a start signal which becomes the on level when starting shift.

According to a third aspect of the present invention, in the second aspect of the present invention, the node control unit includes, as the control transistor, a first control transistor provided corresponding to the first node and configured to control the potential of the first node via a first conduction terminal, and a second control transistor provided corresponding to the second node and configured to control the potential of the second node via a first conduction terminal.

According to a fourth aspect of the present invention, in the first aspect of the present invention, the control transistor is provided corresponding to the first node, the first control signal is an initialization signal which becomes the on level when performing an initialization, and the second control signal is one of an all-on control signal which becomes the on level when performing an all-on output, a start signal which becomes the on level when starting shift, and a negative signal of the initialization signal.

According to a fifth aspect of the present invention, in the first aspect of the present invention, the control transistor is provided corresponding to the second node, the first control signal is an all-on control signal which becomes the on level when performing an all-on output, and the second control signal is one of a start signal which becomes the on level when starting shift and a negative signal of the all-on control signal.

According to a sixth aspect of the present invention, in the first aspect of the present invention, the node control unit further includes: a first transistor configured to control the potential of the first node to be the on level in accordance with an input signal of the unit circuit; a second transistor configured to control the potential of the first node to be the off level in accordance with the potential of the second node; a third transistor configured to control the potential of the second node to be the off level in accordance with the input signal; and a fourth transistor configured to control the potential of the second node to be the on level in accordance with a second clock signal of the unit circuit.

According to a seventh aspect of the present invention, in the sixth aspect of the present invention, the node control unit further includes: a fifth transistor configured to control the potential of the second node to be the on level in accordance with an initialization signal which becomes the on level when performing an initialization; and a transistor having a first conduction terminal connected to the second node, a second conduction terminal to which the off potential is applied, and a control terminal connected to the output terminal, and the unit circuit further includes a transistor configured to control a potential of the output terminal to be the on level in accordance with an all-on control signal which becomes the on level when performing an all-on output.

According to an eighth aspect of the present invention, in the seventh aspect of the present invention, the first transistor is configured to supply a negative signal of the all-on control signal to the first node in accordance with the input signal.

According to a ninth aspect of the present invention, in the seventh aspect of the present invention, the node control unit further includes: a transistor configured to supply an on potential to the first transistor in accordance with a negative signal of the all-on control signal; a transistor having a conduction terminal connected to the second node, a conduction terminal connected to a third node, and a control terminal to which the negative signal of the all-on control signal is supplied; and a transistor configured to control the potential of the second node to be the off level in accordance with the all-on control signal, and a control terminal of the second transistor, a second conduction terminal of the fourth transistor, and a second conduction terminal of the fifth transistor are connected to the third node.

According to a tenth aspect of the present invention, in the sixth aspect of the present invention, in the unit circuit in a first stage, the second control signal is supplied to a second conduction terminal of the third transistor.

According to an eleventh aspect of the present invention, in the sixth aspect of the present invention, the node control unit further includes a transistor having a conduction terminal connected to the first node, a conduction terminal connected to one conduction terminals of the first and second transistors, and a control terminal to which an on potential is fixedly applied.

According to a twelfth aspect of the present invention, in the sixth aspect of the present invention, one conduction terminals of the first and second transistors are connected to the first node.

According to a thirteenth aspect of the present invention, in the first aspect of the present invention, the unit circuit includes a plurality of the output transistors and a plurality of the output reset transistors.

According to a fourteenth aspect of the present invention, there is provided a shift register having a configuration in which a plurality of unit circuits are connected in multi-stage and configured to operate in accordance with a clock signal and a control signal supplied from an outside, wherein the unit circuit includes: an output transistor having a first conduction terminal connected to a clock terminal configured to input the clock signal, a second conduction terminal connected to an output terminal configured to output the clock signal, and a control terminal connected to a first node; an output reset transistor having a first conduction terminal connected to the output terminal, a second conduction terminal to which an off potential is applied, and a control terminal to a second clock signal is supplied; and a node control unit configured to control a potential of the first node, the node control unit includes a control transistor configured to control the potential of the first node via a first conduction terminal, and the control transistor has a control terminal to which a first control signal that is included in the control signal and becomes an off level at least when performing a normal operation is supplied, and a second conduction terminal to which a second control signal that is included in the control signal and becomes the off level when the first control signal is at an on level is supplied.

According to a fifteenth aspect of the present invention, in the fourteenth aspect of the present invention, the first control signal is an all-on control signal which becomes the on level when performing an all-on output, and the second control signal is one of an initialization signal which becomes the on level when performing an initialization, a negative signal of the all-on control signal, and a start signal which becomes the on level when starting shift.

According to a sixteenth aspect of the present invention, in the fourteenth aspect of the present invention, the first control signal is an initialization signal which becomes the on level when performing an initialization, and the second control signal is one of an all-on control signal which becomes the on level when performing; an all-on output, a start signal which becomes the on level when starting shift, and a negative signal of the initialization signal.

According to a seventeenth aspect of the present invention, in the fourteenth aspect of the present invention, the node control unit further includes: a first transistor configured to control the potential of the first node to be the on level in accordance with an input signal of the unit circuit; and a second transistor configured to control the potential of the first node to be the off level in accordance with the second clock signal.

According to an eighteenth aspect of the present invention, in the seventeenth aspect of the present invention, the unit circuit further includes: a transistor configured to control a potential of the output terminal to be the on level in accordance with do all-on control signal which becomes the on level when performing an all-on output; and a transistor configured to control the potential of the output terminal to be the off level in accordance with an initialization signal which becomes the on level when performing an initialization, and the node control unit further includes a transistor configured to supply the input signal to a first conduction terminal of the first transistor in accordance with a negative signal of the all-on control signal.

According to a nineteenth aspect of the present invention, there is provided a circuit including: a shift register according to any one of the first to eighteenth aspects; and a control signal generation circuit configured to generate a control signal to be supplied to the shift register, herein the control signal generation circuit includes: a set transistor configured to apply an on potential to a node; and a reset transistor having a first conduction terminal connected to the node, a control terminal to which a first control signal that becomes the off level at least when performing the normal operation is supplied from the outside, and a second conduction terminal to which a second control signal that becomes the off level when the first control signal is at the on level is supplied from the outside.

According to a twentieth aspect of the present invention, there is provided a display device including: a plurality of scanning lines arranged in parallel to each other; a plurality of data lines arranged in parallel to each other so as to intersect with the scanning lines perpendicularly; a plurality of pixel circuits arranged corresponding to intersections of the scanning lines and the data lines; and a shift register according to any one of the first to eighteenth aspects as a scanning line drive circuit configured to drive the scanning lines.

Effects of the Invention

According to the first aspect of the present invention, by providing the control transistor, the potential of the node can be controlled to be the off level when the first control signal is at the on level. Furthermore, it is possible to prevent charge escape from the node due to noise imposed on a potential supplied from a power supply circuit and prevent malfunction of the shift register, by supplying the control signal supplied from the outside to the control terminal and the second conduction terminal of the control transistor.

According to the second aspect of the present invention, the potential of the node can be controlled to be the off level when performing the all-on output. Furthermore, it is possible to prevent the charge escape from the node due to the noise imposed on the potential supplied from the power supply circuit and prevent malfunction of the shift register, by supplying the control signal supplied from the outside to the control terminal and the second conduction terminal of the control transistor.

According to the third aspect of the present invention, the potentials of the first and second nodes can be controlled to be the off level when performing the all-on output. Furthermore, it is possible to prevent charge escape from the first and second nodes due to the noise imposed on the potential supplied from the power supply circuit and prevent malfunction of the shift register, by supply the control signal supplied from the outside to the control terminal and the second conduction terminal of the first and second control transistors.

According to the fourth or sixteenth aspect of the present invention, the potential of the first node can be controlled to be the off level when performing the initialization. Furthermore, it is possible to prevent the charge escape from the first node due to the noise imposed on the potential supplied from the power supply circuit and prevent malfunction of the shift register, by supplying the control signal supplied from the outside to the control terminal and the second conduction terminal of the control transistor.

According to the fifth aspect of the present invention, the potential of the second node can be controlled to be the off level when performing the all-on output. Furthermore, it is possible to prevent the charge escape from the second node due to the noise imposed on the potential supplied from the power supply circuit and prevent malfunction of the shift register, by supplying the control signal supplied from the outside to the control terminal and the second conduction terminal of the control transistor.

According to the sixth aspect of the present invention, based on the input signal and the second clock signal, a state of the unit circuit can be switched between a state in which the potential of the first node is at the on level and the potential of the second node is at the off level, and an opposite state.

According to the seventh aspect of the present invention, the potential of the second node can be controlled to be the on level when performing the initialization, the potential of the second node can be stabilized when the potential of the output terminal is at the on level, and the potential of the output terminal can be controlled to be the on level when performing the all-on output.

According to the eighth aspect of the present invention, since the negative signal of the all-on control signal becomes the on level when performing the normal operation, the potential of the first node can be controlled to be the on level using the negative signal.

According to the ninth aspect of the present invention, when performing the normal operation, the second node and the third node are electrically connected, and the first transistor controls the potential of the first node to be the on level in accordance with the input signal. When performing the all-on output, the potential of the third node becomes the on level, the potentials of the first and second nodes become the off level, the output transistor turns off, and the potential of the output terminal becomes the on level. In this manner, the shift register can perform the normal operation and the ail-on output selectively.

According to the tenth aspect of the present invention, it is possible to prevent the charge escape from the second node in the unit circuit in the first stage due to the noise imposed on the potential supplied from the power supply circuit and prevent malfunction of the shift register, by supplying the control signal supplied from the outside to the second conduction terminal of the third transistor of the unit circuit in the first stage.

According to the eleventh aspect of the present invention, it is possible to control the potential of the first node using the first and second transistors and prevent a high voltage from being applied between terminals of the transistor connected to the first node.

According to the twelfth aspect of the present invention, the potential of the first node can be controlled directly using the first and second transistors.

According to the thirteenth aspect of the present invention, circuit amount of the shift register can be reduced by outputting a plurality of signals from one unit circuit.

According to the fourteenth aspect of the present invention, by providing the control transistor, it is possible to control the potential of the first node to be the off level when the first control signal is at the on level. Furthermore, it is possible to prevent the charge escape from the first node due to the noise imposed on the potential supplied from the power supply circuit and prevent malfunction of the shift register, by supplying the control signal supplied from the outside to the control terminal and the second conduction terminal of the control transistor.

According to the fifteenth aspect of the present invention, the potential of the first node can be controlled to be the off level when performing the all-on output. Furthermore, it is possible to prevent the charge escape from the first node due to the noise imposed on the potential supplied from the power supply circuit and prevent malfunction of the shift register, by supplying the control signal supplied from the outside to the control terminal and the second conduction terminal of the control transistor.

According to the seventeenth aspect of the present invention, based on the input signal and the second clock signal, a state of the unit circuit can be switched between a state in which the potential of the first node is at the on level and a state in which the potential of the first node is at the off level.

According to the eighteenth aspect of the present invention; the potential of the output terminal can be controlled to be the off level when performing the initialization, the potential of the output terminal can be controlled to be the on level when performing the all-on output, and the input signal can be supplied to the first conduction terminal of the first transistor when performing the normal operation.

According to the nineteenth aspect of the present invention, it is possible to prevent charge escape from the node due to the noise imposed on the potential supplied from the power supply circuit, by supplying the control signal supplied from the outside to the control terminal and the second conduction terminal of the reset transistor. With this, it is possible to prevent malfunction of the control signal generation circuit and malfunction of the shift register.

According to the twentieth aspect of the present invention, a reliable display device can be configured using a shift register which prevents malfunction due to the noise imposed on the potential supplied from the power supply circuit.

BRIEF DESCRIPTION OF THE DRAWINGS

FIG. 20 is a timing chart of the shift register shown in FIG. 16 when a power is turned on.

FIG. 39 is a diagram showing a decrease in a node potential in the conventional shift register.

MODES FOR CARRYING OUT THE INVENTION

In the following, shift registers according to embodiments of the present invention will be described with reference to the drawings. In the following description, when a conduction terminal of a transistor can be either a source terminal or a drain terminal, one conduction terminal is fixedly called a source terminal and the other conduction terminal is fixedly called a drain terminal. Furthermore, a signal which is input or output via a certain terminal s called by a same name as that of the terminal (for example, a signal which is input via a clock terminal CKA is referred to as a clock signal CKA). Furthermore, a potential which turns on the transistor when supplied to a gate terminal is referred to as "on potential", and a potential which turns off the transistor when supplied to the gate terminal is referred to as "off potential". For example, for an N-channel type transistor, a high level potential is the on potential and a low level potential is the off potential. Furthermore, it is assumed that a threshold voltage of the transistor is Vth, the high level potential is VDD, and the low level potential is VSS.

First Embodiment

Figure 1:
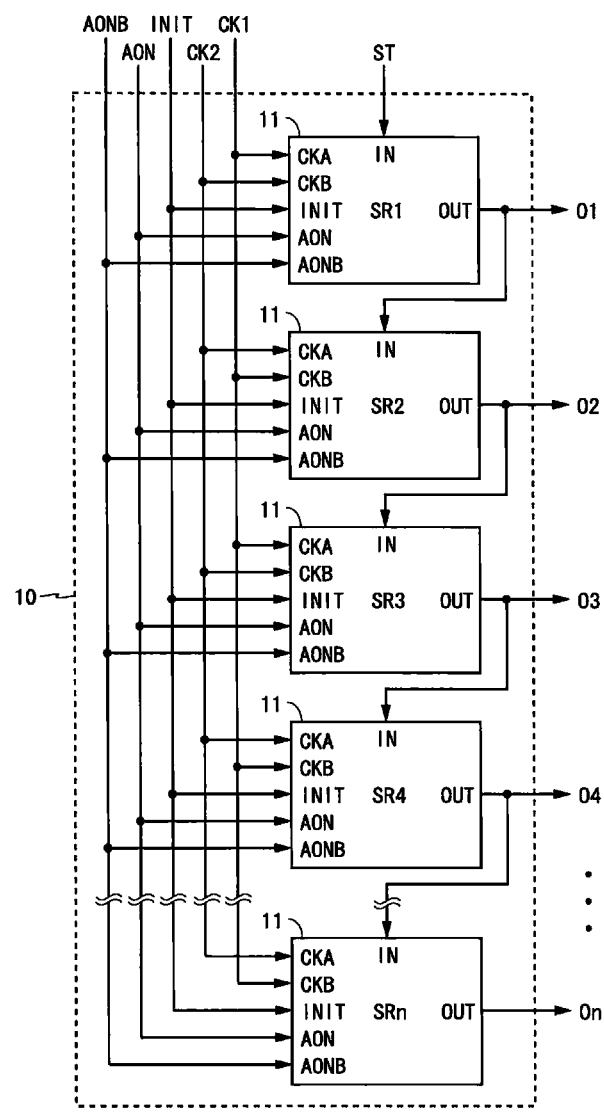
FIG. 1 is a block diagram showing a configuration of a shift register according to a first embodiment of the present invention.

FIG. 1 is a block diagram showing a configuration of a shift register according to a first embodiment of the present invention. A shift register 10 shown in FIG. 1 has a configuration in which n (n is an integer not less than 2) unit circuits 11 are connected in multi-stage. The unit circuit 11 has an input terminal IN, clock terminals CKA, CKB, an initialization terminal INIT, an all-on control terminals AON, AONB, and an output terminal OUT. A start signal ST, two-phase clock signals CK1, CK2, an initialization signal INIT, an all-on control signal AON, and a negative signal AONB of the all-on control signal (hereinafter abbreviated as negative signal AONB) are supplied to the shift register 10 from an outside. Hereinafter, a unit circuit in an i-th stage (i is an integer not less than 1 and not more than n) may be referred to as SRi.

The start signal ST is supplied to the input terminal IN of the unit circuit 11 in a first stage. The clock signal CK1 is supplied to the clock terminal CKA of the unit circuit 11 in an odd-numbered stage and the clock terminal CKB of the unit circuit 11 in an even-numbered stage. The clock signal CK2 is supplied to the clock terminal CKB of the unit circuit 11 in the odd-numbered stage and the clock terminal CKA of the unit circuit 11 in the even-numbered stage. The initialization signal INIT, the all-on control signal AON, and the negative signal AONB are supplied to the initialization terminal INIT and the all-on control terminals AON, AONB of the n unit circuits 11, respectively. An output signal OUT of the unit circuit 11 is output to the outside as output signals O1 to On, and is supplied to the input terminal IN of the unit circuit 11 in a next stage. The high level potential VDD and the low level potential VSS are supplied to the n unit circuits 11 from a power supply circuit (not shown).

To the shift register 10, the high level potential VDD and the low level potential VSS are supplied from the power supply circuit, and clock signals and control signals are supplied from the outside (for example, from a display control circuit provided at the outside). Here, the control signals supplied from the outside mean the start signal ST, the initialization signal INIT, the all-on control signal AON, negative signals of these signals, and the like. The control signals supplied from the outside do not include the clock signals and potentials supplied from the power supply circuit.

Figure 2:
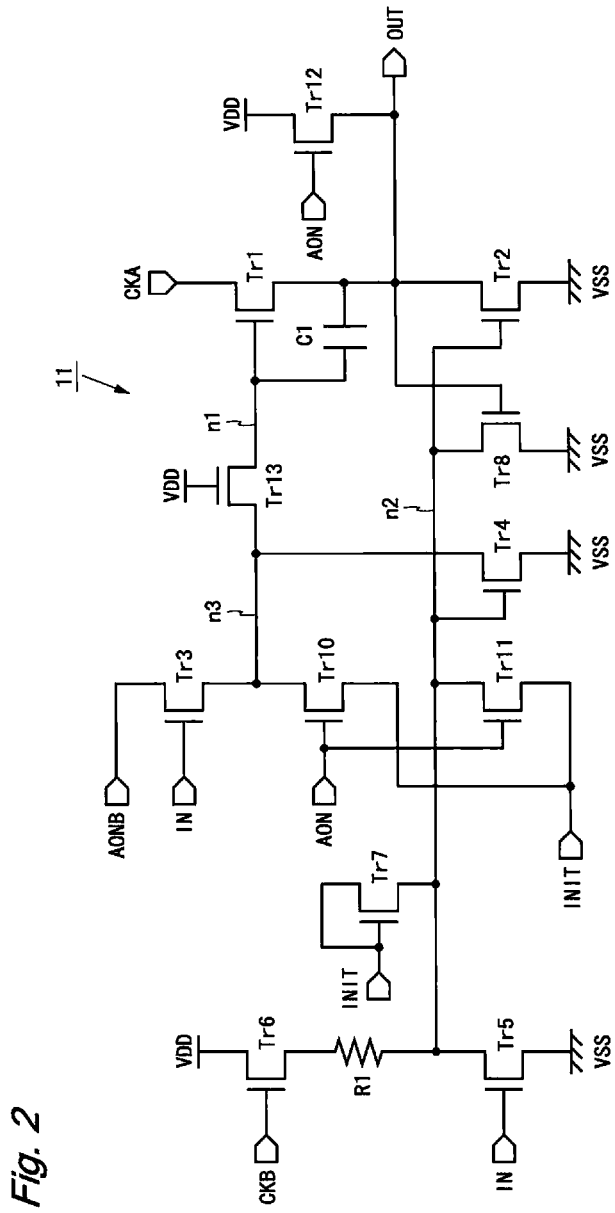
FIG. 2 is a circuit diagram of a unit circuit of the shift register shown in FIG. 1.

FIG. 2 is a circuit diagram of the unit circuit 11. The unit circuit 11 includes twelve N-channel type transistors Tr1 to Tr8, Tr10 to Tr13, a capacitor C1, and a resistor R1. A drain terminal of the transistor Tr1 is connected to the clock terminal CKA. A source terminal of the transistor Tr1 is connected to a drain terminal of the transistor Tr2, a gate terminal of the transistor Tr8, a source terminal of the transistor Tr12, and the output terminal OUT. A gate terminal of the transistor Tr1 is connected to one conduction terminal (right-side terminal in FIG. 2) of the transistor Tr13. The other conduction terminal of the transistor Tr13 is connected to a source terminal of the transistor Tr3 and drain terminals of the transistors Tr4, Tr10. A gate terminal of the transistor Tr2 is connected to a gate terminal of the transistor Tr4, drain terminals of the transistors Tr5, Tr8, Tr11, a source terminal of the transistor Tr7, and one end (lower end in FIG. 2) of the resistor R1. A drain terminal of the transistor Tr3 is connected to the all-on control terminal AONB, and gate terminals of the transistors Tr3, Tr5 are connected to the input terminal IN. A gate terminal of the transistor Tr6 is connected to the clock terminal CKB, and a source terminal of the transistor Tr6 is connected to the other end of the resistor R1. A drain terminal and a gate terminal of the transistor Tr7 are connected to the initialization terminal INIT. Gate terminals of the transistors Tr10 to Tr12 are connected to the all-on control terminal AON, and source terminals of the transistors Tr10, Tr11 are connected to the initialization terminal INIT. The high level potential VDD is fixedly applied to drain terminals of the transistors Tr6, Tr12 and a gate terminal of the transistor Tr13. The low level potential VSS is fixedly applied to source terminals of the transistors Tr2, Tr4, Tr5, Tr8. The capacitor C1 is provided between the gate terminal and the source terminal of the transistor Tr1 and functions as a bootstrap capacitor. Hereinafter, a node to which the gate terminal of the transistor Tr1 is connected is referred to as n1, a node to which the gate terminal of the transistor Tr2 is connected is referred to as n2, and a node to which the source terminal of the transistor Tr3 is connected is referred to as n3.

In the unit circuit 11, the transistors Tr3 to Tr8, Tr10, Tr11, Tr13 and the resistor R1 function as a node control unit for controlling potentials of the nodes n1, n2. The transistor Tr1 has the drain terminal connected to the clock terminal CKA, the source terminal connected to the output terminal OUT, and the gate terminal connected to the node n1, and functions as an output transistor. The transistor Tr2 has the drain terminal connected to the output terminal OUT, the source terminal to which the off potential (low level potential VSS) is applied, and the gate terminal connected to the node n2, and functions as an output reset transistor.

The transistor Tr3 functions as a first transistor for controlling the potential of the node n1 to be an on level, by applying the on potential (high level potential VDD) to the node n3 in accordance with an input signal IN. The transistor Tr4 functions as a second transistor for controlling the potential of the node n1 to be an off level in accordance with the potential of the node n2. The transistor Tr5 functions as a third transistor for controlling the potential of the node n2 to be the off level in accordance with the input signal IN. The transistor Tr6 functions as a fourth transistor for controlling the potential of the node n2 to be the on level in accordance with a clock signal CKB. The transistor Tr7 functions as a fifth transistor for controlling the potential of the node n2 to be the on level in accordance with the initialization signal INIT. The transistor Tr13 has a conduction terminal connected to the node n1, a conduction terminal connected to the source terminal of the transistor Tr3 and the drain terminal of the transistor Tr4, and the gate terminal to which the on potential is fixedly applied.

The transistor Tr8 has the drain terminal connected to the node n2, the source terminal to which the off potential is applied, and the gate terminal connected to the output terminal OUT. The transistor Tr12 controls a potential of the output terminal OUT to be the on level in accordance with the all-on control signal AON. The transistor Tr10 is provided corresponding to the node n1, and controls the potential of the node via a first conduction terminal by supplying the initialization signal INIT to the node n3 in accordance with the all-on control signal AON. The transistor Tr11 is provided corresponding to the node n2, and controls the potential of the node n2 via a first conduction terminal by supplying the initialization signal INIT to the node n2 in accordance with the all-on control signal AON. The transistors Tr10, Tr11 function as first and second control transistors, respectively.

The shift register 10 operates according to control signals supplied from the outside. More specifically, the shift register 10 performs an initialization when the initialization signal INIT is at the high level, performs a normal operation when the initialization signal INIT and the all-on control signal AON are at the low level, and performs an all-on output (an operation of setting all of the output signals O1 to On to the on level (here, high level)) when the all-on control signal AON is at the high level. Note that there are no cases in which both the initialization signal INIT and the all-on control signal AON become the high level.

Figure 3:
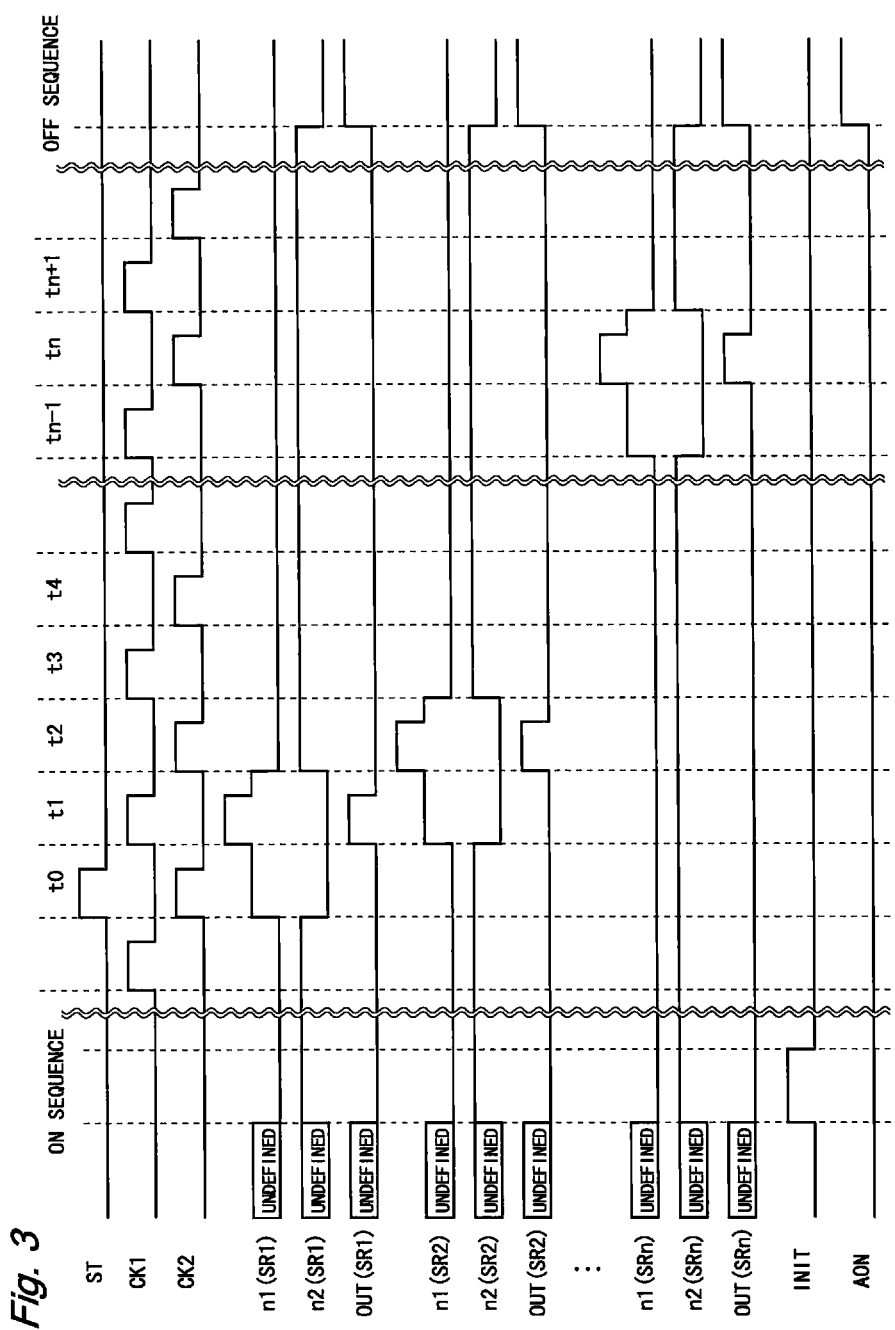
FIG. 3 is a timing chart of the shift register shown in FIG. 1.

FIG. 3 is a timing chart of the shift register 10. When performing the normal operation, since the initialization signal INIT and the all-on control signal AON are at the low level, the transistors Tr7, Tr10 to Tr12 turn off. Thus, these transistors do not affect the normal operation of the shift register 10. The negative signal AONB having the high level is supplied to the drain terminal of the transistor Tr3.

When performing the normal operation, the clock signal CK1 becomes the high level and the low level in a predetermined cycle. A high level period of the clock signal CK1 is shorter than ½ cycle. The clock signal CK2 is a signal obtained by delaying the clock signal CK1 by ½ cycle. The start signal ST becomes the high level in a high level period of the clock signal CK2 in a period t0.

The normal operation of the unit circuit SR1 in the first stage will be described below. In the unit circuit SR1, the start signal ST is the input signal IN, the clock signal CK1 is the clock signal CKA, and the clock signal CK2 is the clock signal CKB.

In the period t0, the input signal IN changes to the high level. Thus, the transistor Tr3 turns on. Since the negative signal AONB is at the high level, when the transistor Tr3 turns on, the potential of the node n3 is increased to (VDD−Vth). Since the high level potential VDD is applied to the gate terminal of the transistor Tr13, the node n1 and the node n3 are electrically connected. Thus, the potential of the node n1 is also increased to (VDD−Vth). When the potential of the node n1 becomes (VDD−Vth), the transistor Tr13 turns off, and the nodes n1, n3 become a floating state. When the potential of the node n1 exceeds the on level of the transistor on the way, the transistor Tr1 turns on. Since the clock signal CKA is at the low level at this time, the output signal OUT remains at the low level.

Furthermore, when the input signal IN changes to the high level, the transistor Tr5 turns on. Since the clock signal CKB is at the high level at this time, the transistor Tr6 also turns on. Since the resistor R1 is provided between the source terminal of the transistor Tr6 and the node n2, when the transistors Tr5, Tr6 turn on, the potential of the node n2 becomes a potential close to the low level potential VSS (off potential of transistor). Thus, the transistors Tr2, Tr4 turn off. In a latter part of the period t0, the input signal IN changes to the low level. Thus, the transistors Tr3, Tr5 turn off. After that, the nodes n1, n3 keep the high level potential in the floating state.

In a period t1, the clock signal CKA changes to the high level. Since the transistor Tr1 is in an on state at this time, the potential of the output terminal OUT is increased and the output signal OUT becomes the high level. Accordingly, the potential of the node n1 in the floating state is pushed up via the capacitor C1 and parasitic capacitance of the transistor Tr1, and the potent of the node n1 is increased to (VDD−Vth+α) (α is push-up voltage) (bootstrap operation). Since the potential of the node n1 becomes higher than (VDD+Vth) the potential of the output terminal OUT becomes equal to the high level potential VDD (high level potential without threshold drop) of the clock signal CKA. At this time, the transistor Tr8 turns on and fixes the potential of the node n2 to the low level potential VSS. In a latter part of the period t1, the clock signal CKA changes to the low level. Thus, the output signal OUT becomes the low level, the potential of the node n1 returns to the same potential (VDD−Vth) as in the period t0, and the transistor Tr8 turns off.

In a period t2, the clock signal CKB changes to the high level. Thus, the transistor Tr6 turns on and the high level potential is applied to the node n2. Since the transistor Tr5 is in an off state at this time, the potential of the node n2 becomes (VDD−Vth). Thus, the transistor Tr4 turns on, the potentials of the nodes n1, n3 become the low level, and the transistor Tr1 turns off. When the potential of the node n2 exceeds the on level of the transistor on the way, the transistor Tr2 turns on, and the output signal OUT is fixed to the low level again.

In a latter part of the period t2, the clock signal CKB changes to the low level. Thus, the transistor Tr6 turns off. After that, in a high level period of the clock signal CKB, the transistor Tr6 turns on and the high level potential is applied to the node n2. In a low level period of the clock signal CKB, the node n2 keeps the high level potential in the floating state. In this manner, the output signal OUT of the unit circuit SR1 becomes the high level (potential is VDD) in the high level period of the clock signal CK1 in the period t1.

The output signal OUT of the unit circuit SR1 is supplied to the input terminal IN of the unit circuit SR2 in a second stage. The unit circuit SR2 operates in periods t1 to t3 in a manner similar to that in which the unit circuit SR1 operates in the periods t0 to t2. The output signal OUT of the unit circuit SR2 is supplied to the input terminal IN of the unit circuit SR3 in a third stage. The unit circuit SR3 operates in periods t2 to t4 in a manner similar to that in which the unit circuit SR1 operates in the periods t0 to t2. The n unit circuits 11 sequentially perform similar operations, with delaying by ½ cycle of the clock signal CK1. Therefore, the output signals O1 to On of the shift register 10 sequentially become the high level for a time having the same length as the high level period of the clock signal CK1, with delaying by ½ cycle of the clock signal CK1.

Note that even when the potential of the node n1 is increased to (VDD−Vth+α) by the bootstrap operation, a potential of the node n3 remains at (VDD−Vth) by an action of the transistor Tr13. Thus, a voltage higher than a drive voltage (VDD−VSS) is not applied between terminals of the transistors Tr3, Tr4, Tr10 connected to the node n3. Since the high level potential is applied to three terminals of the transistor Tr1 connected to the node n1, a voltage higher than the drive voltage (VDD−VSS) is not applied between the terminals of the transistor Tr1. In this manner, it is possible to prevent a high voltage from being applied between the terminals of the transistor connected to the node n3 and make the shift register 10 more reliable, by providing the transistor Tr13. Note that even if the transistor Tr13 is deleted and the node n1 and the node n3 are short-circuited, the shift register 10 operates in a manner similar as described above.

Next, the initialization of the shift register 10 will be described. The initialization of the shift register 10 is performed when a state of the shift register 10 is undefined, or when all of the output signals O1 to On of the shift register 10 are temporarily set to the off level (here, low level). When performing the initialization, the initialization signal INIT becomes the high level.

In the unit circuit 11, when the initialization signal INIT changes to the high level, the transistor Tr7 turns on and the potential of the node n2 becomes (VDD−Vth). Thus, the transistor Tr4 turns on, the potentials of the nodes n1, n3 become the low level, and the transistor Tr1 turns off. Furthermore, the transistor Tr2 turns on and the output signal OUT becomes the low level. In this manner, it is possible to determine the potentials of the nodes n1 to n3 and set the output signals O1 to On of the shift register 10 to the low level by performing the initialization.

FIG. 3 depicts a timing when performing the initialization in an on sequence when a power is turned. When the initialization signal INIT changes to the high level in performing the on sequence, the potentials of the nodes n1 to n3 are determined and the output signal OUT becomes the low level. The initialization signal INIT always becomes the low level except when performing the initialization.

Next, the all-on output of the shift register 10 will be described. In the unit circuit 11, when the all-on control signal AON changes to the high level, the transistors Tr10, Tr11 turn on. Since the initialization signal INIT having the low level is supplied to the source terminal of the transistor Tr10 at this time, the potentials of the nodes n1, n3 become the low level and the transistor Tr1 turns off. Since the initialization signal INIT having the low level is also supplied to the source terminal of the transistor Tr11, the potential of the node n2 becomes the low level and the transistors Tr2, Tr4 turn off. Furthermore, when the all-on control signal AON changes to the high level, the transistor Tr12 turns on and the output signal OUT becomes the high level. Thus, the transistor Tr8 turns on, and the potential of the node n2 is fixed to the low level.

The input signal IN of the unit circuit SR1 in the first stage is the start signal ST, and the input signal IN of the unit circuits SR2 to SRn in the second and subsequent stages is the output signal OUT of the unit circuit in a previous stage. Thus, when performing the all-on output, in the unit circuits SR2 to SRn in the second and subsequent stages, the input signal IN becomes the high level and the transistor Tr3 turns on. In the unit circuit SR1 in the first stage, a state of the transistor Tr3 depends on a level of the start signal ST. In a case where the transistor Tr3 turns on together with the transistor Tr10 when performing the all-on output, the initialization terminal INIT and the all-on control terminal AONB are electrically connected. Even in this case, since the initialization signal INIT and the negative signal AONB are at the low level, the potentials of the nodes n1, n3 become the low level stably.

FIG. 3 depicts a timing when performing the all-on output in an off sequence when a power is turned off. When the all-on control signal AON changes to the high level in performing the off sequence, the potentials of the nodes n1 to n3 are fixed to the low level and the output signal OUT becomes the high level (potential is (VDD−Vth)). The all-on control signal AON always becomes the low level except when performing the all-on output.

The power supply circuit turns off after the off sequence is performed. Thus, the potential supplied from the power supply circuit naturally changes from the high level potential. VDD or the low level potential VSS to the ground potential GND. The potentials of the nodes n1 to n3 in the unit circuit 11 and the potential of the output signal OUT change in accordance with changes of the potential supplied from the power supply circuit, and eventually become the ground potential GND. In a display device including the shift register 10 as a scanning line drive circuit, since the shift register 10 performs the all-on output, it is possible to select all of scanning lines collectively, turn on write control transistors included in all of pixel circuits in a display area, and discharge charge accumulated in the pixel circuits to data lines.

In FIG. 3, the shift register 10 performs the initialization when performing the on sequence. In place of this, when performing the off sequence, the shift register 10 may perform the all-on output at first and then perform the initialization. Alternatively, the shift register 10 may perform the all-on output when performing the on sequence. With this, in the display device including the shift register 10 as the scanning line drive circuit, it is possible to perform the initialization after reliably discharging the charge accumulated in the pixel circuit.

In the unit circuit 11, it is necessary to control trite potentials of the nodes n1 to n3 to be the low level when performing the all-on output. In the unit circuit 11, the drain terminal of the transistor Tr3 is connected to the all-on control terminal AONB, and the source terminals of the transistors Tr10, Tr11 are connected to the initialization terminal INIT. When performing all-on output, the transistors Tr3, Tr10, Tr11 turn on. At this time, the negative signal AONB having the low level is supplied to the drain terminal of the transistor Tr3, and the initialization signal INIT having the low level is supplied to the source terminals of the transistors Tr10, Tr11. Therefore, the potentials of the nodes n1 to n3 become the low level when performing the all-on output.

Figure 4:
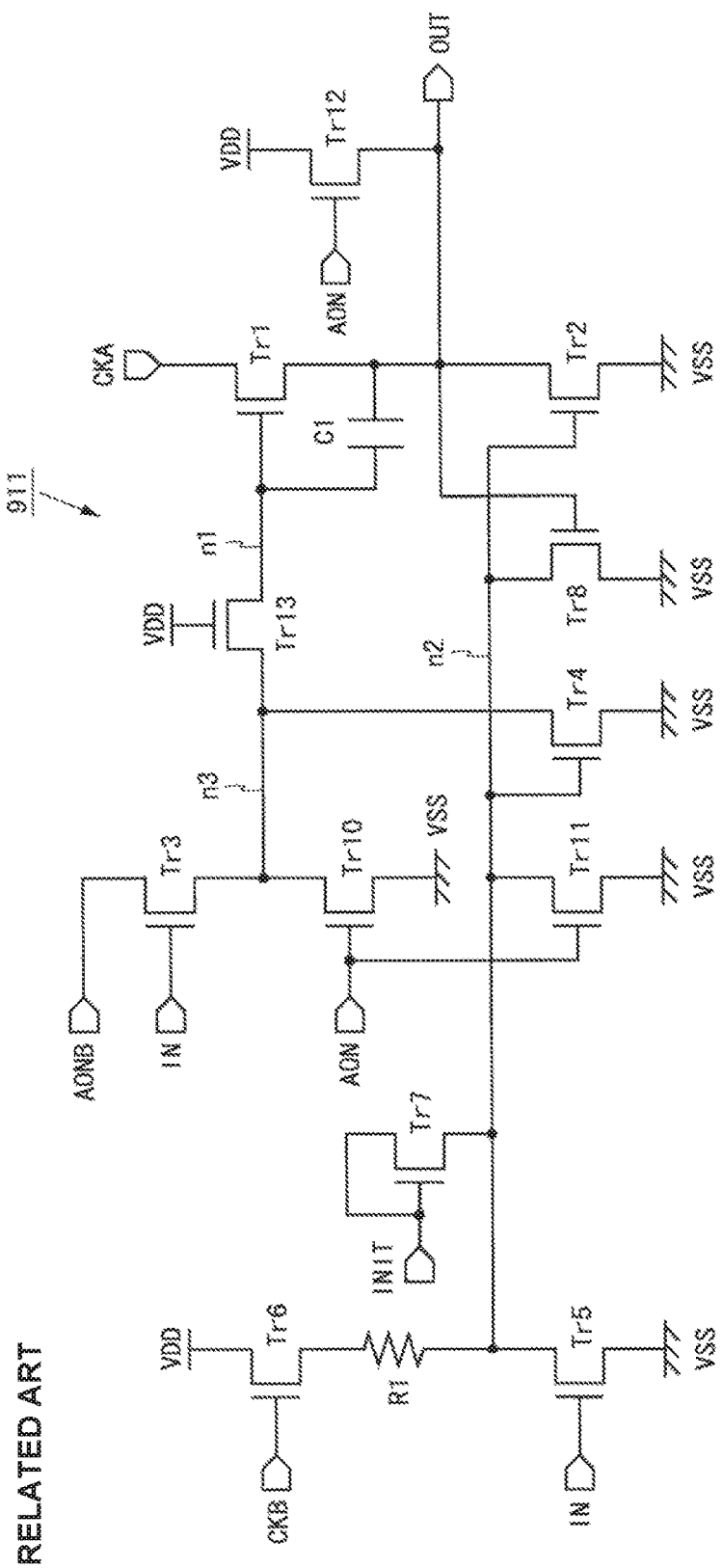
FIG. 4 is a circuit diagram of a unit circuit of a shift register according to a comparative example.
Figure 5:
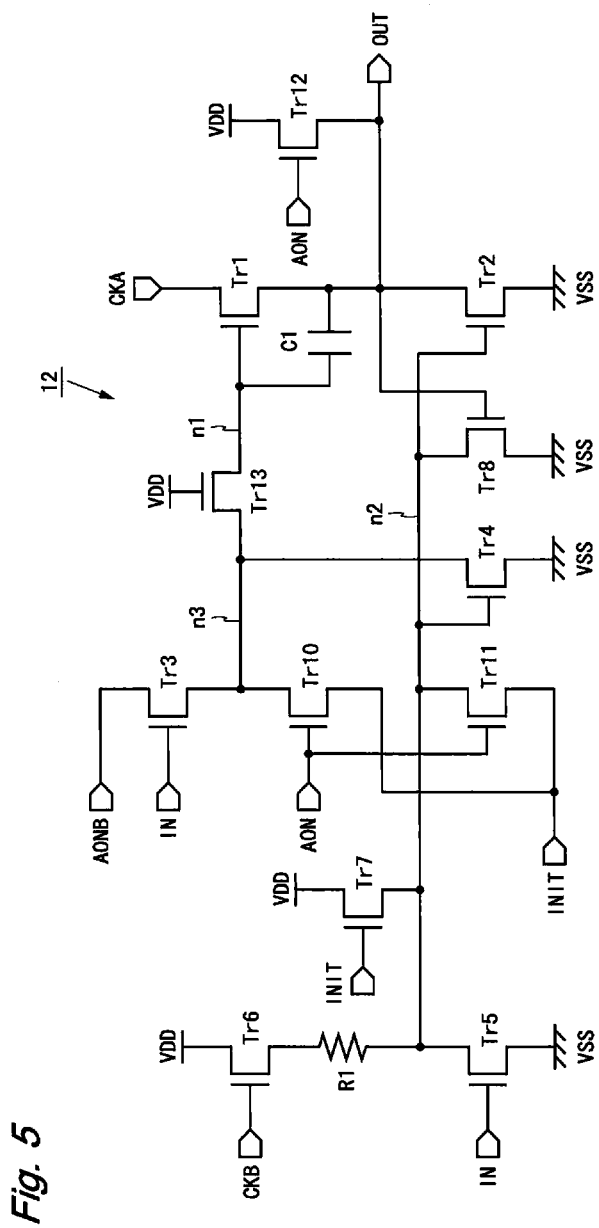
FIG. 5 is a circuit diagram of a unit circuit of a shift register according to a first variant of the first embodiment.
Figure 6:
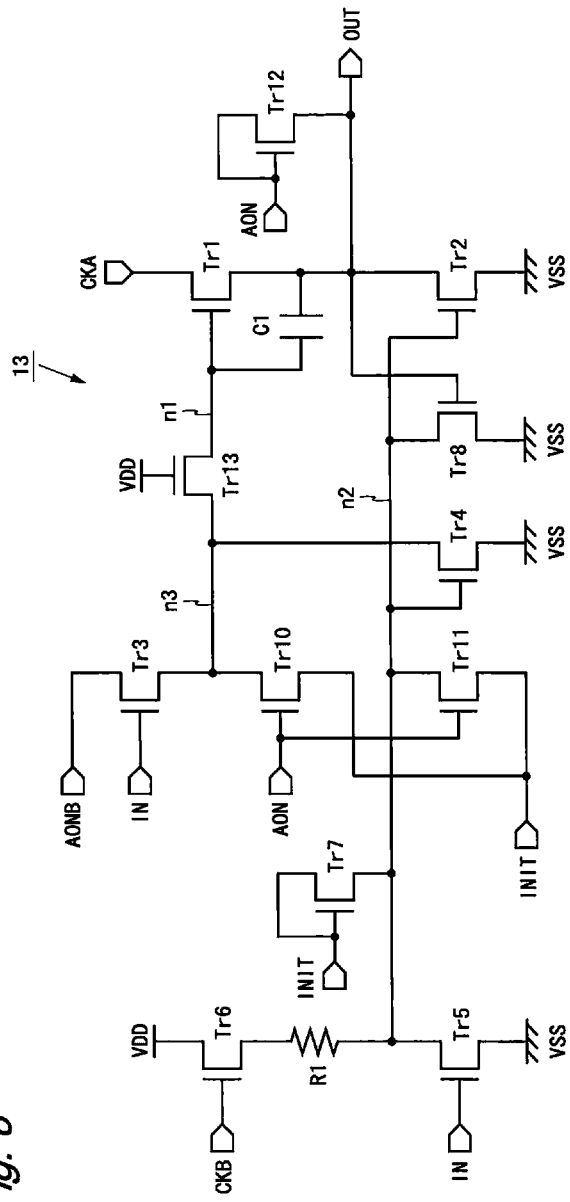
FIG. 6 is a circuit diagram of a unit circuit of a shift register according to a second variant of the first embodiment.
Figure 7:
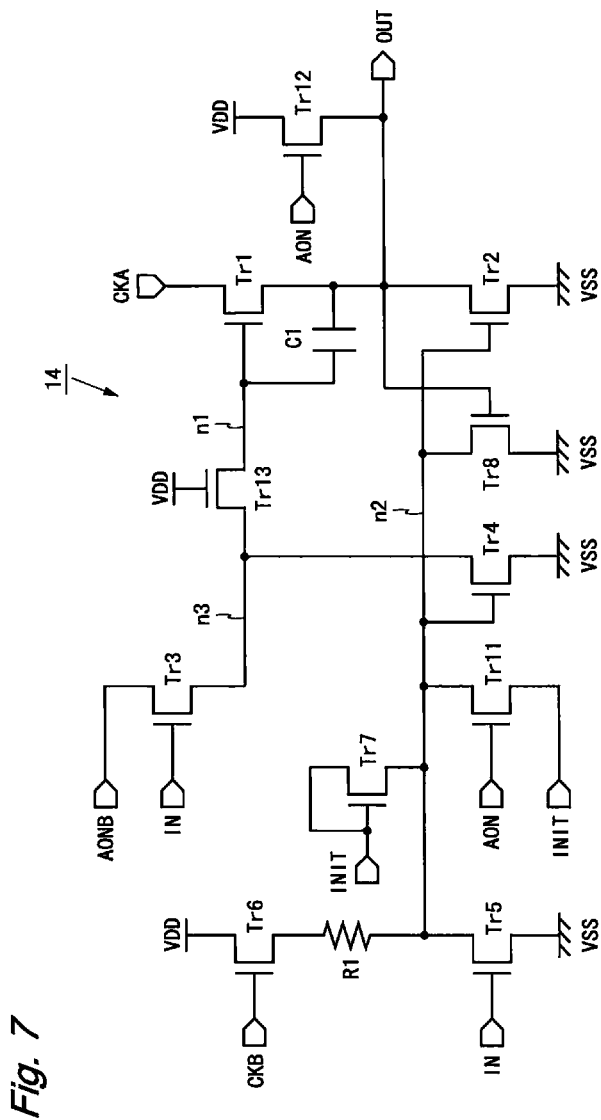
FIG. 7 is a circuit diagram of a unit circuit of a shift register according to a third variant of the first embodiment.
Figure 8:
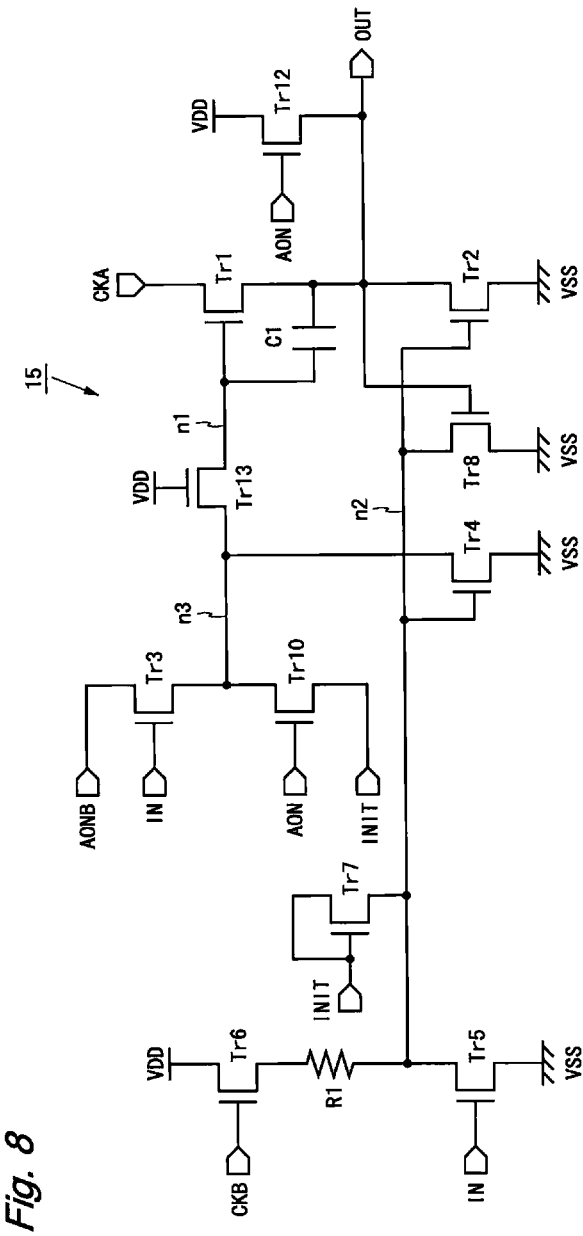
FIG. 8 is a circuit diagram of a unit circuit of a shift register according to a fourth variant of the first embodiment.

A unit circuit 911 shown in FIG. 4 can be considered as a unit circuit for controlling the potentials of the nodes n1 to n3 to be the low level when performing the all-on output. In the unit circuit 911, the low level potential VSS is fixedly applied to the source terminals of the transistors Tr10, Tn11. In the following, effects of the shift register 10 in which the unit circuits 11 are connected in multi-stage will be described, by comparing with a shift register in which the unit circuits 911 are connected in multi-stage (hereinafter referred to as shift register according to comparative example).

In a display device including a shift register as a scanning line drive circuit, noise is likely to be imposed on the low level potential VSS supplied from the power supply circuit. In the unit circuits 11, 911, there are a period in which the nodes n1, n3 keep the high level potential in the floating state, a period in which the node n2 keeps the high level potential in the floating state, and a period in which the node n2 keeps the low level potential in the floating state (hereinafter referred to as first to third retention periods in this order). For example, in the timing chart shown in FIG. 3, the period t1 is a first retention period of the unit circuit SR1, periods t3, t5, . . . are second retention periods of the unit circuit SR1, and a low level period of the start signal ST in the period t0 is a third retention period of the unit circuit SR1.

In the unit circuit 911, when noise is imposed on the low level potential VS in the first retention period and the low level potential VSS is temporarily decreased greatly, a gate-source voltage of the transistor Tr10 may exceed the threshold voltage Vth and the transistor Tr10 may turn on. If the transistor Tr10 turns on, charge accumulated at the nodes n1, n3 is discharged (charge escape from the nodes n1, n3), and the potentials of the nodes n1, n3 are decreased. If the potentials of the nodes n1, n3 become lower than the on potential of the transistor, the shift register according to the comparative example malfunctions. Furthermore, in the unit circuit 911, when noise is imposed on the low level potential VSS in the second retention period and the low level potential VSS is temporarily decreased greatly, a gate-source voltage of the transistor Tr11 may exceed the threshold voltage Vth and the transistor Tr11 may turn on. If the transistor Tr11 turns on, charge accumulated at the node n2 is discharged (charge escape from the node n2) and the potential of the node n2 is decreased. If the potential of the node n2 becomes lower than the on potential of the transistor, the shift register according to the comparative example malfunctions.

In contrast, in the unit circuit 11, the initialization signal INIT is supplied to the source terminals of the transistors Tr10, Tr11. The initialization signal INIT is supplied not from the power supply circuit but from the display control circuit (circuit other than power supply circuit) provided at the outside. Unlike the signal supplied from the power supply circuit, almost no noise is imposed on the initialization signal INIT supplied from a circuit other than the power supply circuit. Thus, even if noise is imposed on the low level potential VSS supplied from the power supply circuit in the first retention period, the transistor Tr10 keeps the off state stably. Even if noise is imposed on the low level potential VSS supplied from the power supply circuit in the second retention period, the transistor Tr11 keeps the off state stably. Therefore, according to the shift register 10, it is possible to prevent the charge escape from the nodes n1, n3 in the first retention period and the charge escape from the node n2 in the second retention period, and prevent malfunction.

Furthermore, the initialization signal INIT is always at the low level when performing the normal operation. Thus, even if an off-leakage current flows through the transistor Tr11 in the third retention period, the potential of the node n2 is kept at the low level. Therefore, according to the shift register 10, it is possible to prevent the potential of the node n2 from increasing in the third retention period and prevent malfunction.

As described above, the unit circuit 11 of the shift register 10 according to the present embodiment includes do output transistor (transistor Tr1) having a first conduction terminal connected to a clock terminal for inputting a clock signal, a second conduction terminal connected to an output terminal for outputting the clock signal, and a control terminal connected to a first node (node n1), an output reset transistor (transistor Tr2) having a first conduction terminal connected to the output terminal, a second conduction terminal to which the off potential is applied, and a control terminal connected to a second node (node n2), and a node control unit (transistors Tr3 to Tr6, Tr10, Tr11, Tr13 and resistor R1) for controlling potentials of the first and second nodes. The node control unit includes a first control transistor (transistor Tr10) provided corresponding to the first node and for controlling the potential of the first node via a first conduction terminal, and a second control transistor (transistor Tr11) provided corresponding to the second node and for controlling the potential of the second node via a first conduction terminal. The first and second control transistors have a control terminal to which a first control signal (all-on control signal AON) that is included in a control signal and becomes the off level at least when performing; the normal operation is supplied from the outside, and a second conduction terminal to which a second control signal (initialization signal INIT) that is included in the control signal and becomes the off level when the first control signal is at the on level is supplied from the outside.

In this manner, by providing the first and second control transistors, the potentials of the first and second nodes can be controlled to be the off level when the first control signal is at the on level. Furthermore, it is posslble to prevent the charge escape from the first and second nodes due to the noise imposed on the potential supplied from the power supply circuit and prevent malfunction of the shift register, by supplying the control signals supplied from the outside to the control terminal and the second conduction terminal of the first and second control transistors.

Furthermore, the first control signal is the all-on control signal which becomes the on level when performing the all-on output, and the second control signal is the initialization signal which becomes the on level when performing the initialization. Therefore, the potentials of the first and second nodes can be controlled to be the off level when performing the all-on output.

Furthermore, the node control unit includes a first transistor (transistor Tr3) for controlling the potential of the first node to be the on level in accordance with the input signal of the unit circuit, a second transistor (transistor Tr4) for controlling the potential of the first node to be the off level in accordance with the potential of the second node, a third transistor (transistor Tr5) for controlling the potential of the second node to be the off level in accordance with an input signal, and a fourth transistor (transistor Tr6) for controlling the potential of the second node to be the on level in accordance with a second clock signal of the unit circuit. Therefore, based on the input signal and the second clock signal, a state of the unit circuit can be switched between a state in which the potential of the first node is at the on level and the potential of the second node is at the off level, and an opposite state.

Furthermore, the node control unit includes a fifth transistor (transistor Tr7) for controlling the potential of the second node to be the on level in accordance with the initialization signal, the transistor Tr8 having a first conduction terminal connected to the second node, a second conduction terminal to which the off potential is applied, and a control 11 connected to the output terminal. The unit circuit 11 includes the transistor Tr12 for controlling the potential of the output terminal to be the on level in accordance with the all-on control signal. Therefore, the potential of the second node can be controlled to be the on level when performing the initialization, the potential of the second node can be stabilized when the potential of the output terminal is at the on level, and the potential of the output terminal can be controlled to be the on level when performing the all-on output.

Furthermore, the first transistor supplies the negative signal of the all-on control signal to the first node in accordance with the input signal. Since the negative signal of the all-on control signal becomes the on level when performing the normal operation, the potential of the first node can be controlled to be the on level using the negative signal. Furthermore, the node control unit includes the transistor Tr13 having a conduction terminal connected to the first node, a conduction terminal connected to one conduction terminals of the first and second transistors, and a control terminal to which the on potential is fixedly applied. Therefore, it is possible to control the potential of the first node using the first and second transistors and prevent a high voltage from being applied to terminals of transistors connected to the first node.

As for the shift register 10 according to the present embodiment, following variants can be configured. The shift registers according to the variants have configurations in which unit circuits shown in FIGS. 5 to 8 are connected in multi-stage. In a unit circuit 12 (FIG. 5) according to a first variant, the high level potential VDD is applied to the drain terminal of the transistor Tr7. In a unit circuit 13 (FIG. 6) according to a second variant, the drain terminal of the transistor Tr12 is connected to the all-on control terminal AON together with the gate terminal of the transistor Tr12. The unit circuits 12, 13 operate in a manner similar to the unit circuit 11.

A unit circuit 14 (FIG. 7) according to a third variant is obtained by deleting the transistor Tr10 from the unit circuit 11. In the unit circuit 14, when the all-on control signal AON changes to the high level, the transistors Tr11, Tr12 turn on, the potential of the node 2 becomes the low level, and the transistor Tr2 turns off. At this time, since the potentials of the nodes n1, n3 are undefined, a state of the transistor Tr1 is unknown. It the transistor Tr1 is in the off state, the output signal OUT becomes the high level by an action of the transistor Tr12. If the transistor Tr1 is in the on state and the clock signal CKA is at the high level, the output signal OUT also becomes the high level. If the transistor Tr1 is in the on state and the clock signal CKA is at the low level, the high level potential is supplied from the transistor Tr12 to the output terminal OUT, and the low level potential is supplied from the transistor Tr1 to the output terminal OUT. Thus, the potential of the output signal OUT becomes an intermediate potential (potential between the high level potential and the low level potential) at first.

The input Signal IN of the unit circuit 14 is the output signal OUT of the unit circuit 14 in the previous stage. When the potential of the input signal IN becomes the intermediate potential, the transistor Tr3 approaches the on state slightly. Since the negative signal AONB having the low level is supplied to the drain terminal of the transistor Tr3, the potentials of the nodes n1, n3 approach the low level slightly, the transistor Tr1 approaches the off state slightly, and the potential of the output signal OUT approaches the high level slightly by the action of the transistor Tr12. By repeating the above operations, the transistor Tr1 turns off and the output signal OUT becomes the high level eventually. In this manner, even in the unit circuit 14 not including the transistor Tr10, the output signal OUT becomes the high level eventually by setting the all-on control signal AON to the high level, although it takes some time.

A unit circuit 15 (FIG. 8) according to a fourth variant is obtained by deleting the transistor Tr11 from the unit circuit 11. In the unit circuit 15, when the all-on control signal AON changes to the high level, the transistors Tr10, Tr12 turn on, the potentials of the nodes n1, n3 become the low level, and the transistor Tr1 turns off. At this time, since the potential of the node n2 is undefined, a state of the transistor Tr2 is unknown. If the transistor Tr2 is in the off state, the output signal OUT becomes the high level by the action of the transistor Tr12. If the transistor Tr2 is in the on state, the high level potential is supplied from the transistor Tr12 to the output terminal OUT, and the low level potential is supplied from the transistor Tr2 to the output terminal OUT. Thus, the output signal OUT becomes the intermediate potential at first.

The input signal IN of the unit circuit 15 is the output signal OUT of the unit circuit 15 in the previous stage. When the potential of the input signal IN becomes the intermediate potential, the transistor Tr5 approaches the on state slightly. Thus, the potential of the node n2 approaches the low level slightly, the transistor Tr2 approaches the off state slightly, and the potential of the output signal OUT approaches the high level slightly. By repeating the above operations, the transistor Tr2 turns off and the output signal OUT becomes the high level eventually. In this manner, even in the unit circuit 15 not including the transistor Tr11, the output signal OUT becomes the high level eventually by setting the all-on control signal AON to the high level, although it takes some time.

In the unit circuit SR1 in the first stage, the start signal ST is the input signal IN. In a case where the start signal ST is at the low level, when the all-on control signal AON changes to the high level in the unit circuit SR1, the transistors Tr3, Tr5 keep the off state even after the output signal OUT changes to the high level. Thus, in a case where the unit circuit SR1 is the unit circuit 14, even if the all-on control signal AON changes to the high level, the potentials of the nodes n1, n3 may not become the low level and the transistor Tr1 may not turn off. Furthermore, in a case where the unit circuit SR1 is the unit circuit 15, when the all-on control sig AON changes to the high level, the output signal OUT becomes the high level, the transistor Tr8 turns on, and the potential of the node n2 becomes the low level. However, since the transistor Tr1 does not always turn off, it is unknown whether the potential of the output signal OUT of the unit circuit SR1 is increased to the on potential of the transistor.

In order to solve these problems, in the shift register in which the unit circuits 14 or the unit circuits 15 are connected in multi-stage, the start signal ST may be fixed to the high level when the all-on control signal AON changes to the high level. Alternatively, a circuit including both of the transistors Tr10, Tr11 may be used for the unit circuit SR1 in the first stage, and a circuit including one of the transistors Tr10, Tr11 may be used for the unit circuits SR2 to SRn in the second and subsequent stages. In this manner, circuit amount of the shift register can be reduced by deleting one of the transistors Tr10, Tr11 in the unit circuits SR2 to SRn in the second and subsequent stages. As shown in the third and fourth variants, the node control unit of the unit circuit may include a control transistor corresponding to one of the first and second nodes. In this manner, the node control unit of the unit circuit may include a control transistor corresponding to at least one of the first and second nodes.

A unit circuit (not shown) according to a fifth variant is obtained by deleting the transistor Tr13 from the unit circuit 11. In this case, one conduction terminals of the first and second transistors (source terminal of transistor Tr3 and drain terminal of transistor Tr4) are connected to the first node. Therefore, the potential of the first node can be controlled directly using the first and second transistors. Note that as for the shift register according to each embodiment described below, the first to fifth variants described above can also be configured.

Second Embodiment

Figure 9:
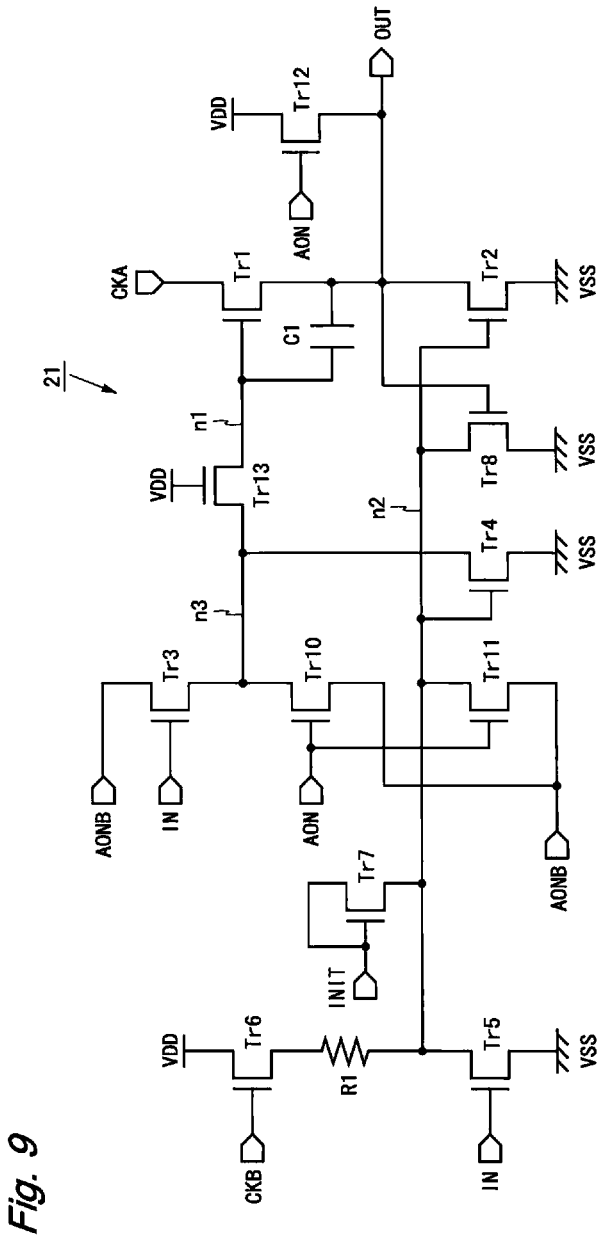
FIG. 9 is a circuit diagram of a unit circuit of a shift register according to a second embodiment of the present invention.

A shift register according to a second embodiment of the present invention has the configuration shown in FIG. 1. However, the shift register according to the present embodiment includes a unit circuit 21 shown in FIG. 9 in place of the unit circuit 11. The unit circuit 21 is obtained based on the unit circuit 11 by changing connection points of the source terminals of the transistors Tr10, Tr11 to the all-on control terminal AONB.

In the unit circuit 11, when the all-on control signal AON is at the high level, the initialization signal INIT having the low level is supplied to the source terminals of the transistors Tr10, Tr11. In the unit circuit 21, when the all-on control signal AON is at the high level, the negative signal AONB having the low level is supplied to the source terminals of the transistors Tr10, Tr11. Therefore, when the all-on control signal AON is at the high level, the unit circuit 21 performs the same all-on output as the unit circuit 11. The unit circuit 21 performs same operations as the unit circuit 11 when performing the initialization or the normal operation.

In the unit circuit 21, when performing the normal operation, the negative signal AONB having the high level is supplied to the source terminals of the transistors Tr10, Tr11. Thus, even if noise is imposed on the low level potential VSS supplied from the power supply circuit in the first retention period, the transistor Tr10 turns off reliably, because a reverse bias is applied between the gate and the source of the transistor Tr10. Even if noise is imposed on the low level potential VSS supplied from the power supply circuit in the second retention period, the transistor Tr11 turns off reliably, because a reverse bias is applied between the gate and the source of the transistor Tr11. Therefore, according to the shift register according to the present embodiment, it is possible to prevent the charge escape from the nodes n1, n3 in the first retention period and the charge escape from, the node n2 in the second retention period, and prevent malfunction.

Since the negative signal AONB is at the high level when performing the normal operation, the potential of the node n2 is increased by the off-leakage current flowing through the transistor Tr11 in the third retention period. However, the off-leakage current flowing through the transistor Tr11 is much smaller than a leakage current flowing through the transistor Tr11 due to the noise imposed on the low level potential VSS supplied from the power supply circuit. Thus, in a case where capacitance accompanying the node n2 is large so that the leakage current of the transistor Tr11 is acceptable or a case where the third retention period is short, the potential of the node n2 is hardly increased due to the leakage current flowing through the transistor Tr11. Thus, the shift register according to the present embodiment does not malfunction due to an increase of the potential of the node n2 in the third retention period.

As described above, in the unit circuit 21 of the shift register according to the resent embodiment, a first control signal supplied to the control terminals of the control transistors Tr10, Tr11 is the all-on control signal AON which becomes the on level when performing the all-on output. A second control signal supplied to the second conduction terminal of the control transistor is the negative signal AONB of the all-on control signal. According to the shift register according to the present embodiment, the potentials of the first and second nodes (nodes n1, n2) can be controlled to be the off level when performing the all-on output. Furthermore, as with the first embodiment, it is possible to prevent the charge escape from the first and second nodes due to the noise imposed on the potential supplied from the power supply circuit, and prevent malfunction of the shift register.

Third Embodiment

Figure 10:
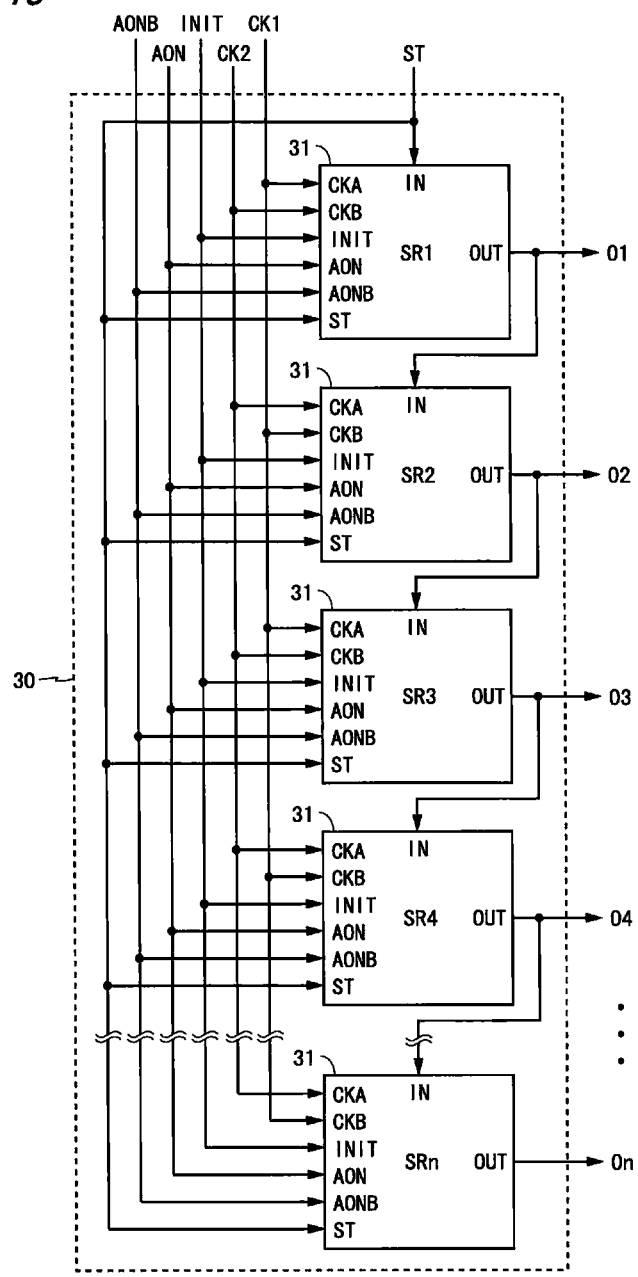
FIG. 10 is a block diagram showing a configuration of a shift register according to a third embodiment of the present invention.

FIG. 10 is a block diagram showing a configuration of a shift register according to a third embodiment of the present invention. A shift register 30 shown in FIG. 10 has a configuration in which n unit circuits 31 are connected in multi-stage. The unit circuit 31 has the input terminal IN, the clock terminals CKA, CKB, the initialization terminal INIT, the all-on control terminals AON, AONB, a start terminal ST, and the output terminal OUT. The start signal ST, the two-phase clock signals CK1, CK2, the initialization signal INIT, the all-on control signal AON, and the negative signal AONB are supplied to the shift register 30 from the outside.

The clock signals CK1, CK2, the initialization signal INIT, the all-on control signal AON, and the negative signal AONB are supplied to the n unit circuits 31 in a same manner as in the shift register 10 according to the first embodiment. The start signal ST is supplied to the input terminal IN of the unit circuit 31 in the first stage and the start terminals ST of the n unit circuits 31.

Figure 11:
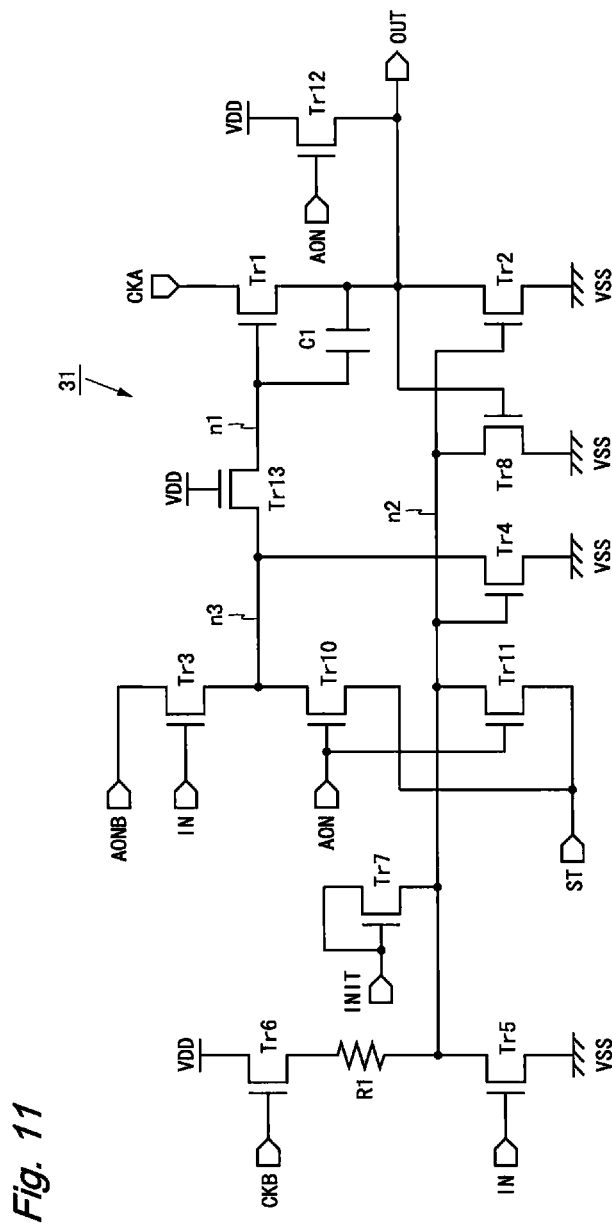
FIG. 11 is a circuit diagram of a unit circuit of the shift register shown in FIG. 10.

FIG. 11 is a circuit diagram of the unit circuit 31. The unit circuit 31 is obtained based on the unit circuit 11 by changing connection points of the source terminals of the transistors Tr10, Tr11 to the start terminal ST. In the unit circuit 31, when the all-on control signal AON is at the high level, the start signal ST supplied to the source terminals of the transistors Tr10, Tr11 is controlled to be the low level. Therefore, when the all-on control signal AON as at the high level, the unit circuit 31 performs the same all-on output as the unit circuit 11. The unit circuit 31 performs the same operations as the unit circuit 11 when performing the initialization or the normal operation.

As shown in FIG. 3, the potentials of the nodes n1, n3 and the output signal OUT are at the low level and the potential of the node n2 is at the high level, until the start signal ST becomes the high level. When the start signal ST changes to the high level when performing the normal operation, since the all-on control signal AON is at the low level, the transistors Tr10, Tr11 remain at the off state. Thus, the unit circuit 31 performs the normal operation without being affected by the start signal ST supplied to the source terminals of the transistors T10, Tr11.

In the unit circuit 31, when performing the normal operation, the start signal ST which changes to the high level and the low level is supplied to the source terminals of the transistors Tr10, Tr11. Since the start signal ST is supplied from a circuit other than the power supply circuit, no noise is imposed on the start signal ST. Thus, even if noise is imposed on the low level potential VSS supplied from the power supply circuit in the first retention period, the transistor Tr10 keeps the off state stably. Even if noise is imposed on the low level potential. VSS supplied from the power supply circuit in the second retention period, the transistor Tr11 keeps the off state stably. Therefore, according to the shift register 30, it is possible to prevent the charge escape from the nodes n1, n3 in the first retention period and the charge escape from the node n2 in the second retention period, and prevent malfunction.

Furthermore, the initialization signal INIT is always at the low level when performing the normal operation. Thus, even if the off-leakage current flows through the transistor Tr11 in the third retention period, the potential of the node n2 is kept at the low level. Therefore, according to the shift register 30, it is possible to prevent malfunction due to the increase of the potential of the node n2 in the third retention period.

Note that in the unit circuit SR1 in the first stage, when the start signal ST (input signal IN) changes to the high level, the transistor Tr5 turns on. Thus, even if the off-leakage current flows through the transistor Tr11, the potential of the node n2 is kept at the low level. Furthermore, when the start signal ST changes to the high level in the unit circuit SR1, the transistor Tr3 turns on and the potentials of the nodes n1, n3 become the high level. Thus, there is no problem even if an off-leakage current flows through trite transistor Tr10 and the high level potential applied to the source terminal of the transistor Tr10 is supplied to the nodes n1, n3. Furthermore, in the unit circuits SR2 to SRn in the second and subsequent stages, when the start signal ST is at the high level, the potential of the node n2 is at the high level. Thus, there is no problem even if the leakage current flows through the transistor Tr11 and the high level potential of the start signal ST is supplied to the node n2. Furthermore, since the transistor Tr4 turns on at this time, even if a leakage current flows through the transistor Tr10, the potentials of the nodes n1, n3 are kept at the low level.

As described above, in the unit circuit 31 of the shift register according to the present embodiment, a first control signal supplied to the control terminals of the control transistors Tr10, Tr11 is the all-on control signal AON which becomes the on level when performing the all-on output, and a second control signal supplied to the second conduction terminals of the control transistors is the start signal ST which becomes the on level when starting shift. According to the shift register according to the present embodiment, the potentials of the first and second nodes (nodes n1, n2) can be controlled to be the off level when performing the all-on output. Furthermore, as with the first embodiment, it is possible to prevent the charge escape from the first and second nodes due to the noise imposed on the potential supplied from the power supply circuit, and prevent malfunction of the shift register.

Fourth Embodiment

Figure 12:
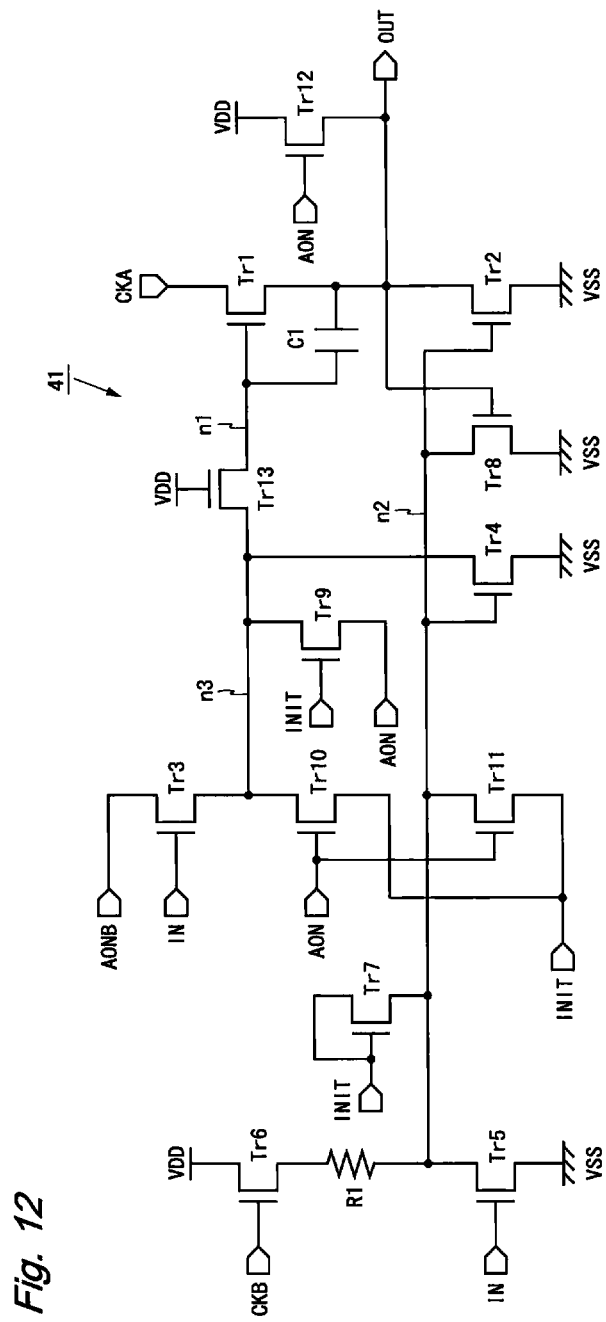
FIG. 12 is a circuit diagram of a unit circuit of a shift register according to a fourth embodiment of the present invention.

A shift register according to a fourth embodiment of the present invention has the configuration shown in FIG. 1. However, the shift register according to the present embodiment includes a unit circuit 41 shown in FIG. 12 in place of the unit circuit 11. The unit circuit 41 is obtained by adding a transistor Tr9 to the unit circuit 11. A drain terminal of the transistor Tr9 is connected to the node n3, a source terminal of the transistor Tr9 is connected to the all-on control terminal AON, and a gate terminal of the transistor Tr9 is connected to the initialization terminal INIT.

The transistor Tr9 is provided corresponding to the node n1, and controls the potential of the node n1 via a first conduction terminal by supplying the all-on control signal to the node n3 in accordance with the initialization signal INIT. As with the transistors Tr10, Tr11 the transistor Tr9 functions as a control transistor.

In the unit circuit 11, when the initialization signal INIT changes to the high level, the transistor Tr7 turns on and the potential of the node n2 becomes the high level. Thus, the transistor Tr4 turns on and the potentials of the nodes n1, n3 become the low level. In the unit circuit 41, when the initialization signal INIT changes to the high level, the potentials of the nodes n1, n3 become the low level for a similar reason. In addition, in the unit circuit 41, when the initialization signal INIT changes to the high level, the transistor Tr9 turns on. Since the all-on control signal AON having the low level is supplied to the source terminal of the transistor Tr9 at this time, the potentials of the nodes n1, n3 become the low level. Therefore, according to the shift register according to the present embodiment, the initialization can be performed immediately.

In the unit circuit 41, the all-on control signal AON is supplied to the source terminal of the transistor Tr9. Since the all-on control signal AON is supplied from a circuit other than the power supply circuit, no noise is imposed on the all-on control signal AON. Thus, even if noise is imposed on the low level potential VSS supplied from the power supply circuit in the first retention period, the transistor Tr9 keeps the off state. Therefore, according to the shift register according to the present embodiment, it is possible to prevent the charge escape from the nodes n1, n3 in the first retention period and prevent malfunction. Note that similar effects can be attained even if the start signal ST or the negative signal of the initialization signal INIT is supplied to the source terminal of the transistor Tr9.

As described above, the unit circuit 41 of the shift register according to the present embodiment includes a control transistor (transistor Tr9) corresponding to a first node (node n1). A first control signal supplied to the control terminal of the control transistor is the initialization signal INIT which becomes the on level when performing the initialization, and a second control signal supplied to the second conduction terminal of the control transistor is one of the all-on control signal AON which becomes the on level when performing the all-on output, the start signal ST which becomes the on level when starting shift, and the negative signal of the initialization signal. Therefore, the potential of the first node can be set to the off level when performing the initialization. Furthermore, it is possible to prevent the charge escape from the first node due to noise imposed on the potential supplied from the power supply circuit, and prevent malfunction of the shift register.

Fifth Embodiment

Figure 13:
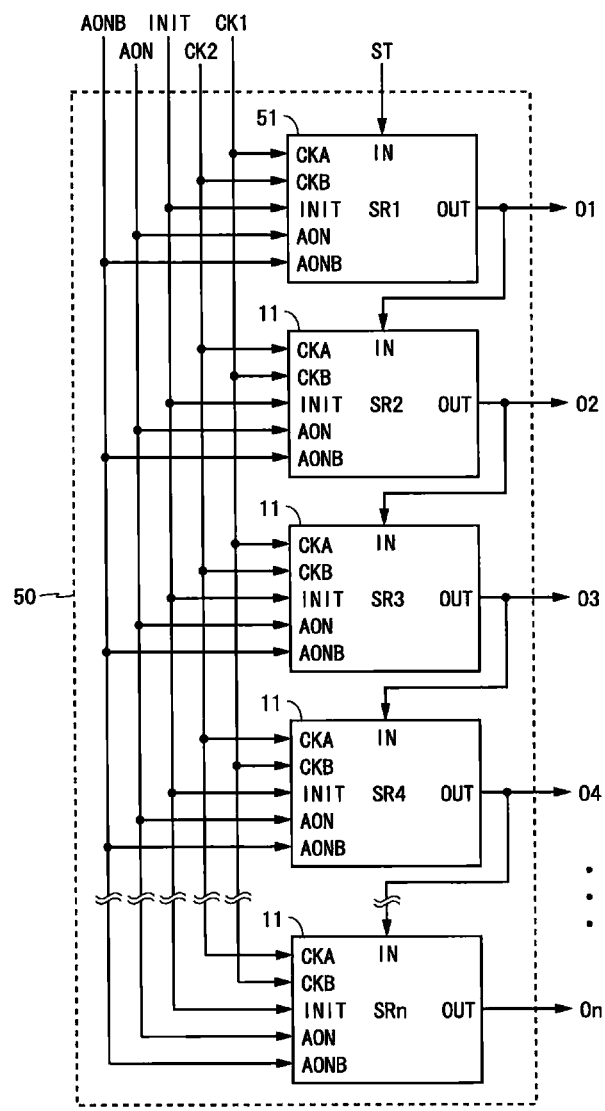
FIG. 13 is a block diagram showing a configuration of a shift register according to a fifth embodiment of the present invention.
Figure 14:
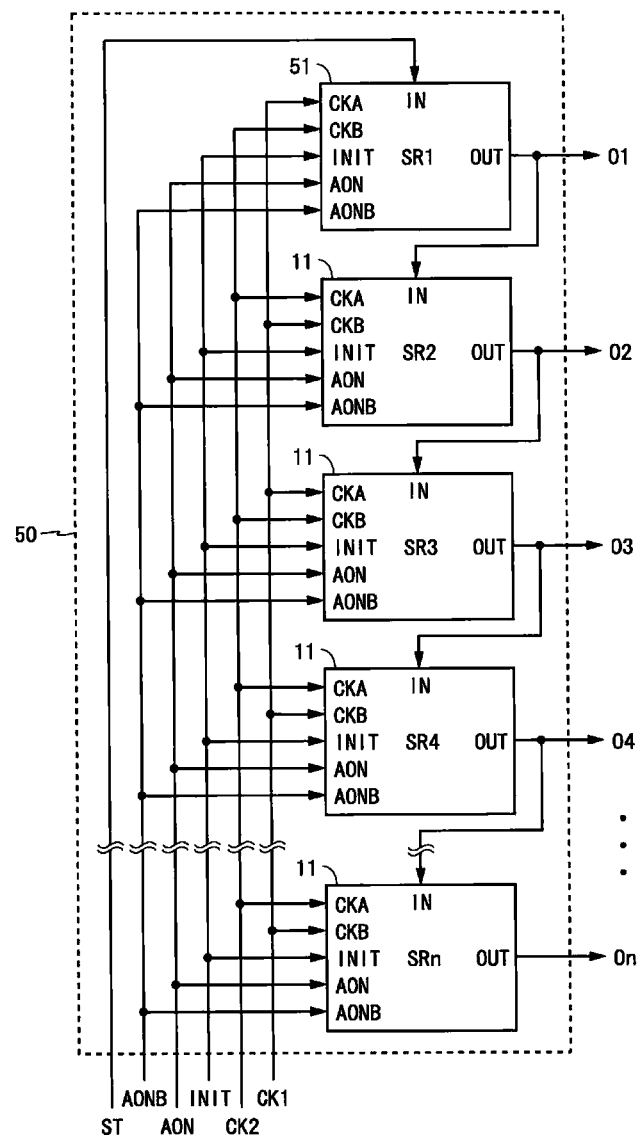
FIG. 14 is a block diagram showing another configuration of the shift register shown in FIG. 13.

FIG. 13 is a block diagram showing a configuration of a shift register according to a fifth embodiment of the present invention. A shift register 50 shown in FIG. 13 is obtained based on the shift register 10 according to the first embodiment by replacing the unit circuit 11 in the first stage with a unit circuit 51. The shift register 50 has a configuration in which the unit circuit 51 and (n−1) pieces of the unit circuits 11 are connected in multi-stage. FIG. 14 is a block diagram showing another configuration of the shift register 50. In FIG. 13, signals and power supply potentials are supplied from a side of the unit circuit SR1 in the first stage. In contrast, in FIG. 14, the signals and the power supply potentials are supplied from a side of the unit circuit SRn in a last stage.

Figure 15:
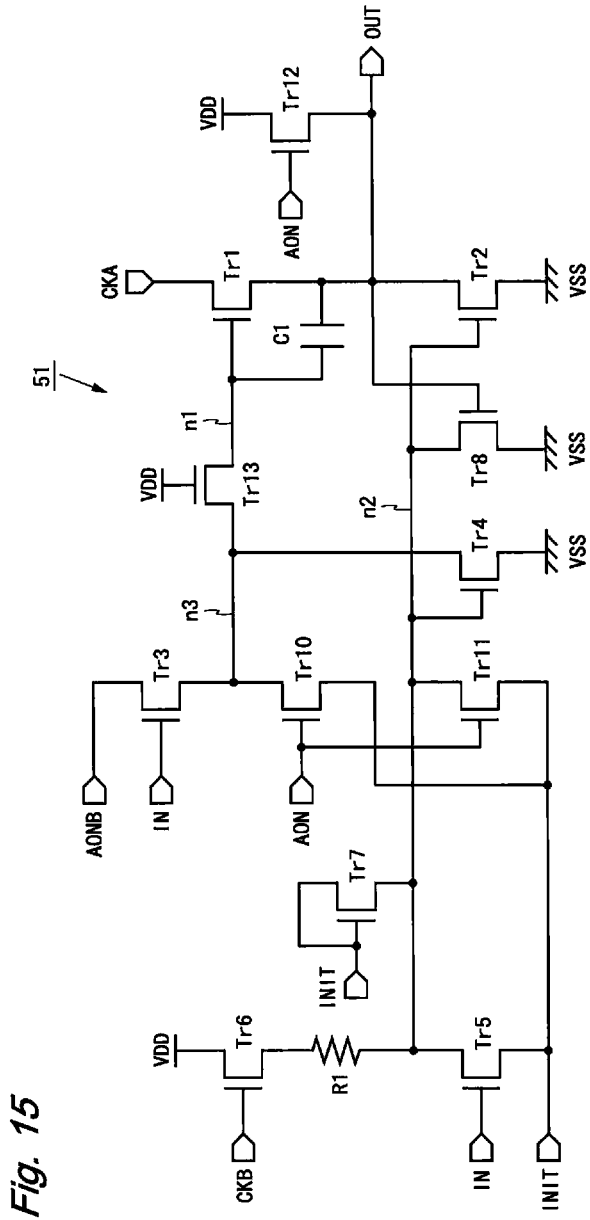
FIG. 15 is a circuit diagram of a unit circuit in a first stage of the shift register shown in FIGS. 13 and 14.

FIG. 15 is a circuit diagram of the unit circuit 51 in the first stage. The unit circuit 51 is obtained based on the unit circuit 11 by changing a connection point of the source terminal of the transistor Tr5 to the initialization terminal INIT. The start signal ST is supplied to the gate terminals of the transistors Tr3, Tr5 as the input signal IN.

In general, noise imposed on the potential supplied from the power supply circuit is increased as a resistance of the power supply line is larger, and the resistance of the power supply line is larger as the power supply line is longer. Thus, the noise imposed on the low level potential VSS supplied from the power supply circuit to the unit circuit SR1 in the first stage is larger in the configuration shown in FIG. 14 than in the configuration shown in FIG. 13.

In the unit circuit 11, the low level potential VSS supplied from the power supply circuit is applied to the source terminal of the transistor Tr5. When a resistance of the power supply line connecting the power supply circuit and the unit circuit SR1 in the first stage is small (for example, a case shown in FIG. 13), the noise imposed on the low level potential VSS supplied from the power supply circuit to the unit circuit SR1 in the first stage is small. Thus, when the start signal ST is at the low level, the transistor Tr5 does not turn on. In contrast, when the resistance of the power supply wiring connecting the power supply circuit and the unit circuit SR1 in the first stage is large (for example, a case shown in FIG. 14), the noise imposed on the low level potential VSS supplied from the power supply circuit to the unit circuit SR1 in the first stage is large. Thus, even when the start signal ST is at the low level, if the low level potential VSS is temporarily decreased greatly due to the noise, a gate-source voltage of the transistor Tr5 may exceed the threshold voltage Vth and the transistor Tr5 may turn on. When the transistor Tr5 turns on, charge accumulated at the node n2 is discharged and the potential of the node n2 is decreased. Thus, unless an appropriate design is performed considering a noise level, the shift register 10 may malfunction due to the noise imposed on the low level potential VSS supplied from the power supply circuit to the unit circuit SR1 in the first stage.

In contrast, in the unit circuit 51, the initialization signal INIT is supplied to the source terminal of the transistor Tr5. Since the initialization signal INIT is supplied from a circuit other than the power supply circuit, no noise is imposed on the initialization signal INIT. Thus, even if noise is imposed on the low level potential VSS supplied from the power supply circuit in the second retention period, the transistor Tr5 keeps the off state stably. Therefore, according to the shift register 50, it is possible to prevent the charge escape from the node n2 in the unit circuit 51 in the second retention period and prevent malfunction.

As described above, in the unit circuit 51 in the first state of the shift register 50 according to the present embodiment, a second control signal (initialization signal INIT) supplied from the outside is supplied to a second conduction terminal of a third transistor (source terminal of transistor Tr5). Therefore, it is possible to prevent the charge escape from the second node of the unit circuit in the first stage due to the noise imposed on the potential supplied from the power supply circuit, and prevent malfunction of the shift register.

As for the shift register 50 according to the present embodiment, following variants can be configured. In the unit circuit in the first stage of the shift register according to a variant, the source terminal of the transistor Tr5 may be connected to the all-on control terminal AON. Furthermore, the unit circuits SR2 to SRn in the second and subsequent stages of the shift register according to a variant may be the unit circuit 51 as in the first stage, or may be unit circuits according to other embodiments. Effects similar to those attained by the shift register 50 can also be attained by the shift registers according to these variants.

Sixth Embodiment

Figure 16:
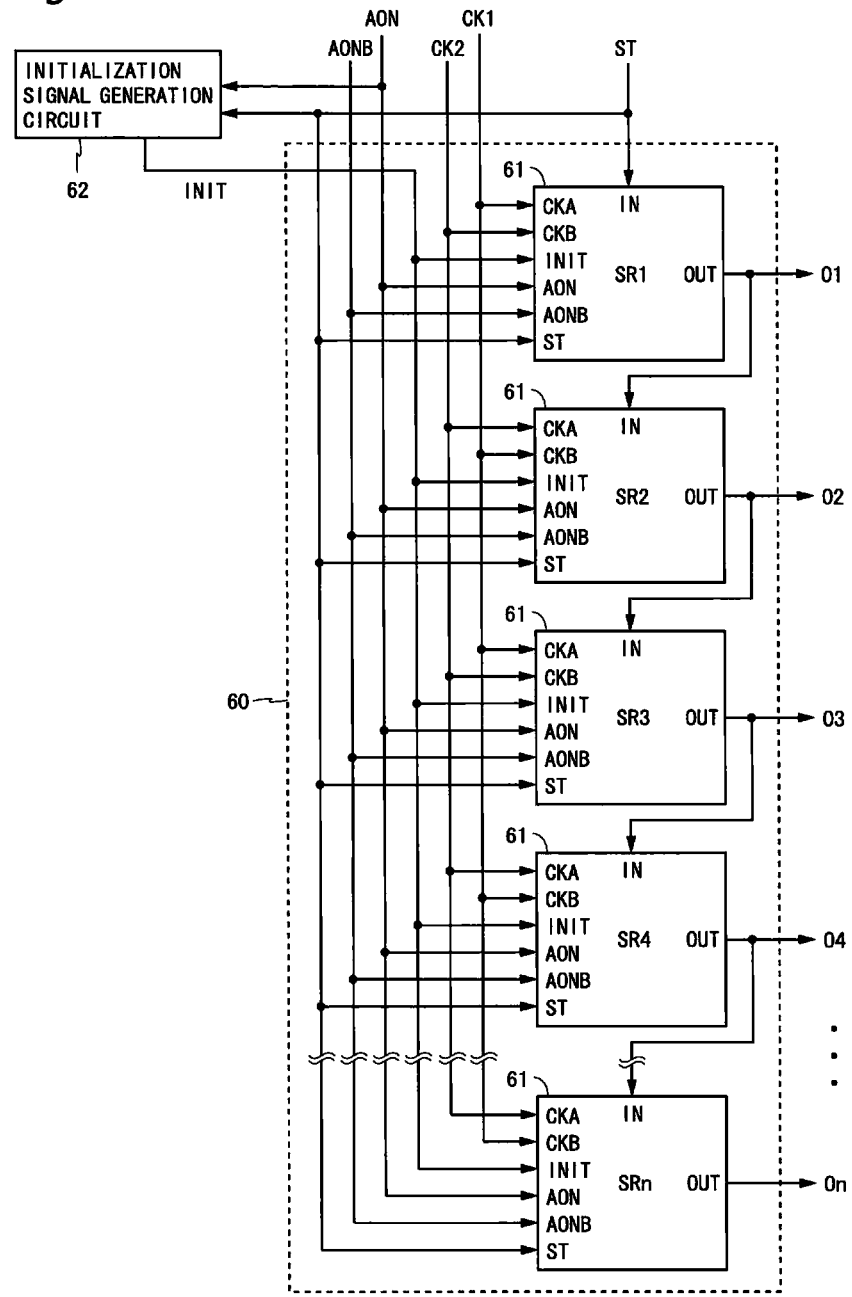
FIG. 16 is a block diagram showing configurations of a shift register and an initialization signal generation circuit according to a sixth embodiment of the present invention.

FIG. 16 is a block diagram showing a configuration of a shift register and an initialization signal generation circuit according to a sixth embodiment of the present invention. A shift register 60 shown in FIG. 16 has a configuration in which n unit circuits 61 are connected in multi-stage. The unit circuit 61 has the input terminal IN, the clock terminals CKA, CKB, the initialization terminal INIT, the all-on control terminals AON, AONB, the start terminal ST, and the output terminal OUT. The start signal ST, the two-phase clock signals CK1, CK2, the initialization signal INIT, the all-on control signal AON, and the negative signal AONB are supplied to the shift register 60 from the outside.

An initialization signal generation circuit 62 generates the initialization signal INIT to be supplied to the shift register, based on the start signal ST and the all-on control signal AON. The initialization signal generation circuit 62 outputs the initialization signal INIT having the high level in a period which starts when the all-on control signal AON changes to the high level and ends when the start signal ST changes to the high level, and outputs the initialization signal INIT having the low level otherwise. The initialization signal INIT is supplied to the terminals INIT of the n unit circuits 61. The start signal ST is supplied to the input terminal IN of the unit circuit 61 in the first stage. The clock signals CK1, CK2, the all-on control signal AON, and the negative signal AONB are supplied to the n unit circuits 61 in the same manner as in the shift register 10 according to the first embodiment.

Figure 17:
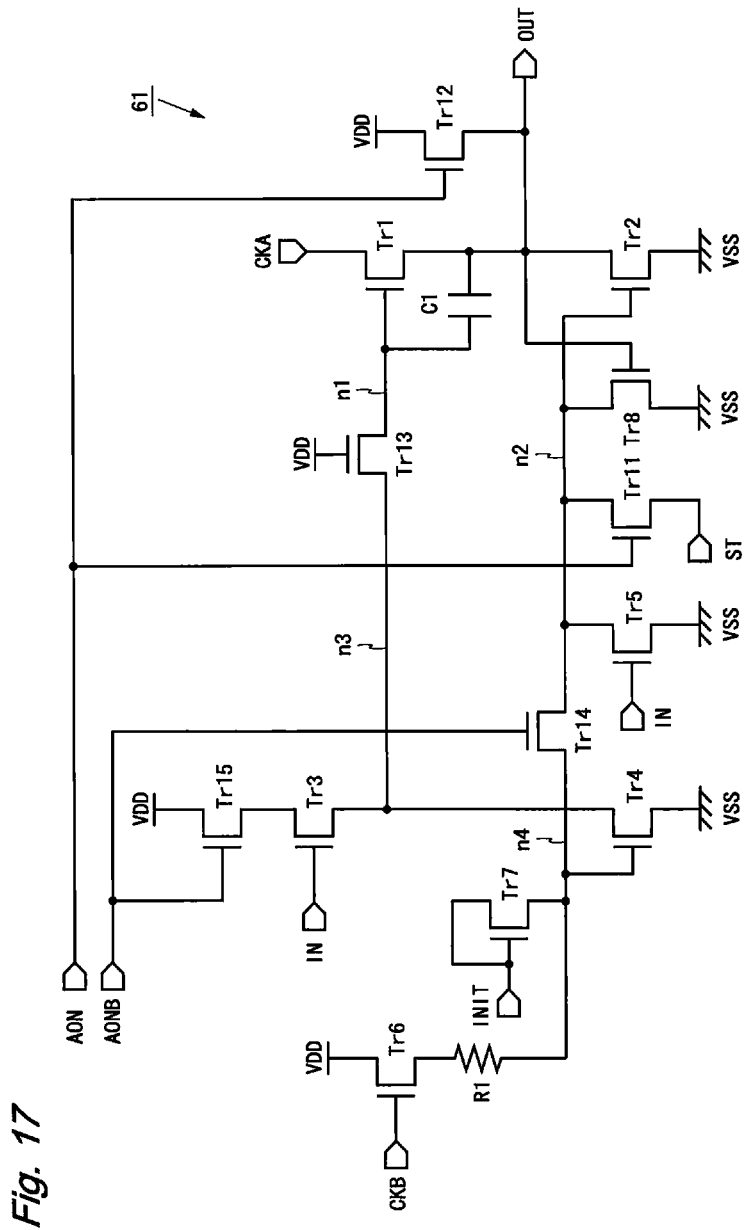
FIG. 17 is a circuit diagram of a unit circuit of the shift register shown in FIG. 16.

FIG. 17 is a circuit diagram of the unit circuit 61. The unit circuit 61 shown in FIG. 17 includes thirteen N-channel type transistors Tr1 to Tr8, Tr11 to Tr15, the capacitor C1 and the resistor R1. The unit circuit 61 is different from the unit circuit 11 in the following points. In the unit circuit 61, the drain terminals of the transistors Tr5, Tr8, Tr11 and one conduction terminal (right-side terminal in FIG. 17) of the transistor Tr14 are connected to the gate terminal of the transistor Tr2. The other conduction terminal of the transistor Tr14 connected to the gate terminal of the transistor Tr4, the source terminal of the transistor Tr7, and one end (lower end in FIG. 17) of the resistor R1. The drain terminal of the transistor Tr3 is connected to a source terminal of the transistor Tr15. The high level potential VDD is applied to a drain terminal of the transistor Tr15, and gate terminals of the transistors Tr14, Tr15 are connected to the all-on control terminal AONB. The source terminal of the transistor Tr11 is connected to the start terminal ST. Hereinafter, a node to which the gate terminal of the transistor Tr4 is connected is referred to as n4.

In the unit circuit 61, the transistors Tr3 to Tr8, Tr11, Tr13 to Tr15 and the resistor R1 function as a node control unit for controlling the potentials of the nodes n1, n2. Functions of the transistors Tr1 to Tr8, Tr12, Tr13 are the same as those in the unit circuit 11. Function of the transistor Tr11 is the same as that of the unit circuit 31. However, the transistor Tr7 controls the potential of the node n2 to be the on level (high level), by controlling a potential of the node n4 to be the on level in accordance with the initialization signal INIT. The transistor Tr15 supplies the on potential to a first transistor (transistor Tr3) in accordance with the negative signal AONB. The transistor Tr14 has a conduction terminal connected to the node n2, a conduction terminal connected to the node n4 (corresponding to third node), and a control terminal to which the negative signal AONB is supplied.

Figure 18:
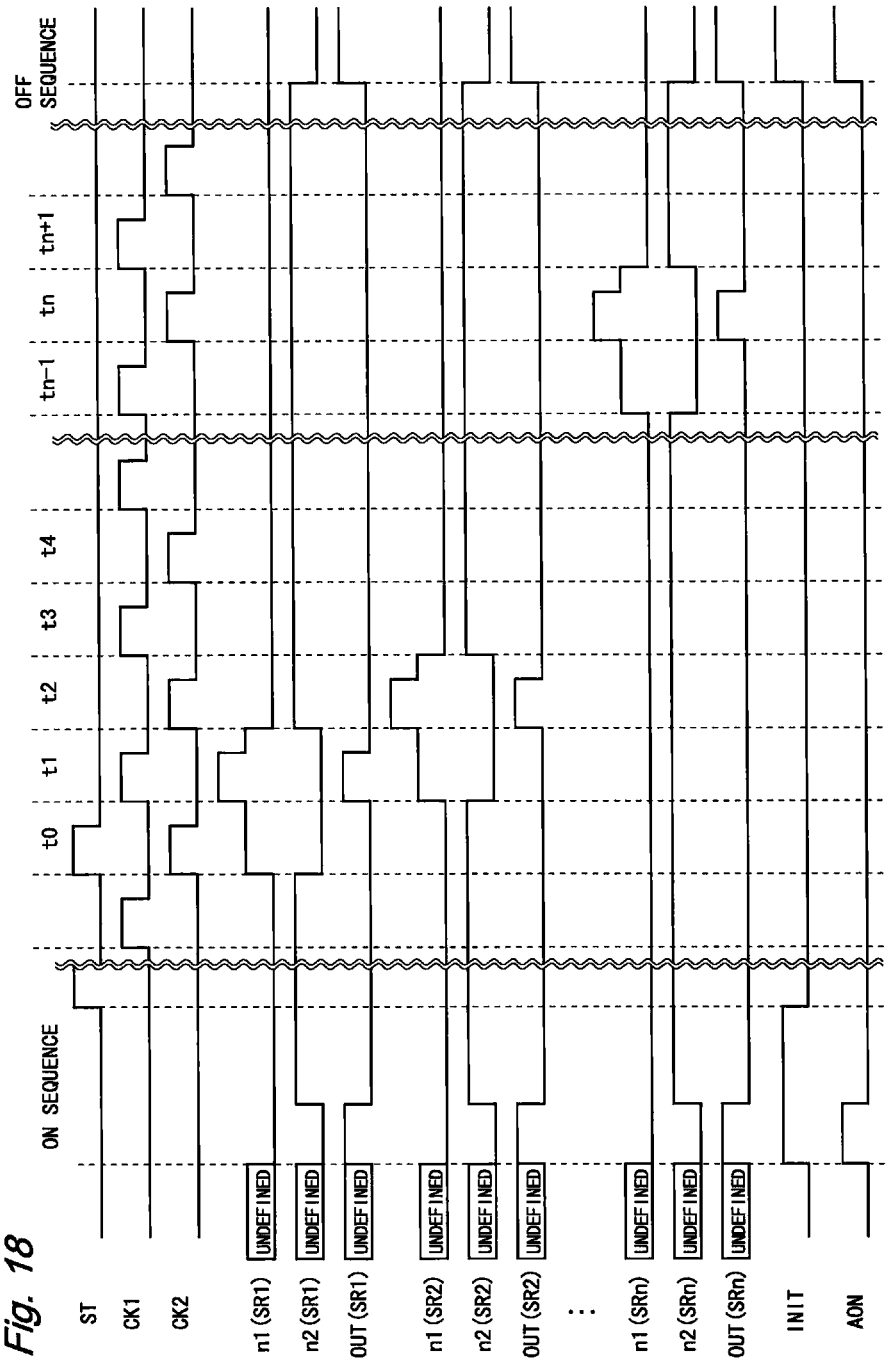
FIG. 18 is timing chart of the shift register shown in FIG. 16.

FIG. 18 is a timing chart of the shift register 60. The shift register 60 performs the initialization when the initialization signal INIT is at the high level and the all-on control signal AON is at the low level, performs the normal operation when the initialization signal INIT and the all-on control signal AON are at the low level, and performs the all-on output when the all-on control signal AON is at the high level. Note that there are no cases in which the initialization signal INIT is at the low level and the all-on control signal AON is at the high level.

When performing the normal operation, the initialization signal INIT and the all-on control signal AON become the low level and the negative signal AONB becomes the high level. Thus, the transistors Tr7, Tr11, Tr12 turn off and the transistors Tr14, Tr15 turn on. Therefore, the high level potential VDD is applied to the drain terminal of the transistor Tr3, and the node n2 and the node n4 are electrically connected. When performing the normal operation, the unit circuit 61 becomes a same circuit as the unit circuit 11 and performs the same operations as the unit circuit 11.

In an on sequence shown in FIG. 18, the shift register 60 performs the all-on output and the initialization. Before performing the on sequence, the start signal ST, the initialization signal INIT, and the all-on control signal AON are at the low level, and the negative signal AONB is at the high level. At first, the all-on control signal AON changes to the high level, and the negative signal AONB changes to the low level. Accordingly, the initialization signal generation circuit 62 changes the initialization signal INIT to the high level. Thus, the transistors Tr7, Tr11, Tr12 turn on, the transistors Tr14, Tr15 turn off, and the node n2 and the node n4 are electrically disconnected. The potential of the node n4 becomes the high level by an action of the transistor Tr7. The potential of the node n2 becomes the low level by an action of the transistor Tr11, and the transistor Tr2 turns off.

When the potential of the node n4 becomes the high level, the transistor Tr4 turns on, and the potentials of the nodes n1, n3 become the low level. Note that since the transistor Tr15 is in the off state at this time, even if the transistor Tr3 turns on, the high level potential is not applied to the node n3 via the transistors Tr3, Tr15. When the potential of the node n1 becomes the low level, the transistor Tr1 turns off. In this manner, since the transistors Tr1, Tr2 turn off and the transistor Tr12 turns on, the output signal OUT becomes the high level and the transistor Tr8 turns on. In this manner, by setting the all-on control signal AON to the high level when performing the on sequence, it is possible to change the initialization signal INIT to the high level, and set the output signals O1 to On of the shift register 60 to the high level.

Next, in a period when the initialization signal INIT is at the high level, the all-on control signal AON changes to the low level, and the negative signal AONB changes to the high level. Thus, the transistors Tr11, Tr12 turn off and the transistors Tr14, Tr15 turn on. After the transistor Tr12 turns off, the output terminal OUT becomes the floating state. Since charge accumulated at the output terminal OUT is kept at this time, the output signal OUT keeps the high level and the transistor Tr8 keeps the on state.

Before the transistor Tr14 turns on, the potential of the node n4 is at the high level and the potential of the node n2 is at the low level. When the transistor Tr14 turns on, the initialization terminal INIT having the high level potential and the source terminal of the transistor Tr8 having the low level potential are short-circuited in a moment via the transistors Tr7, Tr14, Tr8.

The unit circuit 61 is designed so that a drive capability of the transistor Tr7 is larger than that of the transistor Tr8. For example, a channel width of the transistor Tr7 is designed so as to be larger than that of the transistor Tr8. Thus, when the transistor Tr14 turns on, the potential of the node n2 is increased and exceeds the on potential of the transistor and the transistor Tr2 turns on. Accordingly, charge accumulated at the output terminal OUT is discharged, and the output signal OUT becomes the low level. Therefore, the transistor Tr8 turns off, and the potential of the node n2 becomes (VDD−Vth) eventually.

The input signal IN of the unit circuit 61 is the output signal OUT of the unit circuit 61 in the previous stage. Thus, when the output signal OUT of the unit circuit 61 in the previous stage changes to the low level, the transistor Tr3 turns off. In this manner, since the transistor Tr3 turns off in turn when the transistor Tr15 turns on, the high level potential VDD is not applied to the node n3 via the transistors Tr3, Tr15. Furthermore, since the transistor Tr4 keeps the on state, the potentials of the nodes n1, n3 are kept at the low level and the transistor Tr1 keeps the off state. In this manner, it is possible to initialize the shift register 60 and set the output signal OUT to the low level, by changing the all-on control signal AON to the low level while keeping the initialization signal INIT at the high level.

Next, the start signal ST changes to the high level. Accordingly, the initialization signal generation circuit 62 changes the initialization signal INIT to the low level. Thus, the transistor Tr7 turns off. After that, the shift register 60 performs the normal operation.

In the off sequence shown in FIG. 18, the shift register 60 performs the all-on output. At this time, the all-on control signal AON changes to the high level, and the initialization signal generation circuit 62 changes the initialization signal INIT to the high level. The output signals O1 to On of the shift register 60 can be set to the high level, by setting the initialization signal INIT and the all-on control signal AON to the high level.

According to the shift register 60, as with the shift register 30 according to the third embodiment, it is possible to prevent the charge escape from the node n2 in the second retention period and prevent malfunction. Furthermore, it is also possible to prevent malfunction due to the increase of the potential of the node n2 in the third retention period. Note that similar effects can be attained if the negative signal AONB of the all-on control signal is supplied to the source terminal of the transistor Tr11.

Figure 19:
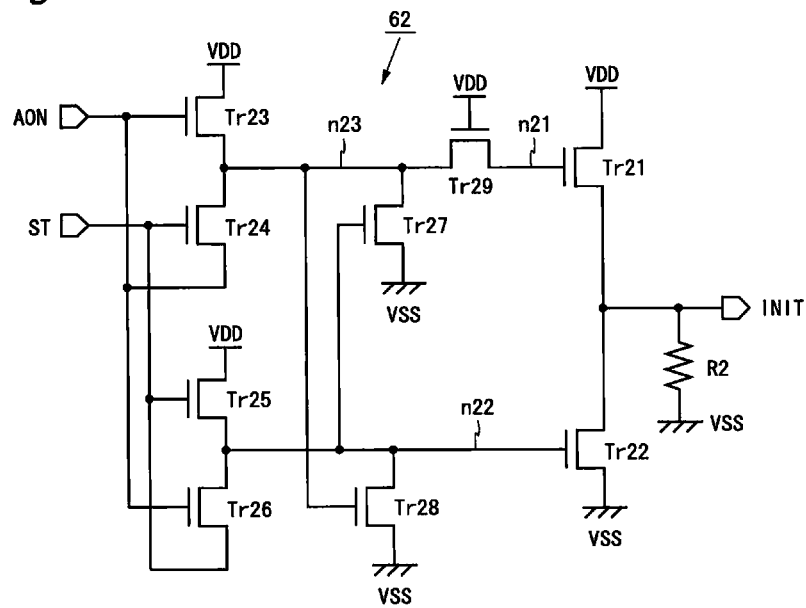
FIG. 19 is a circuit diagram of the initialization signal generation circuit shown in FIG. 16.

FIG. 19 is a circuit diagram of the initialization signal generation circuit 62. The initialization signal generation circuit 62 shown in FIG. 19 includes nine transistors Tr21 to Tr29 and a resistor R2. A source terminal of the transistor Tr21 is connected to a drain terminal of the transistor Tr22, one end (upper end in FIG. 19) of the resistor R2, and the output terminal INIT. A gate terminal of the transistor Tr21 is connected to one conduction terminal (right-side terminal in FIG. 19) of the transistor Tr29. The other conduction terminal of the transistor Tr29 is connected to a source terminal of the transistor Tr23, drain terminals of the transistors Tr24, Tr27, and a gate terminal of the transistor Tr28. A gate terminal of the transistor Tr22 is connected to a source terminal of the transistor Tr25, drain terminals of the transistors Tr26, Tr28, and a gate terminal of the transistor Tr27. Gate terminals of the transistors Tr23, Tr26 and a source terminal of the transistor Tr24 are connected to the all-on control terminal AON. Gate terminals of the transistors Tr24, Tr25 and a source terminal of the transistor Tr26 are connected to the start terminal ST. The high level potential VDD is applied to drain terminals of the transistors Tr21, Tr23 and a gate terminal of the transistor Tr29. The low level potential VSS is applied to source terminals of the transistors Tr22, Tr27, Tr28 and the other end of the resistor R2. Hereinafter, a node connected to the gate terminal of the transistor Tr21 is referred to as n21, a node connected to the gate terminal of the transistor Tr22 is referred to as n22, and a node connected to the source terminal of the transistor Tr23 is referred to as n23.

Figure 20:
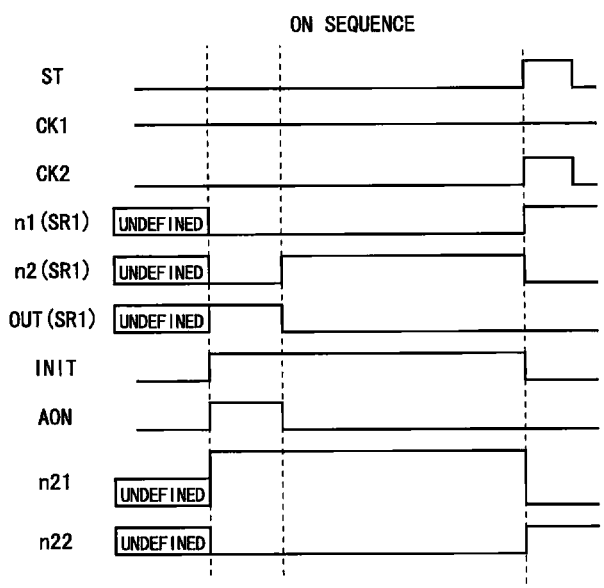

FIG. 20 is a timing chart of the shift register 60 when a power is turned on. FIG. 20 depicts changes of potentials of the nodes n21, n22 in the initialization signal generation circuit 62. For the sake of description of the drawings, length of a high level period of the initialization signal INIT is different between in FIG. 18 and in FIG. 20.

Operations of the initialization signal generation circuit 62 when performing the on sequence will be described referring to FIG. 20. Potentials of the nodes n21 to n23 are undefined before performing the on sequence. When the all-on control signal AON changes to the high level, the transistors Tr23, Tr26 turn on. Since the start signal ST having the low level is supplied to the source terminal of the transistor Tr26 at this time, when the transistor Tr26 turns on, the potential of the node n22 becomes the low level and the transistors Tr22, Tr27 turn off. On the other hand, when the transistor Tr23 turns on, the potential of the node n23 becomes (VDD−Vth) and the transistor Tr28 turns on. Since the high level potential VDD is applied to the gate terminal of the transistor Tr29, the node n21 and the node n23 are electrically connected. Thus, the potential of the node n21 is also increased to (VDD−Vth). When the potential of the node n21 is increased to (VDD−Vth), the transistor Tr29 turns off and the node n21 becomes the floating state. When the potential of the node n21 exceeds the on level of the transistor on the way, the transistor Tr21 turns on. Thus, a potential of the output terminal INIT becomes the high level. At this time, the potential of the node n21 is pushed up by parasitic capacitance between the node n21 and the output terminal INIT. Since the potential of the node n21 becomes higher than (VDD+Vth), the potential of the output terminal INIT becomes equal to the high level potential VDD (high level potential without threshold drop).

Next, when the all-on control signal AON changes to the low level, the transistors Tr23, Tr26 turn off. After that, the nodes n21, n23 keep the high level potential in the floating state, and the node n22 keeps the low level potential in the floating state.

Next, when the start signal ST changes to the high level, the transistors Tr24, Tr25 turn on. Since the all-on control signal AON having the low level is supplied to the source terminal of the transistor Tr24 at this time, when the transistor Tr24 turns on, the potentials of the nodes n21, n23 become the low level and the transistors Tr21, Tr23 turn off. On the other hand, when the transistor Tr25 turns on, the potential of the node n22 becomes (VDD−Vth) and the transistors Tr22, Tr27 turn on. Therefore, the output signal INIT becomes the low level.

Next, when the start signal ST changes to the low level, the transistors Tr24, Tr25 turn off. After that, the nodes n21, n23 keep the low level potential in the floating state, and the node n22 keeps the high level potential in the floating state.

In this manner, the initialization signal generation circuit 62 outputs the initialization signal INIT having the high level in a period which starts when the all-on control signal AON changes to the high level and ends when the start signal ST changes to the high level, and outputs the initialization signal INIT having the low level otherwise.

If the potential of the initialization signal INIT is close to the high level potential VDD before performing the initialization, an amount of change of the potential of the initialization signal INIT when the transistor Tr21 turns on is small. Thus, a push-up amount of the potential of the node n21 is small, and the potential of the initialization signal INIT may not be increased to the high level potential VDD in some cases. The resistor R2 has a function of fixing the initialization signal INIT to the low level before performing the initialization. In the initialization signal generation circuit 62 including the resistor R2, the amount of change of the potential of the initialization signal INIT when the transistor Tr21 turns on is large. Thus, the push-up amount of the potential of the node n21 is large, and the potential of the initialization signal INIT is increased to the high level potential VDD. Note that even if the resistor R2 is deleted, the initialization signal generation circuit 62 operates in a manner similar as described above.

The transistor Tr29 is provided in order to suppress the potential of the node n23 to be not more than (VDD−Vth) and prevent a high voltage from being applied to the transistors Tr24, Tr27, when the potential of the node n21 is pushed up. Even if the transistor Tr29 is deleted and the node n21 and the node n23 are short-circuited, the initialization signal generation circuit 62 operates in a manner similar as described above.

Figure 21:
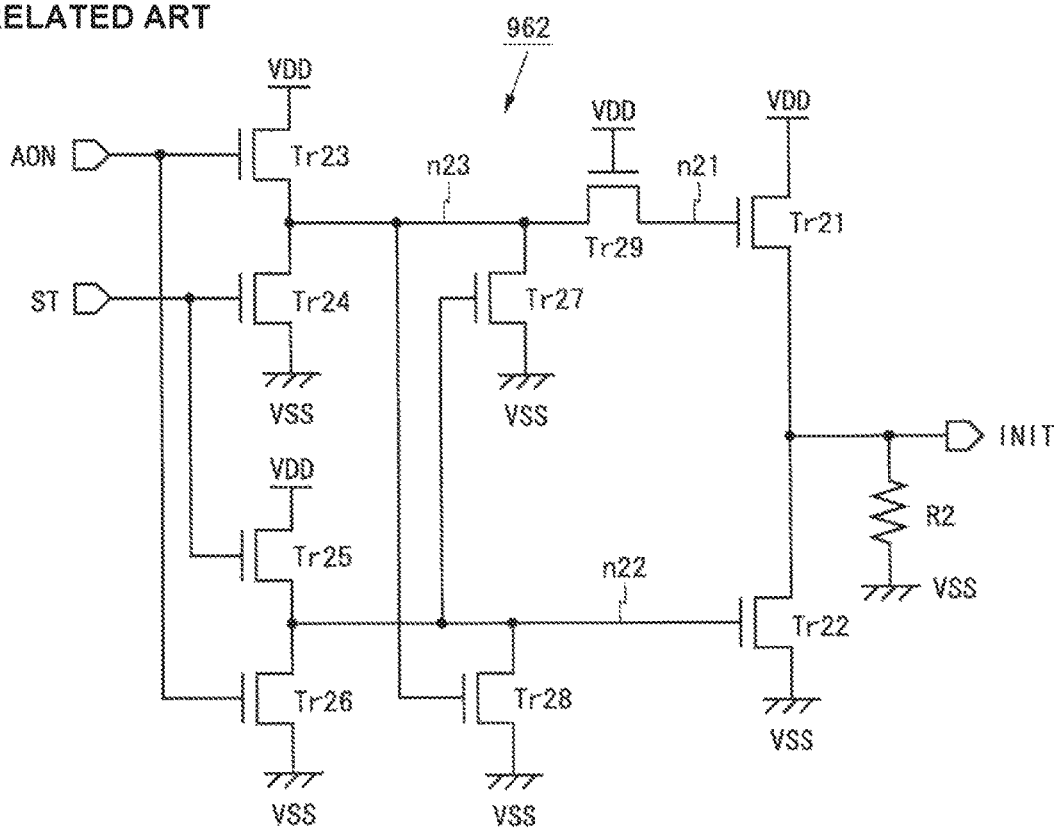
FIG. 21 is a circuit diagram of an initialization signal generation circuit according to a comparative example.

FIG. 21 is a circuit diagram of an initialization signal generation circuit according to a comparative example. In an initialization signal generation circuit 962 shown in FIG. 21, the low level potential VSS is fixedly applied to the source terminals of the transistors Tr24, Tr26. As described below, the initialization signal generation circuit 62 is more proof against noise than the initialization signal generation circuit 962.

In a display device including a shift register as a scanning line drive circuit, noise is likely to be imposed on the low level potential VSS supplied from the power supply circuit. In the initialization signal generation circuit 962, the low level potential VSS supplied from the power supply circuit is applied to the source terminal of the transistor TR24. If noise is imposed on the low level potential VSS and the low level potential VSS is temporarily decreased greatly while the nodes n21, n23 keep the high level potential in the floating state, a gate-source voltage of the transistor Tr24 may exceed the threshold voltage Vth and the transistor Tr24 may turn on. When the transistor Tr24 turns on, charge accumulated at the nodes n21, n23 is discharged (charge escape from nodes n21, n23), and the potentials of the nodes n21, n23 are decreased. When the potentials of the nodes n21, n23 become lower than the on potential of the transistor, the shift register malfunctions, because the transistor Tr21 turns off and the potential of the output initialization signal INIT becomes undefined.

Furthermore, if noise is imposed on the low level potential VSS and the low level potential VSS is temporarily decreased greatly while the node n22 keeps the high level potential in the floating state, a gate-source voltage of the transistor Tr26 may exceed the threshold voltage Vth and the transistor Tr26 may turn on. When the transistor Tr26 turns on, charge accumulated at the node n22 is discharged (charge escape from node n22), and the potential of the node n22 is decreased. When the potential of the node n22 becomes lower than the on potential of the transistor, the shift register malfunctions, because the transistor Tr22 turns off and the potential of the output initialization signal INIT becomes undefined.

In contrast, in the initialization signal generation circuit 62, the all-on control signal AON is supplied to the source terminal of the transistor Tr24, and the start signal ST is supplied to the source terminal of the transistor Tr26. Since the start signal ST and the initialization signal INIT are supplied from a circuit other than the power supply circuit, no noise is imposed on the start signal ST and the initialization signal INIT.

Thus, even if noise is imposed on the low level potential VSS supplied from the power supply circuit while the nodes n21, n23 keep the high level potential in the floating state, the transistor Tr24 keeps the off state stably. Furthermore, when the nodes n21, n23 keep the low level potential n the floating state, the all-on control signal AON is at the low level. Thus, the potentials of the nodes n21, n23 are not increased due to an off-leakage current flowing through the transistor Tr24. Therefore, according to the initialization signal generation circuit 62, it is possible to prevent malfunction due to the charge escape from the nodes n21, n23, and prevent malfunction due to an increase of the potentials of the nodes n21, n23.

Furthermore, even if noise is imposed on the low level potential VSS supplied from the power supply circuit while the node n22 keeps the high level potential in the floating state, the transistor Tr26 keeps the off state stably. Furthermore, when the node n22 keeps the low level potential in the floating state, the start signal ST is at the low level. Thus, the potential of the node n22 is not increased due to an off-leakage current flowing through the transistor Tr26. Therefore, according to the initialization signal generation circuit 62, it is possible to prevent malfunction due to the charge escape from the node n22, and prevent malfunction due to an increase of the potential of the node n22.

As described above, the unit circuit 61 of the shift register 60 according to the present embodiment includes a control transistor (transistor Tr11) corresponding to a second node (node n2). A first control signal supplied to a control terminal of the control transistor is the all-on control signal AON which becomes the on level when performing the all-on output, and a second control signal supplied to a second conduction terminal of the control transistor is one of the start signal ST which becomes the on level when starting the shift and the negative signal AONB of the all-on control signal. Therefore, the potential of the second node can be controlled to be the off level when performing the all-on output. Furthermore, it is possible to prevent the charge escape from the second node due to the noise imposed on the potential supplied from the power supply circuit, and prevent malfunction of the shift register 60.

Furthermore, the node control unit of the unit circuit 61 includes the transistor Tr15 for supplying the on potential to a first transistor in accordance with the negative signal AONB of the all-on control signal, the transistor Tr14 having a conduction terminal connected to the second node, a conduction terminal connected to a third node (node n4), and a control terminal to which the negative signal AONB of the all-on control signal is supplied, and the transistor Tr11 for controlling the potential of the second node to be the off level in accordance with the all-on control signal AON. A control terminal of a second transistor (gate terminal of transistor Tr4), a second conduction terminal of a fourth transistor (source terminal of transistor Tr6), and a second conduction terminal of a fifth transistor (source terminal of transistor Tr7) are connected to the third node. Therefore, when performing the normal operation, the second node and the third node are electrically connected, and the first transistor controls the potential of the first node to be the on level in accordance with the input signal. When performing the all-on output, the potential of the third node becomes the on level, the potentials of the first and second nodes become the off level, the output transistor turns off, and the potential of the output terminal becomes the on level. In this manner, the shift register 60 can perform the normal operation and the all-on output selectively.

Furthermore, the circuit shown in FIG. 16 includes the shift register 60 and a control signal generation circuit (initialization signal generation circuit 62) for generating a control signal (initialization signal INIT) to be supplied to the shift register 60. The control signal generation circuit includes a set transistor (transistors Tr23, Tr25) for applying the on potential to a node (nodes n21, n22), and a reset transistor (transistors Tr24, Tr26) having a first conduction terminal connected to the node, a control terminal to which a first control signal (start signal ST, all-on control signal AON) that becomes the off level at least when performing the normal operation is supplied from the outside, and a second conduction terminal to which a second control signal (all-on control signal AON, start signal ST) that becomes the off level when the first control signal is in the on level is supplied from the outside.

Therefore, it is possible to prevent the charge escape from the node due to the noise imposed on the potential supplied from the power supply circuit, by providing the control signal supplied from the outside to the control terminal and the second conduction terminal of the reset transistor. With this, it is possible to prevent malfunction of the control signal generation circuit, and prevent malfunction of the shift register.

As for the shift register 60 according to the present embodiment, a following variant can be configured. In a unit circuit in the first stage of a shift register according to the variant, the source terminal of the transistor Tr5 may be connected to the initialization terminal INIT or the all-on control terminal AON.

Seventh Embodiment

A shift register according to a seventh embodiment of the present invention has the configuration shown in FIG. 1. However, the shift register according to the present embodiment includes a unit circuit 71 shown in FIG. 22 in place of the unit circuit 11.

Figure 22:
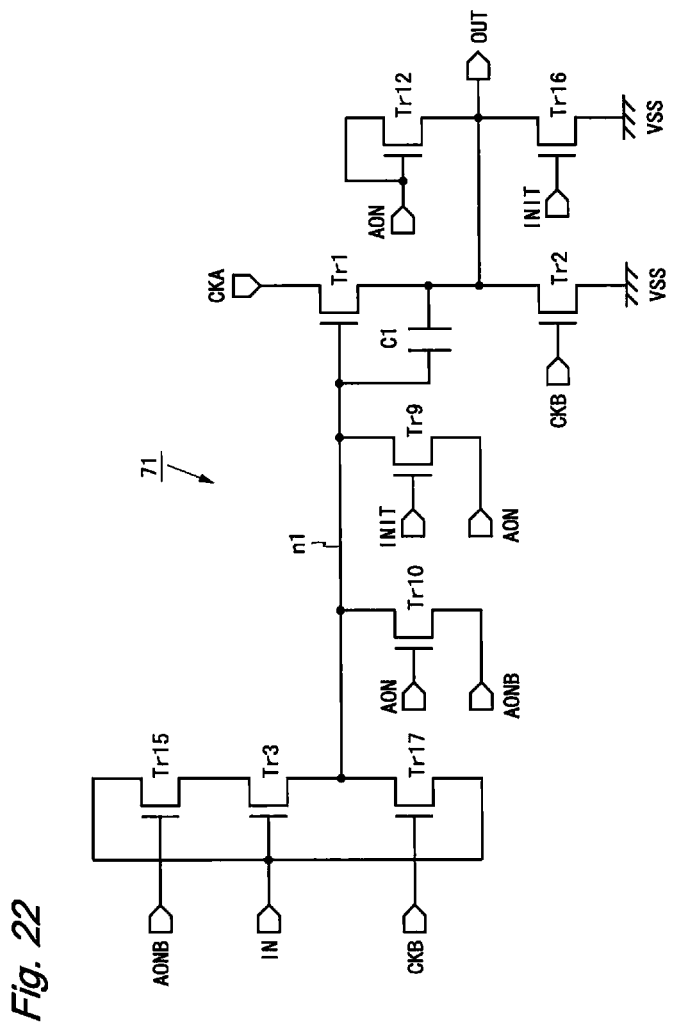
FIG. 22 is a circuit diagram of a unit circuit of a shift register according to a seventh embodiment of the present invention.

The unit circuit 71 shown in FIG. 22 includes nine N-channel type transistors Tr1 to Tr3, Tr9, Tr10, Tr12, Tr15 to Tr17, and the capacitor C1. The drain terminal of the transistor Tr1 is connected to the clock terminal CKA. The source terminal of the transistor Tr1 is connected to drain terminals of the transistors Tr2, Tr16, the source terminal of the transistor Tr12, and the output terminal OUT. The gate terminal of the transistor Tr1 is connected to the source terminal of the transistor Tr3 and drain terminals of the transistors Tr9, Tr10, Tr17. The drain terminal of the transistor Tr3 is connected to the source terminal of the transistor Tr15. Gate terminals of the transistors Tr2, Tr17 are connected to the clock terminal CKB. The gate terminal of the transistor Tr3, the drain terminal of the transistor Tr15, and a source terminal of the transistor Tr17 are connected to the input terminal IN. Gate terminals of the transistors Tr9, Tr16 are connected to the initialization terminal INIT. The source terminal of the transistor Tr9, the gate terminals of the transistors Tr10, Tr12, and the drain terminal of the transistor Tr12 are connected to the ail-on control terminal AON. The source terminal of the transistor Tr10 and the gate terminal of the transistor Tr15 are connected to the all-on terminal AONB. The low level potential VSS is fixedly applied to source terminals of the transistors Tr2, Tr16. The capacitor C1 is provided between the gate terminal and the source terminal of the transistor Tr1, and functions as a bootstrap capacitor.

In the unit circuit 71, the transistors Tr3, Tr9, Tr10, Tr15, Tr17 function as a node control unit for controlling the potential of the node n1. The transistor Tr1 has the drain terminal connected to the clock terminal CKA, the source terminal connected to the output terminal OUT, and the gate terminal connected to the node n1, and functions as an output transistor. The transistor Tr2 has the drain terminal connected to the output terminal OUT, the source terminal to which the off potential (low level potential VSS) is applied, and the gate terminal to which the clock signal CKB is supplied, and functions as an output reset transistor.

The transistor Tr3 functions as a first transistor for controlling the potential of the node to be the on level in accordance with the input signal IN. The transistor Tr17 functions as a second transistor for controlling the potential of the node n1 to be the off level in accordance with the clock signal CKB. The transistor Tr12 controls the potential of the output terminal OUT to be the on level in accordance with the all-on control signal AON. The transistor Tr16 controls the potential of the output terminal OUT to be the off level in accordance with the initialization signal INIT. The transistor Tr15 supplies the input signal IN to the drain terminal of the first transistor in accordance with the negative signal AONB of the all-on control signal. The transistor Tr10 controls the potential of the node n1 via a first conduction terminal in accordance with the all-on control signal AON. The transistor Tr9 controls the potential of the node n1 via a first conduction terminal in accordance with the initialization signal INIT. The transistors Tr9, Tr10 function as control transistors.

The shift register according to the present embodiment performs the initialization when the initialization signal INIT is at the high level, performs the normal operation when the initialization signal INIT and the all-on control signal AON are at the low level, and performs the all-on output when the all-on control signal AON is at the high level. Note that there are no cases in which both the initialization signal INIT and the all-on control signal AON becomes the high level.

The shift register according to the present embodiment operates according to the timing chart shown in FIG. 3 (except for changes of the potential of the node n2). When performing the normal operation, since the initialization signal INIT and the all-on control signal AON are at the low level, the transistors Tr9, Tr10, Tr12, Tr16 turn off. Thus, these transistors do not affect the normal operation of the shift register 10. Furthermore, since the transistor Tr15 turns on, the input signal IN is supplied to the drain terminal of the transistor Tr3.

The normal operation of the unit circuit SR1 in the first stage will be described below. In the period t0, the input signal IN (start signal ST) changes to the high level. Thus, the transistor Tr3 turns on, the potential of the node n1 becomes the high level, and the transistor Tr1 turns on. Furthermore, since both the clock signal CKB and the input signal IN are at the high level, the potential of the node n1 becomes the high level also by an action of the transistor Tr17. Since the clock signal CKA is at the low level at this time, the output signal OUT remains at the low level. In the latter part of the period t0, the input signal IN changes to the low level. Thus, the transistor Tr3 turns off. After that, the node n1 keeps the high level potential in the floating state.

In the period t1, the clock signal CKA changes to the high level. Since the transistor Tr1 is in the on state at this time, the output signal OUT becomes the high level. The potential of the output terminal OUT becomes equal to the high level potential VDD of the clock signal CKA by the bootstrap operation. In the latter part of the period t1, the clock signal CKA changes to the low level. Thus, the output signal OUT becomes the low level, and the potential of the node n1 returns to the same potential (VDD−Vth) as in the period t0.

In the period t2, the clock signal CKB changes to the high level. Thus, the transistors Tr2, Tr17 turn on and the output signal OUT becomes the low level. Since the input signal IN is at the low level at this time, the potential of the node n1 becomes the low level and the transistor Tr1 turns off. In the latter part of the period t2, the clock signal CKB changes to the low level. Thus, the transistors Tr2, Tr17 turn off.

In this manner, the output signal OUT of the unit circuit SR1 becomes the high level (potential is VDD) in the high level period of the clock signal CK1 in the period t1. As with the shift register 10 according to the first embodiment, the output signals O1 to On of the shift register according to the present embodiment sequentially become the high level in a time having the same length as the high level period of the clock signal CK1, with delaying by ½ cycle of the clock signal CK1.

When performing the initialization, the initialization signal INIT becomes the high level. Thus, the transistors Tr9, Tr16 turn on. Since the all-on control signal AON is at the low level at this time, the potential of the node n1 becomes the low level and the transistor Tr1 turns off. Since the transistor Tr12 also turns off at this time, the output signal OUT becomes the low level by an action of the transistor Tr16.

When performing the all-on output, the all-on control signal AON becomes the high level and the negative signal AONB becomes the low level. Thus, the transistors Tr10, Tr12 turn on and the transistor Tr15 turns off. Since the negative signal AONB is at the low level at this time, the potential of the node n1 becomes the low level by an action of the transistor Tr10 and the transistor Tr1 turns off. Since the transistor Tr16 also turns off at this time, the output signal OUT becomes the high level by an action of the transistor Tr12.

In the unit circuit 71, the negative signal AONB is supplied to the source terminal of the transistor Tr10, and the all-on control signal AON is supplied to the source terminal of the transistor Tr9. The all-on control signal AON and the negative signal AONB are supplied from the display control circuit provided at the outside. Thus, almost no noise is imposed on the all-on control signal AON and the negative signal AONB. Therefore, even if noise is imposed on the low level potential VSS supplied from the power supply circuit in a first retention period (period in which the node n1 keeps the high level potential in the floating state), the transistors Tr9, Tr10 keep the off state stably. Therefore, according to the shift register according to the present embodiment, it is possible to prevent the charge escape from the node n1 in the first retention period and prevent malfunction.

Note that in place of the negative signal AONB, the initialization signal INIT or the start signal ST may be supplied to the source terminal of the transistor Tr10. Furthermore, to the source terminal of the transistor Tr9, the start signal ST may be supplied, or the negative signal of the initialization signal may be supplied in place of the all-on control signal AON. According to the shift register according to these variants, effects similar those attained by the shift register according to the present embodiment can be attained.

As described above, the unit circuit 71 of the shift register according to the present embodiment includes an output transistor (transistor Tr1) having a first conduction terminal connected to a clock terminal for inputting a clock signal, a second conduction terminal connected to an output terminal for outputting the clock signal, and a control terminal connected to a first node (node n1), an output reset transistor (transistor Tr2) having a first conduction terminal connected to the output terminal, a second conduction terminal to which the off potential is applied, and a control terminal to which a second clock signal is supplied, and a node control unit (transistors Tr3, Tr9, Tr9, T10, Tr15, Tr17) for controlling the potential of the first node. The node control unit includes control transistors (transistors Tr9, Tr10) for controlling the potential of the first node via a first conduction terminal. The control transistor has a control terminal to which a first control signal (initialization signal INIT, all-on control signal AON) that is included in a control signal and becomes the off level at least when performing the normal operation is supplied from the outside, and a second conduction terminal to which a second control signal (all-on control signal AON, negative signal AONB) that is included in the control signal and becomes the off level when the first control signal is at the on level is supplied from the outside.

In this manner, by providing the control transistor, it is possible to control the potential of the first node to be the off level when the first control signal is at the on level. Furthermore, it is possible to prevent the charge escape from the first node due to the noise imposed on the potential supplied from the power supply circuit and prevent malfunction of the shift register, by supplying the control signal supplied from the outside to the control terminal and the second conduction terminal of the control transistor.

Furthermore, the first control signal is the all-on control signal which becomes the on level when performing the all-on output, and the second control signal is one of the initialization signal which becomes the on level when performing the initialization, the negative signal of the all-on control signal, and the start signal which becomes the on level when starting shift. Therefore, the potential of the first node can be controlled to be the off level when performing the all-on output.

Furthermore, the first control signal is the initialization signal which becomes the on level when performing the initialization, the second control signal is one of the all-on control signal which becomes the on level when performing the all-on output, the start signal which becomes the on level when starting shift, and the negative signal of the initialization signal. Therefore, the potential of the first node can be controlled to be the off level when performing the initialization.

Furthermore, the node control unit includes a first transistor (transistor Tr3) for controlling the potential of the first node to be the on level in accordance with the input signal of the unit circuit, and a second transistor (transistor Tr17) for controlling the potential of the first node to be the off level in accordance with a second clock signal. Therefore, based on the input signal and the second clock signal, a state of the unit circuit can be switched between a state in which the potential of the first node is at the on level and a state in which the potential of the first node is at the off level.

Furthermore, the unit circuit includes the transistor Tr12 for controlling the potential of the output terminal to be the on level in accordance with the all-on control signal, and the transistor Tr16 for controlling the potential of the output terminal to be the off level in accordance with the initialization signal which becomes the on level when performing the initialization. The node control unit includes the transistor Tr15 for supplying the input signal to a first conduction terminal of the first transistor (drain terminal of transistor Tr3) in accordance with the negative signal of the all-on control output. Therefore, it is possible to control the potential of the output terminal to be the off level when performing the initialization, control the potential of the output terminal to be the on level when performing the all-on control, and supply the input signal to the first conduction terminal of the first transistor when performing the normal operation.

As for the shift register according to the present embodiment, a following variant can be configured. In a unit circuit of a shift register according to the variant, the node control unit nay include a transistor having a conduction terminal connected to the gate terminal of the transistor Tr1, a conduction terminal connected to the source terminal of the transistor Tr3 and the drain terminals of the transistors Tr9, Tr10, Tr17, and a control terminal (gate terminal) to which the high level potential VDD is fixedly applied. With this, it is possible to prevent a high voltage from being applied between terminals of the transistors Tr3, Tr9, Tr10, Tr17.

Eighth Embodiment

In an eighth embodiment, shift registers for outputting a plurality of output signals from one unit circuit will be described. As with the shift register 10 according to the first embodiment, the shift register according to the present embodiment performs the initialization when the initialization signal INIT is at the high level, performs the normal operation when the initialization signal INIT and the all-on control signal AON are at the low level, and performs the all-on output when the all-on control signal AON is at the high level.

Figure 23:
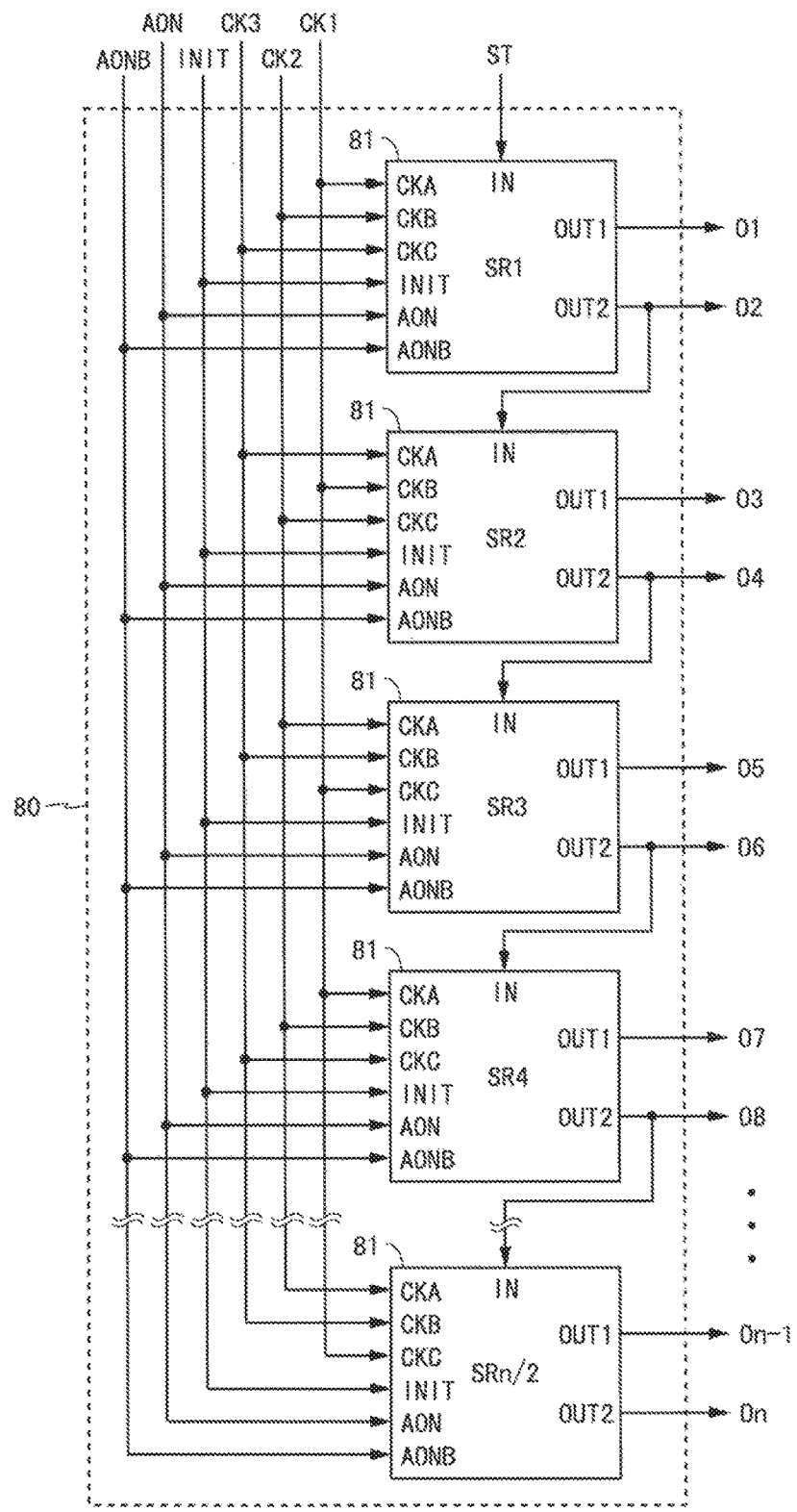
FIG. 23 is a block diagram showing a configuration of a shift register according to a first example of an eighth embodiment of the present invention.

FIG. 23 is a block diagram showing a configuration of a shift register according to a first example of the present embodiment. A shift register 80 shown in FIG. 23 has a configuration which (n/2) unit circuits 81 are connected in multi-stage. The unit circuit 81 has the input terminal IN, clock terminals CKA, CKB, CKC, the initialization terminal INIT, the all-on control terminals AON, AONB, and output terminals OUT1, OUT2. The start signal ST, three-phase clock signals CK1 to CK3, the initialization signal INIT, the all-on control signal AON, and the negative signal AONB are supplied to the shift register 80 from the outside. The shift register 80 operates based on the three-phase clock signals and outputs two output signals from one unit circuit.

The start signal ST is supplied to the input terminal IN of the unit circuit 81 in the first stage. The initialization signal INIT, the all-on control signal AON, and the negative signal AONB are supplied to the (n/2) unit circuits 81 in the same manner as in the shift register 10 according to the first embodiment. When k is an integer not less than 1 and not more than n/3, the clock signal CK1 is supplied to the clock terminal CKA of the unit circuit 81 in a (3k-2)-th stage, the clock terminal CKB of the unit circuit 81 in a (3k-1)-th stage, and the clock terminal CKC of the unit circuit 81 in a 3k-th stage. The clock signal CK2 is supplied to the clock terminal CKB of the unit circuit 81 in the (3k-2)-th stage, the clock terminal CKC of the unit circuit 81 in the (3k-1)-th stage, and the clock terminal CKA of the unit circuit 81 in the 3k-th stage. The clock signal CK3 is supplied to the clock terminal CKC of the unit circuit 81 in the (3k-2)-th stage, the clock terminal CKA of the unit circuit 81 in the (3k-1)-th stage, and the clock terminal CKB of the unit circuit 81 in the 3k-th stage. Output signals OUT1, OUT2 of the unit circuit 81 are output to the outside as the output signals O1 to On. The output signal OUT2 is supplied to the input terminal IN of the unit circuit 81 in the next stage.

Figure 24:
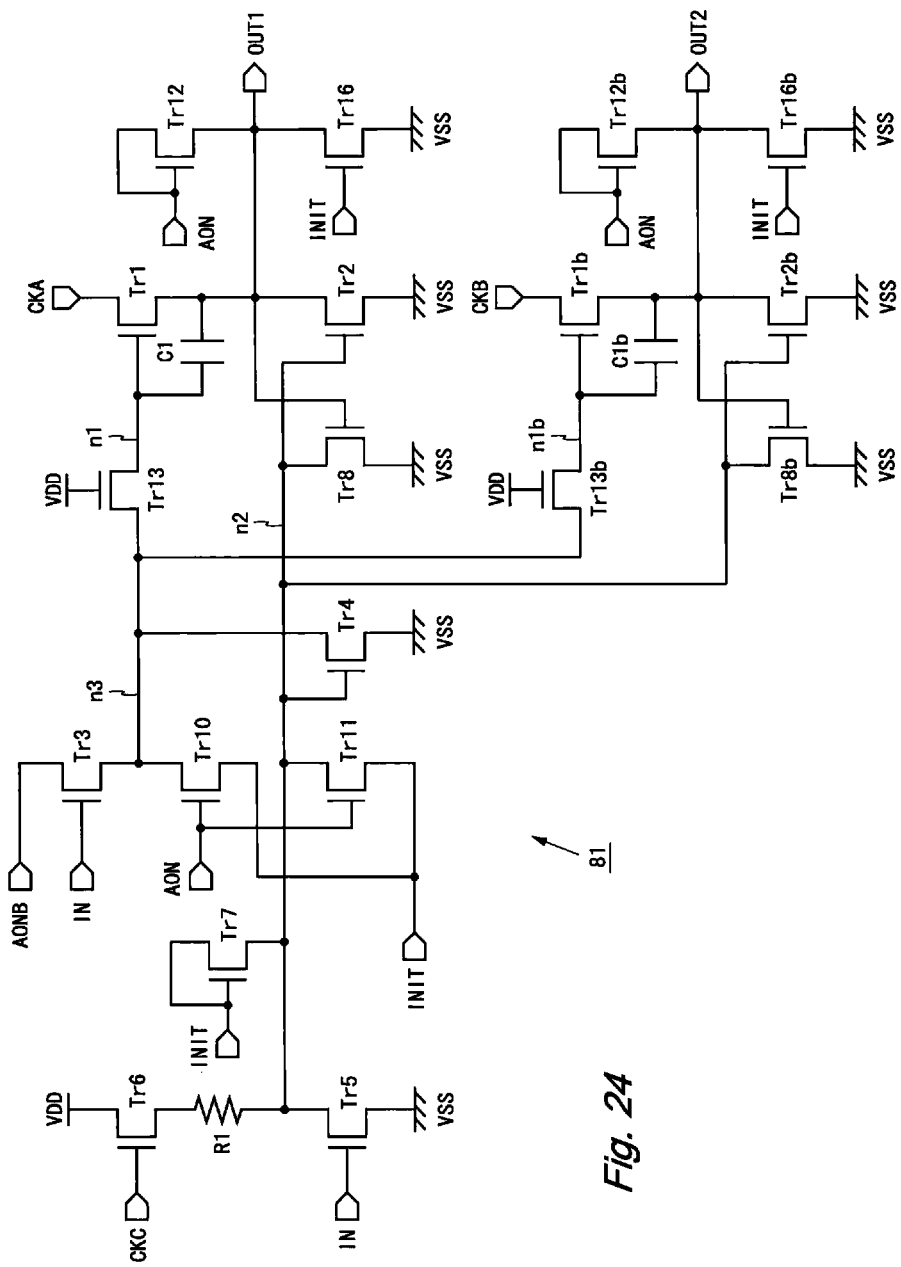
FIG. 24 is a circuit diagram of a unit circuit of the shift register shown in FIG. 23.

FIG. 24 is a circuit diagram of the unit circuit 81. The unit circuit 81 shown in FIG. 24 is obtained based on the unit circuit 13 (FIG. 6) by renaming the output terminal OUT to the output terminal OUT1, adding transistors Tr16, Tr1b, Tr2b, Tr8b, Tr12b, Tr13b, Tr16b and a capacitor C1b, and changing a connection point of the gate terminal of the transistor Tr6 to the clock terminal CKC. The drain terminal of the transistor Tr16 is connected to the output terminal OUT1 and the like, the low level potential VSS is applied to the source terminal of the transistor Tr16, and the gate terminal of the transistor Tr16 is connected to the initialization terminal INIT. The transistors Tr1b, Tr2b, Tr8b, Tr12b, Tr13b, Tr16b and the capacitor C1b cab are connected in a same manner as the transistors Tr1, Tr2, Tr8, Tr12, Tr13, Tr16 and the capacitor C1. However, a drain terminal of the transistor Tr1b is connected to the clock terminal CKB.

Figure 25:
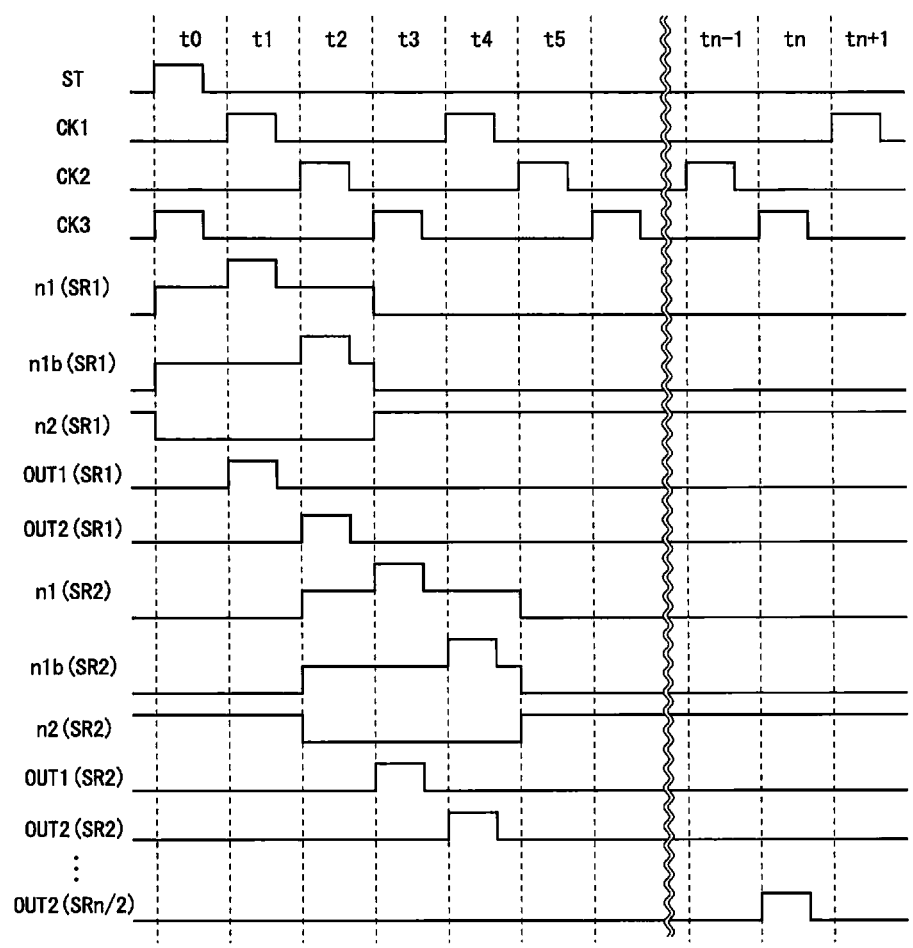
FIG. 25 is a timing chart of the shift register shown in FIG. 23.

FIG. 25 is a timing chart of the shift register 80 when performing the normal operation. As shown in FIG. 25, when performing the normal operation, the clock signal CK1 becomes the high level and the low level in a predetermined cycle. The high level period of the clock signal CK1 is shorter than ⅓ cycle. The clock signal CK2 is a signal obtained by delaying the clock signal CK1 by ⅓ cycle, and the clock signal CK3 is a signal obtained by delaying the clock signal CK1 by ⅔ cycle. The start signal ST becomes the high level in a high level period of the clock signal CK3 in a period t0.

When performing the normal operation, since the initialization signal INIT and the all-on control signal AON are at the low level, the transistors Tr7, Tr10 to Tr12, Tr16, Tr12b, Tr16b turn off. Thus, these transistors do not affect the normal operation of the shift register 80. The negative signal AONB having the high level is supplied to the drain terminal of the transistor Tr3.

The normal operation of the unit circuit SR2 in the first stage will be described below. In periods t0, t1, the unit circuit SR1 operates in a manner similar to the unit circuit 11 in the first stage of the shift register 10 according to the first embodiment. In the period t0, the input signal IN (start signal ST) of the unit circuit SR1 changes to the high level. Thus, potentials of the nodes n1, n1b, n3 become (VDD−Vth), the potential of the node n2 becomes a potential close to the low level potential VSS, and the transistors Tr1, Tr1b turn on. In the period t0, since the clock signals CKA, CKB (clock signals CK1, CK2) the unit circuit SR1 are at the low level, the output signals OUT1, OUT2 remain at the low level. In a latter part of the period t0, the input signal IN changes to the low level. After that, the nodes n1, n1b, n3 keep the high level potential in the floating state.

In the period t1, the clock signal CKA of the unit circuit SR1 changes to the high level. At this time, the potential of the node n1 becomes higher than (VDD−Vth) by the bootstrap operation, and the potential of the output terminal OUT1 becomes equal to the high level potential VDD of the clock signal CKA. In a latter part of the period t1, the clock signal CKA changes to the low level. Thus, the output signal OUT1 becomes the low level and the potential of the node n1 returns to (VDD−Vth).

In a period t2, the clock signal CKB of the unit circuit SR1 changes to the high level. At this time, the potential of the node n1b becomes higher than (VDD−Vth) by the bootstrap operation, and the potential of the output terminal OUT2 becomes equal to the high level potential VDD of the clock signal CKB. In a latter part of the period t2, the clock signal CKB changes to the low level. Thus, the output signal OUT2 becomes the low level and the potential of the node n1b returns to (VDD−Vth).

In a period t3, the clock signal CKC (clock signal CK3) of the unit circuit SR1 changes to the high level. Thus, the potential of the node n2 becomes the high level, the potentials of the nodes n1, n1b, n3 become the low level, the transistors Tr1, Tr1b turn off, and the transistors Tr2, Tr2b turn on. The output signals OUT1, OUT2 are fixed to the low level in a latter part of the period t3, the clock signal CKC changes to the low level. After that, the node n2 keeps the high level potential in the floating state.

The output signal OUT1 of the unit circuit SR1 becomes the high level (potential is VDD) in the high level period of the clock signal CK1 in the period t1. The output signal OUT2 of the unit circuit SR1 becomes the high level (potential is VDD) in the high level period of the clock signal CK2 the period t2. In this manner, the unit circuit SR1 sequentially sets the two output signals OUT1, OUT2 to the high level, with delaying by ⅓ cycle of the clock signal CK1. The unit circuits SR2 to SRn/2 in the second and subsequent stages operate similarly, with delaying by ⅔ cycle of the clock signal CK1 from the unit circuit 81 in the previous stage. Therefore, the output signals O1 to On of the shift register 80 sequentially become the high level in a time having the same length as the high level period of the clock signal CK1, with delaying by ⅓ cycle of the clock signal CK1.

The shift register 80 operates in a manner similar to the shift register 10 according to the first embodiment when performing the initialization or the all-on output. Note that the transistors Tr16, Tr16b are provided in order to immediately set the output signals OUT1, OUT2 to the low level when the initialization signal INIT changes to the high level.

Even in a unit circuit not including the transistors Tr16, Tr16, when the initialization signal INIT changes to the high level, the output signals OUT1, OUT2 become the low level eventually, although it takes some time. If the output signals OUT1, OUT2 are at the high level before performing the initialization, the transistors Tr8, Tr8b are in the on state. Thus, when the initialization signal INIT changes to the high level, since the high level potential is applied to the node n2 via the transistor Tr7 and the low level potential is applied to the node n2 via the transistors Tr8, Tr8b, the potential of the node n2 becomes an intermediate potential. Thus, the transistors Tr2, Tr2b approach the on state slightly, the potentials of the output terminals OUT1, OUT2 approach the low level slightly, and the transistors Tr8, Tr8b approach the off state slightly. By repeating the above operations, eventually, the transistors Tr8, Tr8b turn off, the potential of the node n2 becomes the high level, and the output signals OUT1, OUT2 become the low level.

Figure 26:
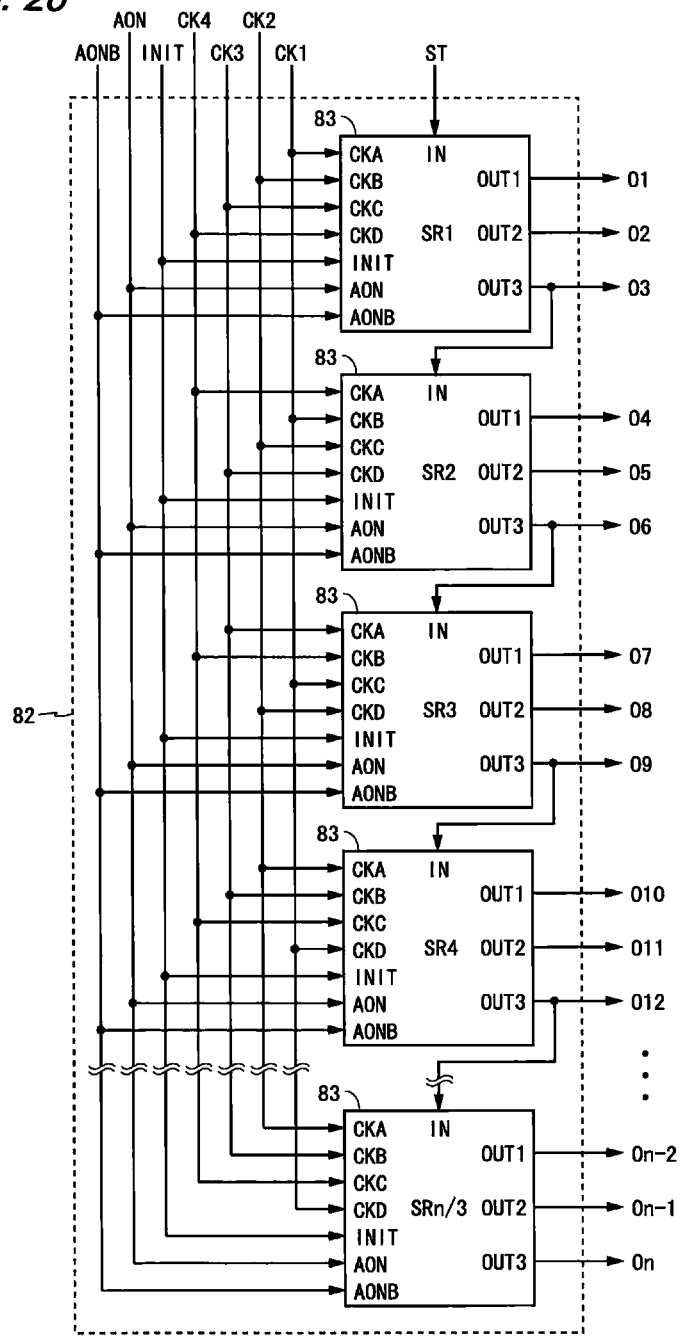
FIG. 26 is a block diagram showing a configuration of a shift register according to a second example of the eighth embodiment.

FIG. 26 is a block diagram showing a configuration of a shift register according to a second example of the present embodiment. A shift register 82 shown in FIG. 26 has a configuration in which (n/3) unit circuits 83 are connected in multi-stage. The unit circuit 83 has the input terminal IN, clock terminals CKA, CKB, CKC, CKD, the initialization terminal INIT, the all-on control terminals AON, AONB, and output terminals OUT1 to OUT3. The start signal ST, four-phase clock signals CK1 to CK4, the initialization signal INIT, the all-on control signal AON, and the negative signal AONB are supplied to the shift register 82 from the outside. The shift register 82 operates based on the four-phase clock signals and outputs three output signals from one unit circuit.

The start signal ST is supplied to the input terminal IN of the unit circuit 83 in the first stage. The initialization signal INIT, the all-on control signal AON, and the negative signal AONB are supplied to the (n/3) unit circuits 83 in the same manner as in the shift register 10 according to the first embodiment. When k is an integer not less than 1 and not more than n/4, the clock signal CK1 is supplied to the clock terminal CKA of the unit circuit 83 in a (4k-3)-th stage, the clock terminal CKB of the unit circuit 83 in a (4k-2)-th stage, the clock terminal CKC of the unit circuit 83 in a (4k-1)-th stage, and the clock terminal CKD of the unit circuit 83 in a 4k-th stage. The clock signal CK2 is supplied to the clock terminal CKB of the unit circuit 83 in the (4k-3)-th stage, the clock terminal CKC of the unit circuit 83 in the (4k-2)-th stage, the clock terminal CKD of the unit circuit 83 in the (4k-1)-th stage, and the clock terminal CKA of the unit circuit 83 in the 4k-th stage. The clock signal CK3 is supplied to the clock terminal CKC of the unfit circuit 83 in the (4k-3)-th stage, the clock terminal CKD of the unit circuit 83 in the (4k-2)-th stage, the clock terminal CKA of the unit circuit 83 in the (4k-1)-th stage, and the clock terminal CKB of the unit circuit 83 in the 4k-th stage. The clock signal CK4 is supplied to the clock terminal CKD of the unit circuit 83 in the (4k-3)-th stage, the clock terminal CKA of the unit circuit 83 in the (4k-2)-th stage, the clock terminal CKB of the unit circuit 83 in the (4k-1)-th stage, and the clock terminal CKC of the unit circuit 83 in the 4k-th stage. Output signals OUT1 to OUT3 of the unit circuit 83 are output to the outside as the output signals O1 to On. The output signal OUT3 is supplied to the input terminal IN of the unit circuit 83 in the next stage.

Figure 27:
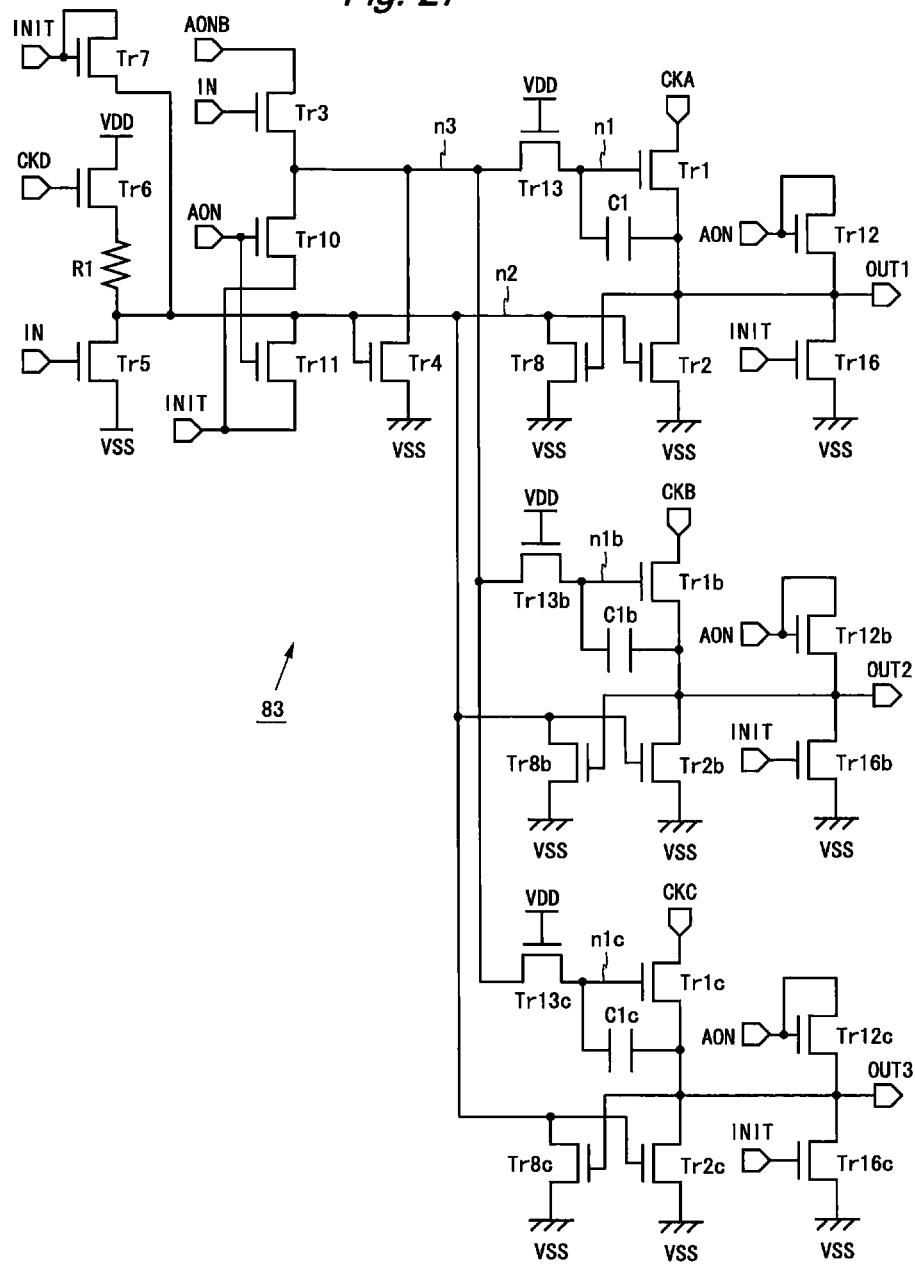
FIG. 27 is a circuit diagram of a unit circuit of the shift register shown in FIG. 26.

FIG. 27 is a circuit diagram of the unit circuit 83. The unit circuit 83 shown in FIG. 27 is obtained based on the unit circuit 81 by adding transistors Tr1c, Tr2c, Tr8c, Tr12c, Tr13c, Tr16c and a capacitor C1c, and changing a connection point of the gate terminal of the transistor Tr6 to the clock terminal CKD. The transistors Tr1c, Tr2c, Tr8c, Tr12c, Tr13c, Tr16c and the capacitor C1c are connected in the same manner as the transistors Tr1, Tr2, Tr8, Tr12, Tr13, Tr16 and the capacitor C1. However, a drain terminal of the transistor Tr1c is connected to the clock terminal CKC.

Figure 28:
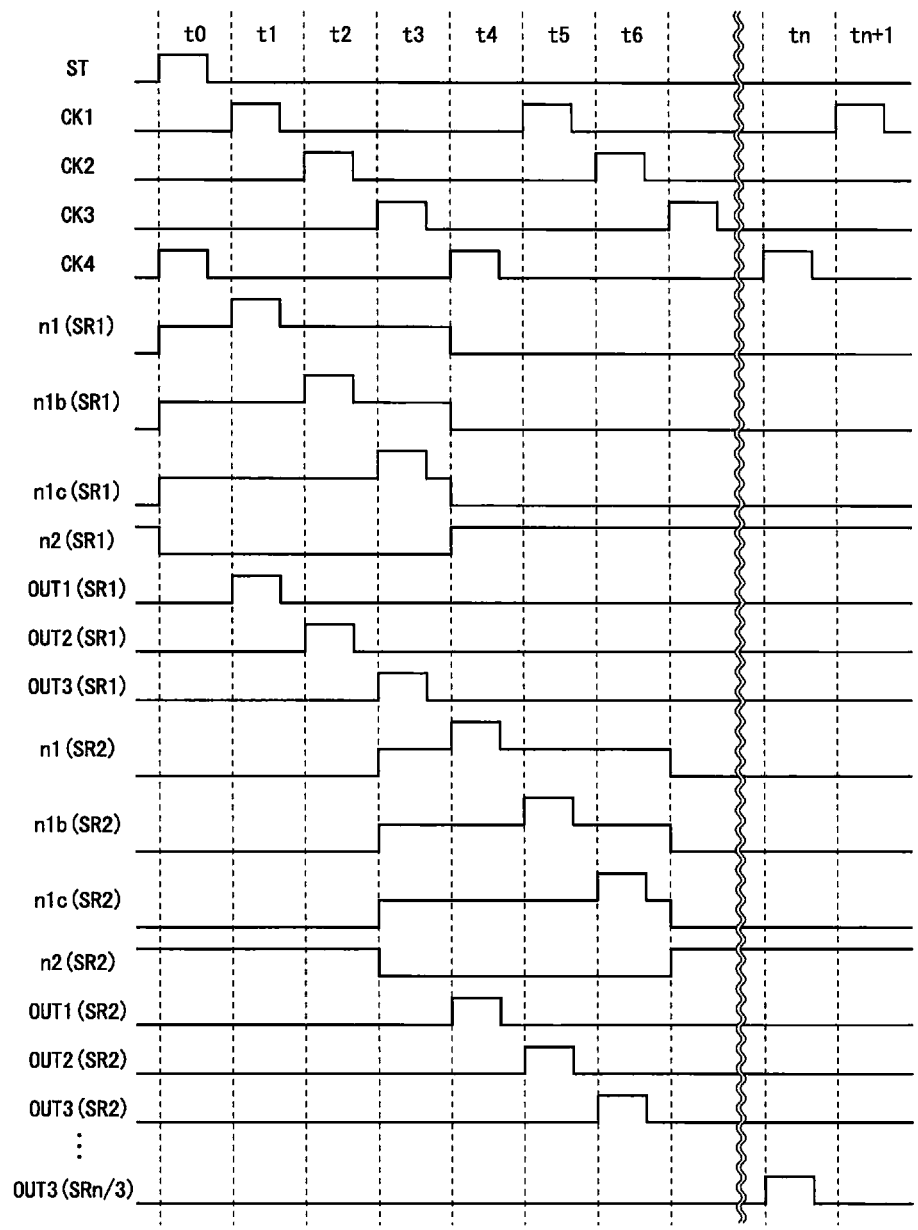
FIG. 28 is a timing chart of the shift register shown in FIG. 26.

FIG. 28 is a timing chart of the shift register 82 when performing the normal operation. As shown in FIG. 28, when performing the normal operation, the clock signal CK1 becomes the high level and the low level in a predetermined cycle. The high level period of the clock signal CK1 is shorter than ¼ cycle. The clock signal CK2 is a signal obtained by delaying the clock signal CK1 by ¼ cycle, the clock signal CK3 is a signal obtained by delaying the clock signal CK1 by ½ cycle, and the clock signal CK4 is a signal obtained by delaying the clock signal CK1 by ¾ cycle. The start signal ST becomes the high level in a high level period of the clock signal CK4 in a period t0.

When performing the normal operation, since the initialization signal INIT and the all-on control signal AON are at the low level, the transistors Tr7, Tr10 to Tr12, Tr16, Tr12b, Tr16b, Tr12c, Tr16c turn off. Thus, these transistors do not affect the normal operation of the shift register 82. The negative signal AONB having the high level is supplied to the drain terminal of the transistor Tr3.

The shift register 82 operates in a manner similar to the shift register 80, when performing the normal operation. The output signal OUT1 of the unit circuit SR1 becomes the high level (potential is VDD) in the high level period of the clock signal CK1 in a period t1. The output signal OUT2 of the unit circuit SR1 becomes the high level (potential is VDD) in the high level period of the clock signal CK2 in a period t2. The output signal OUT3 of the unit circuit SR1 becomes the high level (potential is VDD) in the high level period of the clock signal CK3 in a period t3. In this manner, the unit circuit SR1 in the first stage sequentially sets the three output signals OUT1 to OUT3 to the high level, with delaying by ¼ cycle of the clock signal CK1. The unit circuits SR2 to SRn/3 in the second and subsequent stages operate similarly, with delaying by ¾ cycle of the clock signal CK1 from the unit circuit 83 in the previous stage. Therefore, the output signals O1 to On of the shift register 82 sequentially become the high level in a time having the same length as the high level period of the clock signal CK1, with delaying by ¼ cycle of the clock signal CK1. The shift register 82 operates in a manner similar to the shift register 10 according to the first embodiment when performing the initialization or the all-on output.

Figure 29:
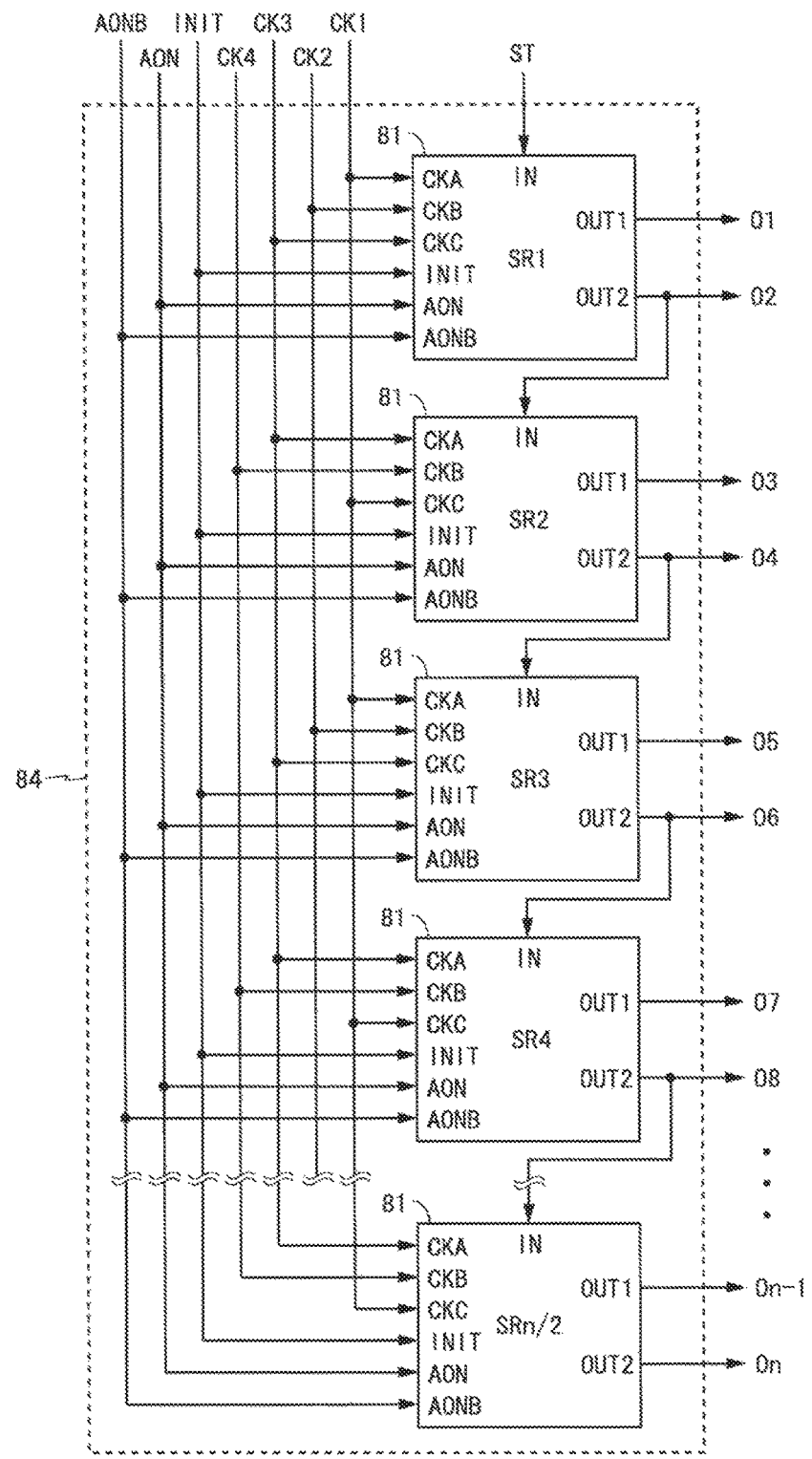
FIG. 29 is a block diagram showing a configuration of a shift register according to a third example of the eighth embodiment.

FIG. 29 is a block diagram showing a configuration of a shift register according to a third example of the present embodiment. A shift register 84 shown in FIG. 29 has a configuration in which (n/2) pieces of the unit circuits 81 are connected in multi-stage. The start signal ST, the four-phase clock signals CK1 to CK4, the initialization signal INIT, the all-on control signal AON, and the negative signal AONB are supplied to the shift register 84 from the outside. The shift register 84 operates based on the four-phase clock signals and outputs two output signals from one unit circuit.

The start signal ST is supplied to the input terminal IN of the unit circuit 81 in the first stage. The initialization signal INIT, the all-on control signal AON, and the negative signal AONB are supplied to the (n/2) unit circuits 81 in the same manner as in the shift register 10 according to the first embodiment. The clock signal CK1 is supplied to the clock terminal CKA of the unit circuit 81 in the odd-numbered stage and the clock terminal CKC of the unit circuit 81 in the even-numbered stage. The clock signal CK2 is supplied to the clock terminal CKB of the unit circuit 81 in the odd-numbered stage. The clock signal CK3 is supplied to the clock terminal CKC of the unit circuit 81 in the odd-numbered stage and the clock terminal CKA of the unit circuit 81 in the even-numbered stage. The clock signal CK4 is supplied to the clock terminal CKB of the unit circuit 81 in the even-numbered stage. The output signals OUT1, OUT2 of the unit circuit 81 are output to the outside as the output signals O1 to On. The output signal OUT2 is supplied to the input terminal IN of the unit circuit 81 in the next stage.

Figure 30:
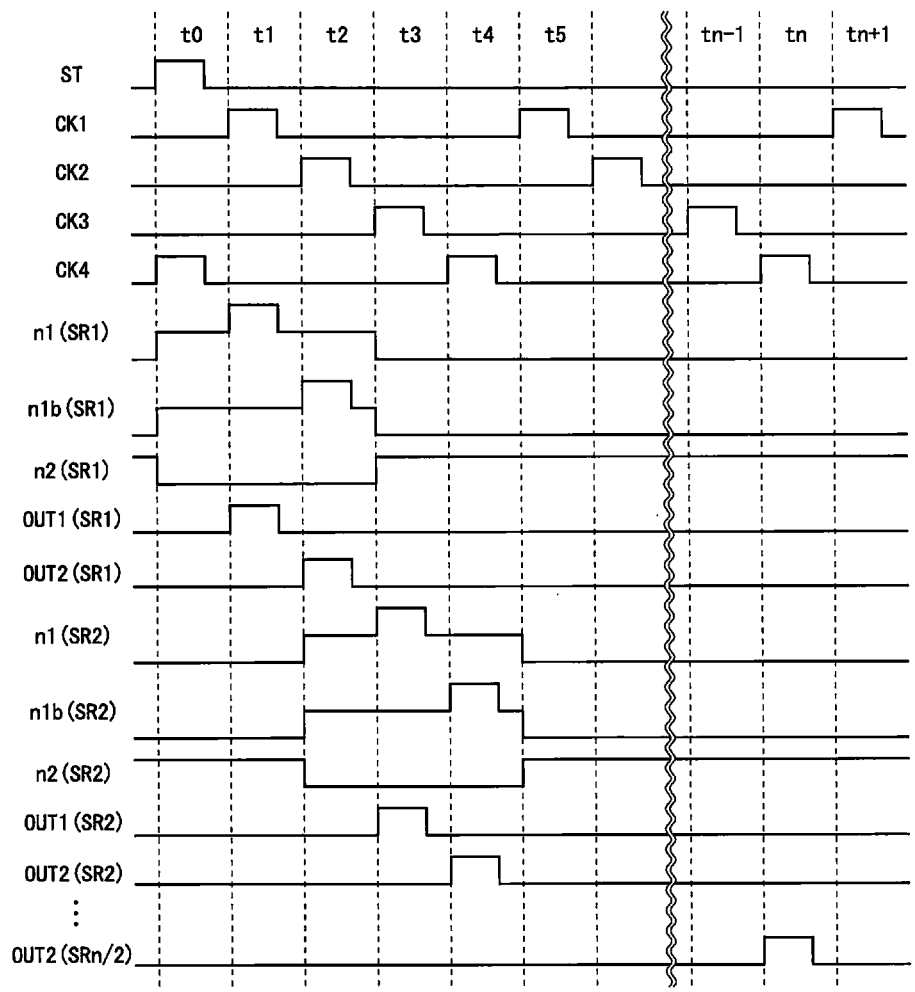
FIG. 30 is a timing chart of the shift register shown in FIG. 29.

FIG. 30 is a timing chart of the shift register 84 when performing the normal operation. As shown in FIG. 30, the start signal ST and the clock signals CK1 to CK4 change in a manner similar to those in the shift register 82. The shift register 84 operates in a manner similar to the shift registers 80, 82 when performing the normal operation. The output signal OUT1 of the unit circuit SR1 becomes the high level (potential is VDD) in the high level period of: the clock signal CK1 in a period t1. The output signal OUT2 of the unit circuit SR1 becomes the high level (potential is VDD) in the high level period of the clock signal CK2 in a period t2. In this manner, the unit circuit SR1 in the first stage sequentially sets the two output signals OUT1, OUT2 to the high level, with delaying by ¼ cycle of the clock signal CK1. The unit circuits SR2 to SRn/2 in the second and subsequent stages operate similarly, with delaying by ½ cycle of the clock signal CK1 from the unit circuit 81 in the previous stage. Therefore, the output signals O1 to On of the shift register 84 sequentially become the high level in a time having the same length as the high level period of the clock signal CK1, with delaying by ¼ cycle of the clock signal CK1. The shift register 84 operates in a manner similar to the shift register 10 according to the first embodiment when performing the initialization or the all-on output.

Figure 31:
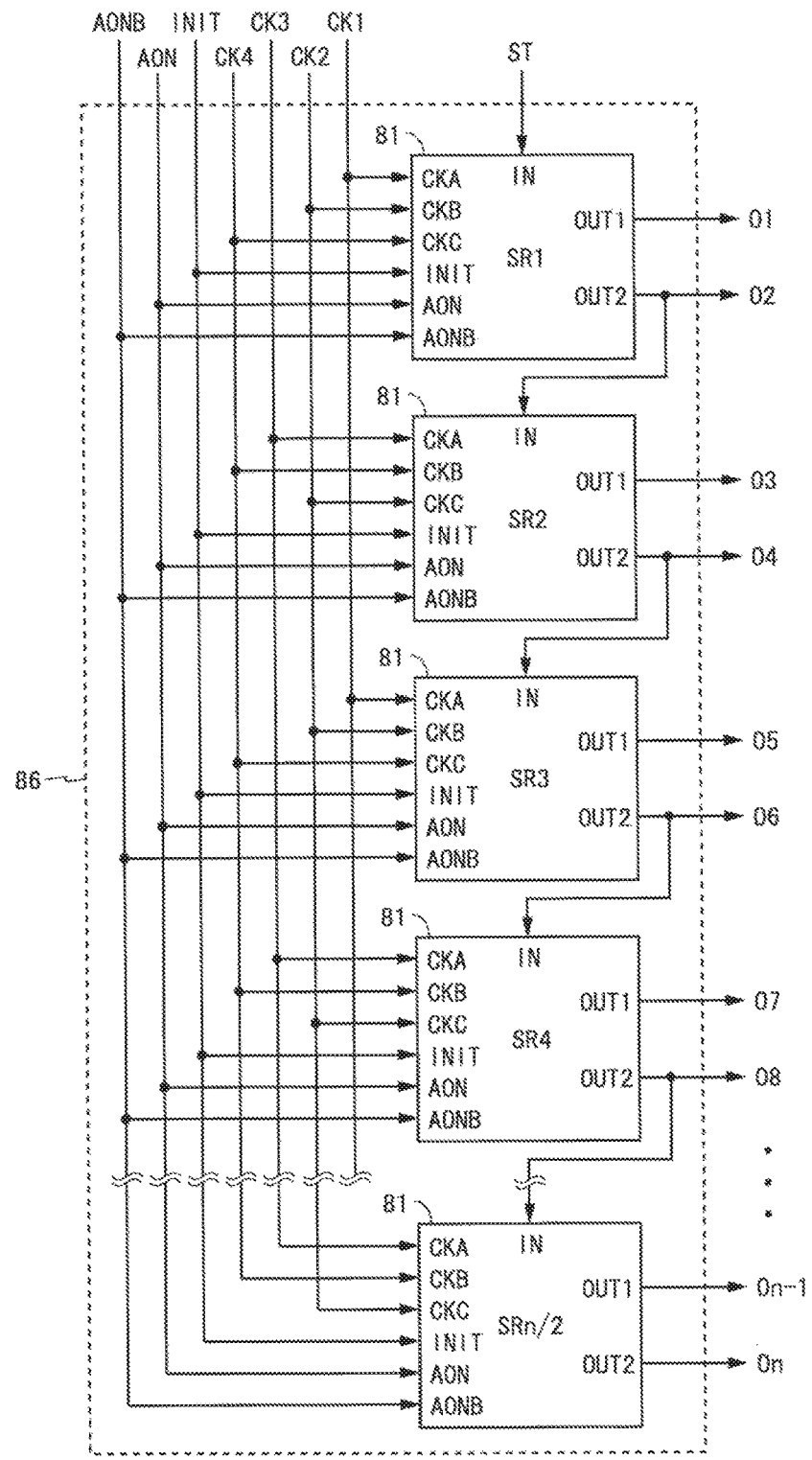
FIG. 31 is a block diagram showing a configuration of a shift register according to a fourth example of the eighth embodiment.

FIG. 31 is a block diagram showing a configuration of a shift register according to a fourth example of the present embodiment. A shift register 86 shown in FIG. 31 has a configuration in which (n/2) pieces of the unit circuits 81 are connected in multi-stage. The start signal ST, the four-phase clock signals CK1 to CK4, the initialization signal INIT, the all-on control signal AON, and the negative signal AONB are supplied to the shift register 86 from the outside. The shift register 86 operates based on the four-phase clock signals and outputs two output signals from one unit circuit.

The start signal ST is supplied to the input terminal IN of the unit circuit 81 in the first stage. The initialization signal INIT, the all-on control signal AON, and the negative signal AONB are supplied to the (n/2) unit circuits 81 in the same manner as in the shift register 10 according to the first embodiment. The clock signal CK1 is supplied to the clock terminal CKA of the unit circuit 81 in the odd-numbered stage. The clock signal CK2 is supplied to the clock terminal CKB of the unit circuit 81 in the odd-numbered stage and the clock terminal CKC of the unit circuit 81 in the even-numbered stage. The clock signal CK3 is supplied to the clock terminal CKA of the unit circuit 81 in the even-numbered stage. The clock signal CK4 is supplied to the clock terminal CKC of the unit circuit 81 in the odd-numbered stage and the clock terminal CKB of the unit circuit 81 in the even-numbered stage. The output signals OUT1, OUT2 of the unit circuit 81 are output to the outside as toe output signals O1 to On. The output signal OUT2 is supplied to the input terminal IN of the unit circuit 81 in the next stage.

Figure 32:
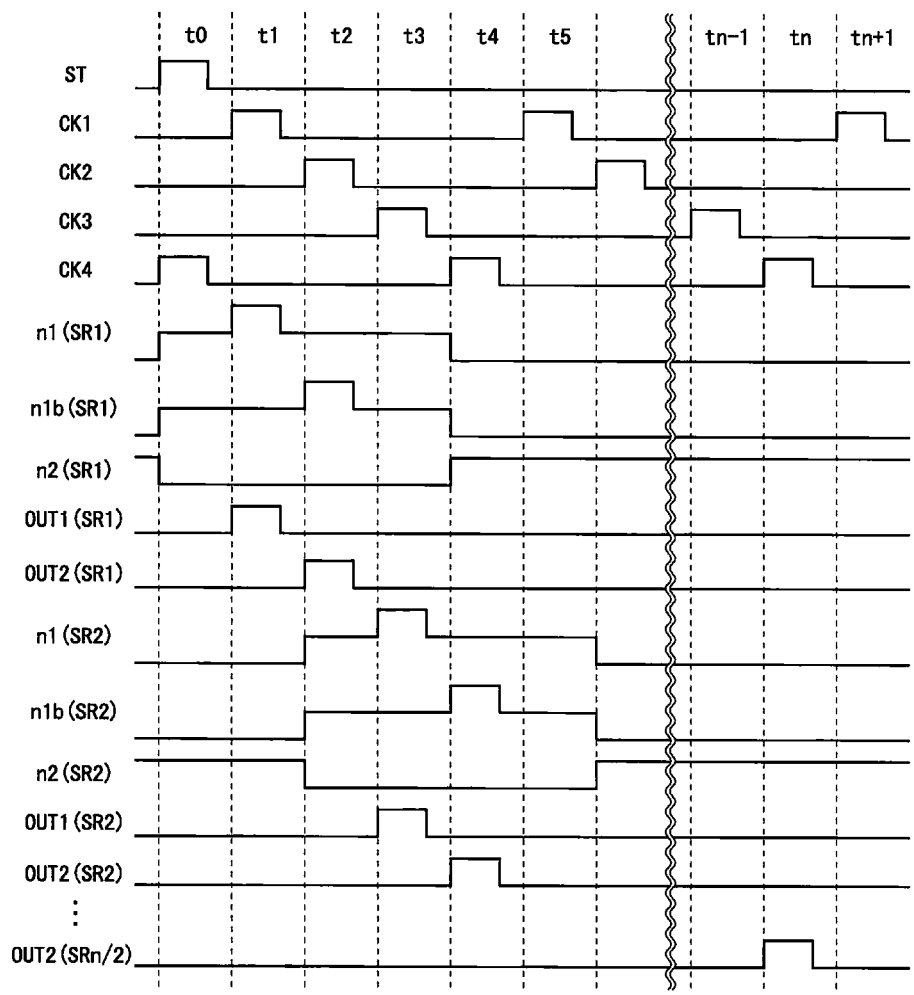
FIG. 32 is a timing chart of the shift register shown in FIG. 31.

FIG. 32 is a timing chart of the shift register 86 when performing the normal operation. As shown in FIG. 32, the start signal ST and the clock signals CK1 to CK4 change in a manner similar to those in the shift registers 82, 84. The shift register 86 operates in a manner similar to the shift registers 80, 82, 84 when performing the normal operation. The output signal OUT1 of the unit circuit SR1 becomes the high level (potential is VDD) in the high level period of the clock signal CK1 in a period t1. The output signal OUT2 of the unit circuit SR1 becomes the high level (potential is VDD) in the high level period of the clock signal CK2 in a period t2. In this manner, the unit circuit SR1 in the first stage sequentially sets the two output signals OUT1, OUT2 to the high level, with delaying by ¼ cycle of the clock signal CK1. The unit circuits SR2 to SRn/2 in the second and subsequent stages operate similarly, with delaying by ½ cycle of the clock signal CK1 from the unit circuit 81 in the previous stage. Therefore, the output signals O1 to On of the shift register 86 sequentially become the high level in a time having the same length as the high level period of the clock signal CK1, with delaying by ¼ cycle of the clock signal CK1. Note that in the shift register 86, compared with the shift register 84, a period in which the potential of the nodes n1, node 1b are at the high level and the potential of the node n2 is at the low level is longer by ¼ cycle of the clock signal CK1. The shift register 86 operates in a manner similar to the shift register 10 according to the first embodiment when performing the initialization or the all-on output.

In the shift register for outputting a plurality of output signals from one unit circuit, a first retention period (period in which the nodes n1, n3 and the like keep the high level potential in the floating state) is long. For example, FIG. 28, periods t0 to t3 are the first retention period of the unit circuit 83 in the first stage. Thus, the shift register which does have countermeasure against noise may malfunction due to the charge escape from the nodes n1, n3 in the first retention period.

In contrast, in the shift registers 80, 82, 84, 86 according to the present embodiment, the initialization signal INIT is supplied to the source terminals of the transistors Tr10, Tr11. Since the initialization signal INIT is supplied from a circuit other than the power supply circuit, no noise is imposed on the initialization signal INIT. Thus, even if noise is imposed on the low level potential VSS supplied from the power supply circuit in the first retention period, the transistor Tr10 keeps the off state stably. Therefore, according to the shift registers 80, 82, 84, 86 according to the present embodiment, it is possible to prevent the charge escape from the nodes n1, n3 in the first retention period and prevent malfunction.

As described above, in the shift registers 80, 82, 84, 86 according to the present embodiment, each of the unit circuits 81, 83 includes a plurality of output transistors and a plurality of output reset transistors (transistors Tr1, Tr2) Therefore, circuit amount of the shift register can be reduced by outputting a plurality of signals from one unit circuit.

As for the shift registers 80, 82, 84, 86 according to the present embodiment, following variants can be configured. In the unit circuit of the shift register according to a variant, the source terminals of the transistors Tr10, Tr11 may be connected to the all-on control terminal AONB or the start terminal ST. Furthermore, another shift register for operating based on five or more phase clock signals and outputting a plurality of output signals from one unit circuit may be configured using a method similar as described above. It is necessary to provide the resistor R1 between the transistor Tr6 and the node n2 to a unit circuit in which the transistors Tr5, Tr6 turn on together, such as the unit circuit 81 of the shift registers 80, 86 or the unit circuit 83 of the shift register 82. In contrast, it is not necessary to provide the resistor R1 to a unit circuit in which the transistors Tr5, Tr6 do not turn on together, such as the unit circuit 81 of the shift register 84.

Ninth Embodiment

Figure 33:
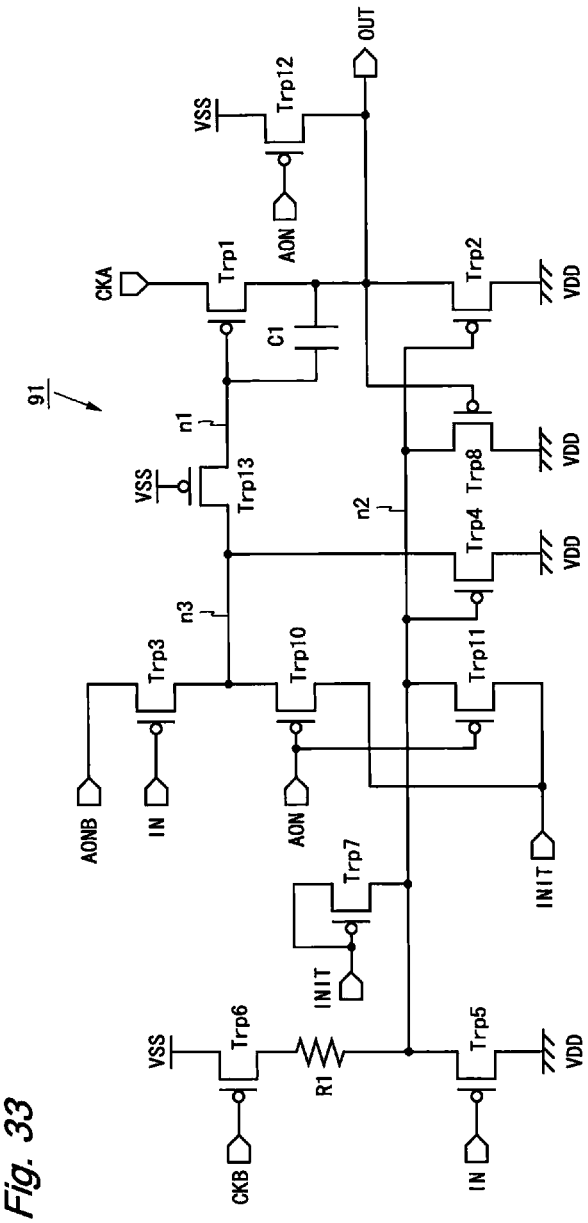
FIG. 33 is a circuit diagram of a unit circuit of a shift register according to a ninth embodiment of the present invention.

A shift register according to a ninth embodiment of the present invention has the configuration shown in FIG. 1. However, the shift register according to the present embodiment includes a unit circuit 91 shown in FIG. 33 in place of the unit circuit 11. The unit circuit 91 is obtained by configuring the unit circuit 11 using P-channel type transistors. The unit circuit 91 includes twelve P-channel type transistors Trp1 to Trp6, Trp10 to Trp13, the capacitor C1, and the resistor R1.

Figure 34:
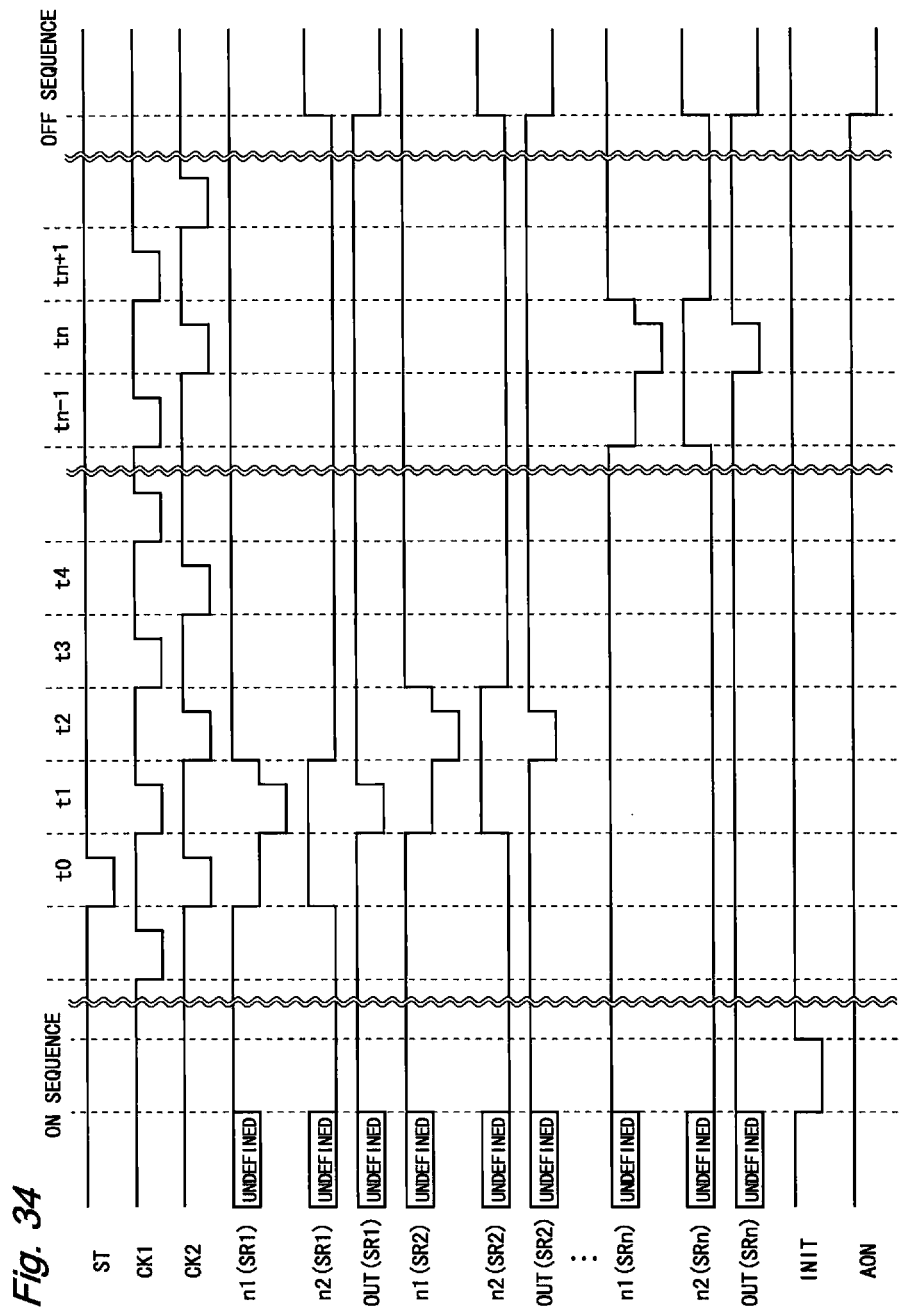
FIG. 34 is a timing chart of the shift register according to the ninth embodiment.

In general, in order to configure, using P-channel type transistors, a circuit configured using N-channel type transistors, the N-channel type transistors are replaced with the P-channel type transistors, a polarity of a power supply is reversed (exchange the high level potential VDD with the low level potential VSS), and polarities of input signals are reversed (exchange high level with low level). FIG. 34 is a timing chart of the shift register according to the present embodiment. The timing chart shown in FIG. 34 is obtained based on the timing chart shown in FIG. 3 by reversing polarities of potentials of signals and nodes.

According to the shift register according to the present embodiment, it is possible to prevent malfunction due to noise imposed on the high level potential VDD supplied from the power supply circuit, with respect to the shift register configured using the P-channel type transistors. Here, as an example, there is described a case in which the unit circuit 11 according to the first embodiment is configured using the P-channel type transistors. A similar method can be applied to the unit circuits according to the second to eighth embodiments.

Tenth Embodiment

Figure 35:
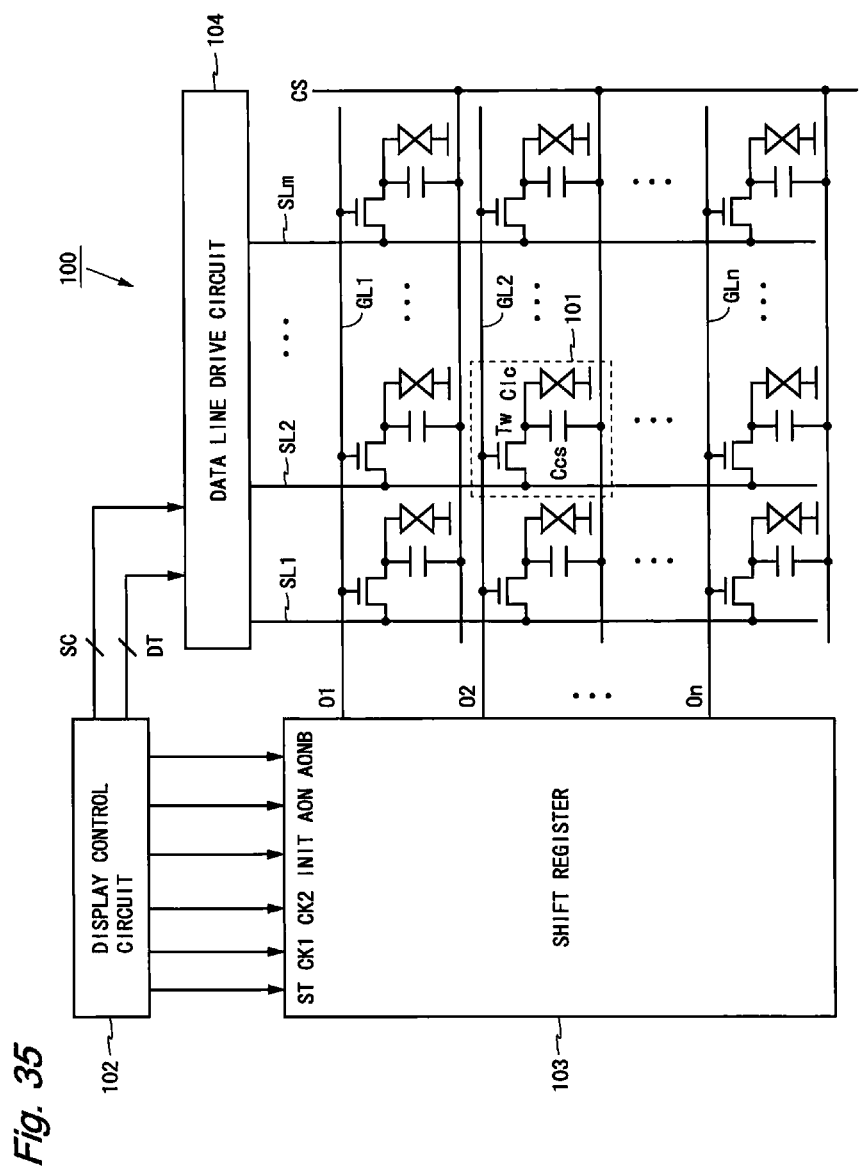
FIG. 35 is a block diagram showing a configuration of a crystal display device according to a tenth embodiment of the present invention.

In a tenth embodiment, examples of display devices including a shift register will be described. FIG. 35 is a block diagram showing a configuration of a liquid crystal display device according to the present embodiment. A liquid crystal display device 100 shown in FIG. 35 includes n scanning lines GL1 to GLn, m (m is an integer not less than 2) data lines SL1 to SLm, (m×n) pixel circuits 101, a display control circuit 102, a shift register 103, and a data line drive circuit 104. The shift register 103 functions as a scanning line drive circuit. One of the shift registers described above is used as the shift register 103. The shift register 10 according to the first embodiment is used in FIG. 35.

The scanning lines GL1 to GLn are arranged in parallel to each other, and the data lines SL1 to SLm are arranged in parallel to each other so as to intersect with the scanning lines GL1 to GLn perpendicularly. The (m×n) pixel circuits 101 are arranged corresponding to intersections of the scanning lines GL1 to GLn and the data lines SL1 to SLm. The pixel circuit 101 includes an N-channel type transistor Tw (write control transistor), a liquid crystal capacitance C1c, and an auxiliary capacitance Ccs. A gate terminal of the transistor Tw is connected to one scanning line, and a source terminal of the transistor Tw is connected to one data line. A drain terminal of the transistor Tw is connected to one ends of the liquid crystal capacitance C1c and the auxiliary capacitance Ccs. The other end of the auxiliary capacitance Ccs is connected to an auxiliary capacitance line CS.

Hereinafter, an arrangement area of the pixel circuits 101 is referred to as display area. The shift register 103 is arranged along one side (left side in FIG. 35) of the display area. The data line drive circuit 104 is arranged along another side (upper side in FIG. 35) of the display area. The display control circuit 102 supplies the start signal ST, the two-phase clock signals CK1, CK2, the initialization signal INIT, the all-on control signal AON, and the negative signal AONB to the shift register 103, and supplies a control signal SC and a data signal DT to the data line drive circuit 104.

The output terminals O1 to On of the shift register 103 are connected to one ends (left ends in FIG. 35) of the scanning lines GL1 to G1n, respectively. The shift register 103 selectively performs the initialization, the normal operation, and the all-on output in accordance with the initialization signal INIT, the all-on control signal AON, and the negative signal AONB. When performing the normal operation, the shift register 103 drives the scanning lines GL1 to GLn based on the start signal ST and the two-phase clock signals CK1, CK2. The data line drive circuit 104 drives the data lines SL1 to SLm based on the control signal SC and the data signal DT.

The output signals O1 to On of the shift register 103 sequentially become the high level one by one. A power supply circuit supplies the high level potential VDD to one of the scanning lines GL1 to GLn and supplies the low level potential VSS to the remaining (n−1) scanning lines. The scanning lines GL1 to GLn and the data lines SL1 to SLm intersect in the display area, and potentials of the data lines SL1 to SLm are changed in accordance with the data signal DT (in accordance with display image) Thus, noise is likely imposed on the low level potential VSS supplied from the power supply circuit. According to the shift register 103, it is possible to prevent malfunction due to the noise imposed on the low level potential VSS supplied from the power supply circuit. Therefore, it is possible to make the liquid crystal display device 100 more reliable using the shift register 103.

Figure 36:
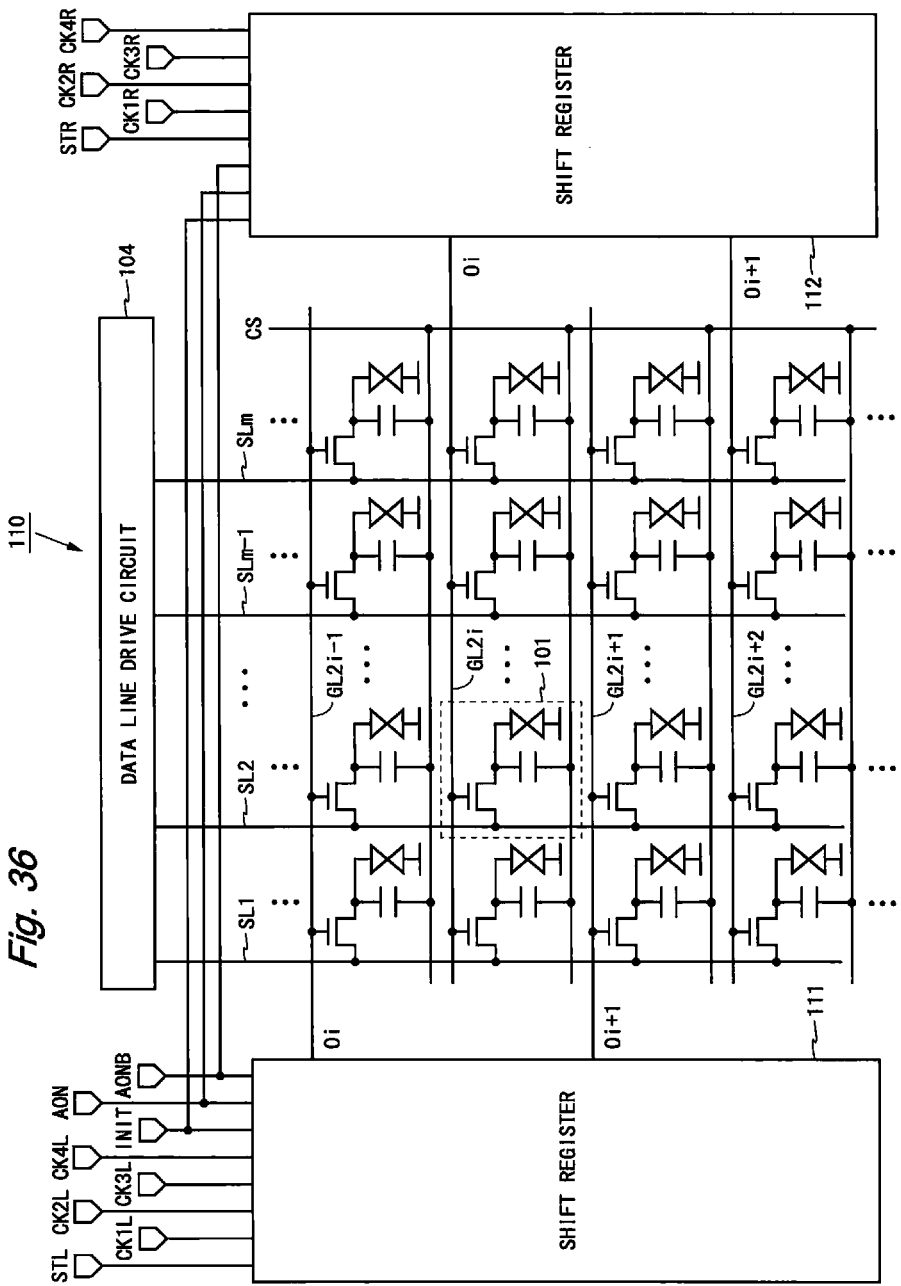
FIG. 36 is a block diagram showing another configuration of the liquid crystal display device according to the tenth embodiment.

FIG. 36 is a block diagram showing another configuration of the liquid crystal display device according to the present embodiment. A liquid crystal display device 110 shown in FIG. 36 includes 2n scanning lines GL1 to GL2n, the m data lines SL1 to SLm, (m×2n) pieces of the pixel circuits 101, a display control circuit (not shown), shift registers 111, 112, and the data line drive circuit 104. The scanning lines GL1 to GL2n, the data lines SL1 to SLm, the (m×2n) pixel circuits 101, and the data line drive circuit 104 are arranged in a same manner as in the liquid crystal display device 100. The shift registers 111, 112 function as scanning line drive circuits. The shift register 84 according to the third example of the eighth embodiment is used as the shift registers 111, 112.

The shift register 111 is arranged along one side (left side in FIG. 36) of the display area, and the shift register 112 is arranged along the opposite side (right side in FIG. 36) of the display area. Each of the shift registers 111, 112 has the n output terminals O1 to On. An i-th (i is an integer not less than 1 and not more than n) output terminal Oi of the shift register 111 is connected to one end (left end in FIG. 36) of an odd-numbered scanning line GL2i-1. The shift register 111 drives the odd-numbered scanning line GL2i-1 from one end side. The i-th output terminal Oi of the shift register 112 is connected to the other end (right end in FIG. 36) of an even-numbered scanning line GL2i. The shift register 112 drives the even-numbered scanning line GL2i from other end side. In this manner, in the liquid crystal display device 110, the odd-numbered scanning line GL2i-1 is driven from the one end side using the shift register 111, and the even-numbered scanning line GD2i is driven from, the other end side using the shift register 112. Such a drive method of the scanning lines may be called a comb teeth drive.

The liquid crystal display device 110 includes the shift registers 111, 112 for outputting a plurality of output signals from one unit circuit. As described in the eighth embodiment, in the shift register for outputting a plurality of output signals from one unit circuit, since the first retention period is long, malfunction due to the charge escape from the nodes n1, n3 in the first retention period is likely to occur. According to the shift registers 111, 112, it is possible to prevent malfunction due to the noise imposed on the low level potential VSS supplied from the supply circuit. Therefore, it is possible to make the liquid crystal display device 110 more reliable using the shift registers 111, 112.

Figure 37:
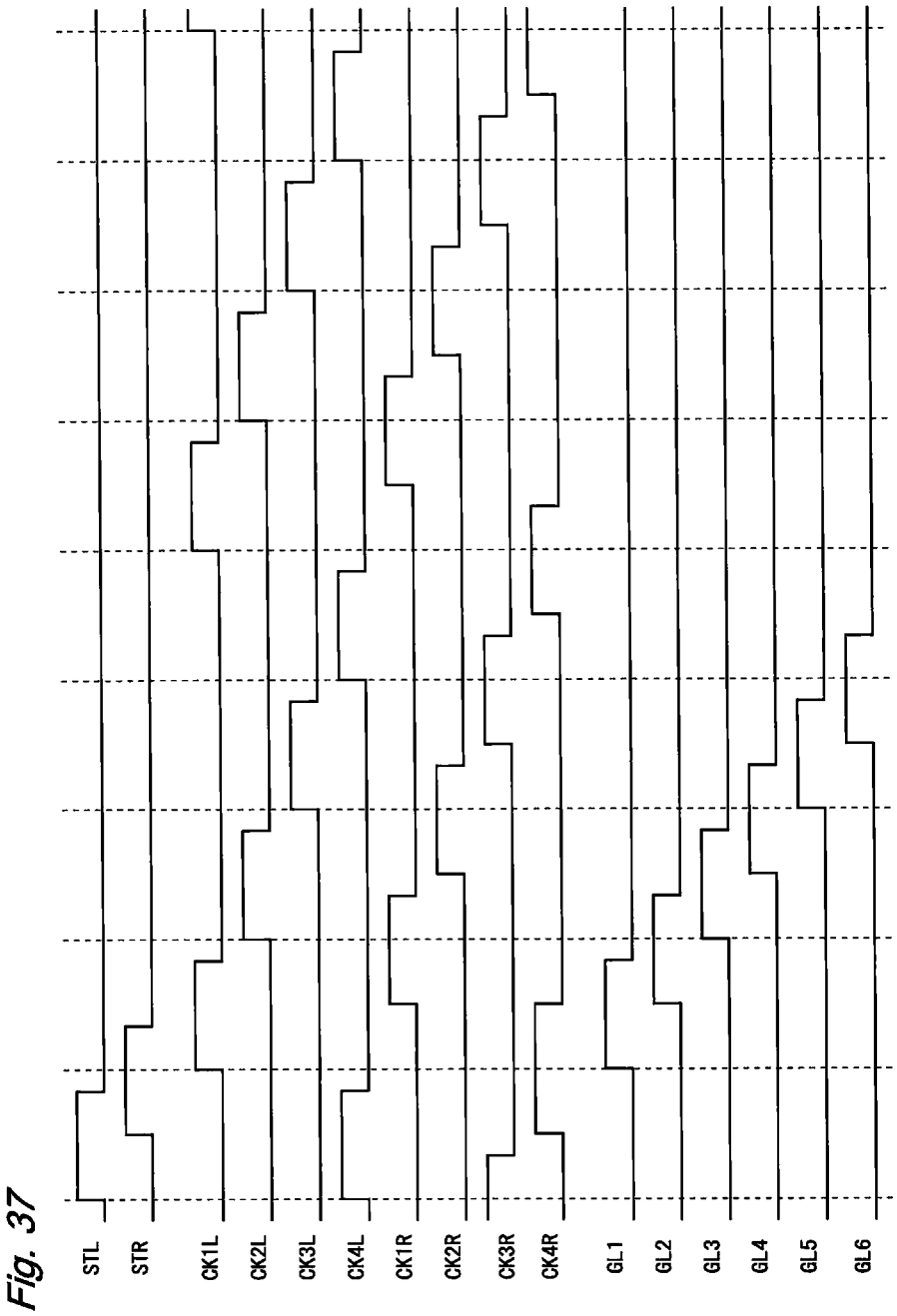
FIG. 37 is a timing chart of the liquid crystal display device shown in FIG. 36 when performing a double pulse drive.
Figure 38:
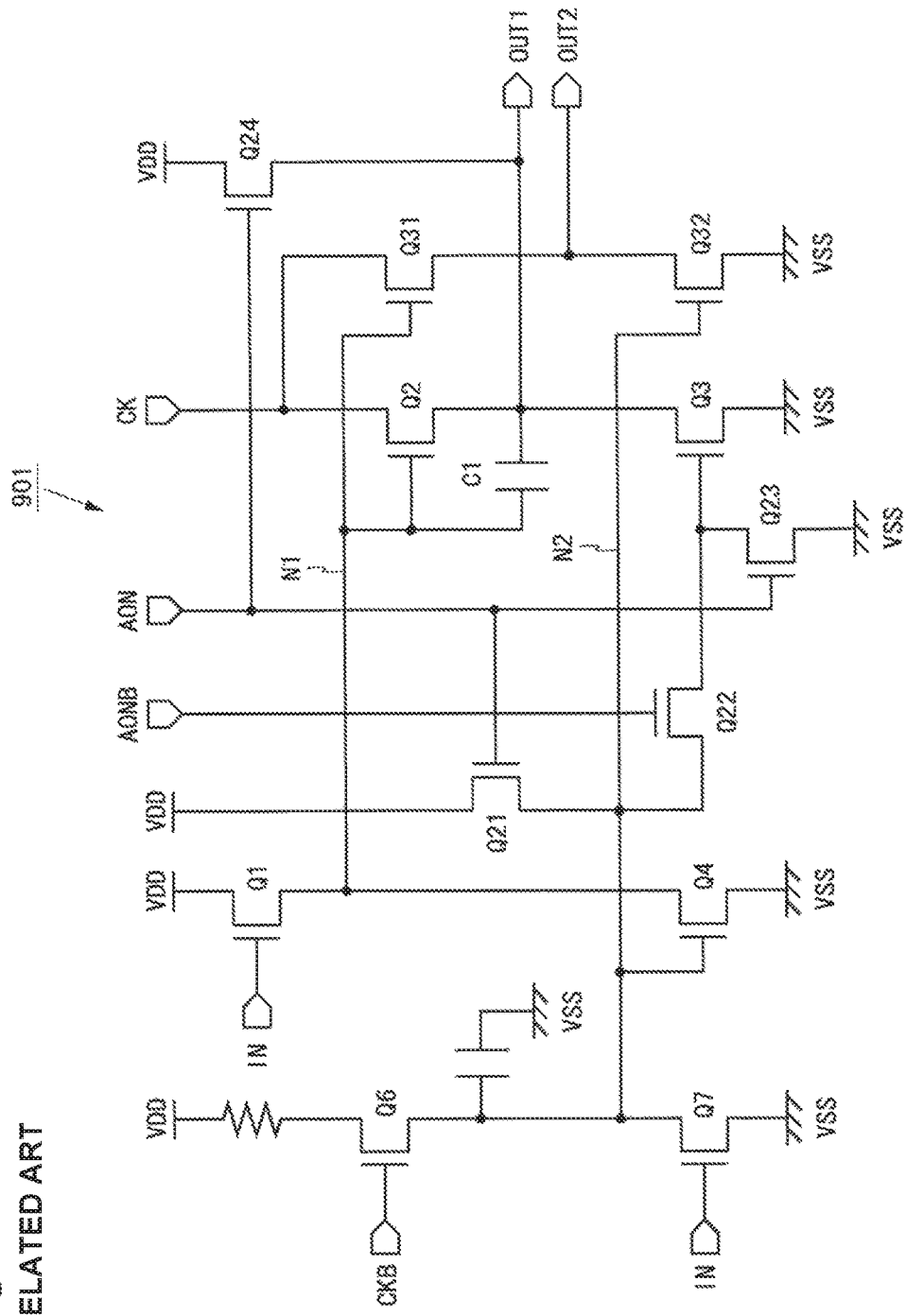
FIG. 38 is a circuit diagram of a unit circuit of a conventional shift register.

A start signal STL and four-phase clock signals CK1L to CK4L are supplied to the shift register 111, and a start signal STR and four-phase clock signals CK1R to CK4R are supplied to the shift register 112. In the liquid crystal display device 110, phases of the five signals supplied to the shift register 111 and phases of the five signals supplied to the shift register 112 may be the same, or may be different by ⅛ cycle of the clock signal. The latter drive method may be called a double pulse drive. A timing chart of the liquid crystal display device 110 when performing the double pulse drive is shown in FIG. 37.

When the liquid crystal display device 110 performs the comb teeth drive, since high level periods corresponding to two adjacent scanning lines overlap, high quality display can be performed by extending a write period to the pixel circuit 101. However, when the transistor Tw in the pixel circuit 101 is in the on state, parasitic capacitance between the pixel circuit 101 (or data lines SL1 to SLm) and the scanning lines GL1 to GL2n is increased via the transistor Tw. When high level periods of the scanning lines GL1 to GL2n overlap, a number of the transistors Tw in the on state is increased, and large noise occurs on the scanning lines GL1 to GL2n. In the liquid crystal display device 110 according to the present embodiment, even if the large noise occurs on the scanning lines GL1 to GL2n, the shift registers 111, 112 do not malfunction. Therefore, high quality display can be performed.

As described above, the display device according to the present embodiment includes a plurality of the scanning lines arranged in parallel to each other, a plurality of the data lines arranged in parallel to each other so as to intersect with the scanning lines perpendicularly, a plurality of the pixel circuits arranged corresponding to intersections of the scanning lines and the data lines, and one of the shift registers described above as a scanning line drive circuit for driving the scanning lines. Therefore, a reliable display device can be configured using a shift register which prevents malfunction due to the noise imposed on the potential supplied from the power supply circuit.

As for the shift registers described above, shift registers according to various kinds of variants can be configured by arbitrarily combining features of a plurality of the unit circuits, unless contrary to the nature thereof.

INDUSTRIAL APPLICABILITY

The shift register of the present invention has a feature that it can prevent malfunction due to noise imposed on an off potential supplied from a power supply circuit. Therefore, the shift register can be used, for example, for a drive circuit of a display device and the like.

DESCRIPTION OF REFERENCE CHARACTERS 10, 30, 50, 60, 80, 82, 84, 86, 103, 111, 112: SHIFT REGISTER
11, 12, 13, 14, 15, 21, 31, 41, 51, 61, 71, 81, 83, 91: UNIT CIRCUIT
62: INITIALIZATION SIGNAL GENERATION CIRCUIT
100, 110: LIQUID CRYSTAL DISPLAY DEVICE
101: PIXEL CIRCUIT
102: DISPLAY CONTROL CIRCUIT
104: DATA LINE DRIVE CIRCUIT
Tr1, Tr1b, Tr1c: TRANSISTOR (OUTPUT TRANSISTOR)
Tr2, Tr2b, Tr2c: TRANSISTOR (OUTPUT RESET TRANSISTOR)
Tr3: TRANSISTOR (FIRST TRANSISTOR)
Tr4, Tr17: TRANSISTOR (SECOND TRANSISTOR)
Tr5: TRANSISTOR (THIRD TRANSISTOR)
Tr6: TRANSISTOR (FOURTH TRANSISTOR)
Tr7: TRANSISTOR (FIFTH TRANSISTOR)
Tr9 to Tr11: TRANSISTOR (CONTROL TRANSISTOR)
Tr23, Tr25: TRANSISTOR (SET TRANSISTOR)
Tr24, Tr26: TRANSISTOR (RESET TRANSISTOR)
Tr8, Tr12 to Tr16, Tr8b, Tr12b, Tr13b, Tr16b, Tr8c, Tr12c, Tr13c, Tr16c, Tr21, Tr22, Tr27 to Tr29: TRANSISTOR

The invention claimed is:

1. A shift register having a configuration in which a plurality of unit circuits are connected in multi-stage and configured to operate in accordance with a clock signal and a control signal supplied from an outside, wherein
the unit circuit comprises:
an output transistor having a first conduction terminal connected to a clock terminal configured to input the clock signal, a second conduction terminal connected to an output terminal configured to output the clock signal, and a control terminal connected to a first node;
an output reset transistor having a first conduction terminal connected to the output terminal, a second conduction terminal to which an off potential is applied, and a control terminal connected to a second node; and
a node control unit configured to control potentials of the first and second nodes,
the node control unit includes a control transistor provided corresponding to at least one of the first and second nodes and configured to control a potential of a corresponding node via a first conduction terminal,
the control transistor has a control terminal to which a first control signal that is included in the control signal and becomes an off level at least when performing a normal operation is supplied, and a second conduction terminal to which a second control signal that is included in the control signal and becomes the off level when the first control signal is at an on level is supplied,
the first control signal is an all-on control signal which becomes the on level when performing an all-on output, and
the second control signal is one of an initialization signal which becomes the on level when performing an initialization, a negative signal of the all-on control signal, and a start signal which becomes the on level when starting shift.

2. The shift register according to claim 1, wherein the node control unit includes, as the control transistor, a first control transistor provided corresponding to the first node and configured to control the potential of the first node via a first conduction terminal, and a second control transistor provided corresponding to the second node and configured to control the potential of the second node via a first conduction terminal.

3. The shift register according to claim 1, wherein
the control transistor is provided corresponding to the second node,
the first control signal is the all-on control signal which becomes the on level when performing the all-on output, and
the second control signal is one of the start signal which becomes the on level when starting shift and the negative signal of the all-on control signal.

4. The shift register according to claim 1, wherein
the node control unit further includes:
a first transistor configured to control the potential of the first node to be the on level in accordance with an input signal of the unit circuit;
a second transistor configured to control the potential of the first node to be the off level in accordance with the potential of the second node;
a third transistor configured to control the potential of the second node to be the off level in accordance with the input signal; and
a fourth transistor configured to control the potential of the second node to be the on level in accordance with a second clock signal of the unit circuit.

5. The shift register according to claim 4, wherein
the node control unit further includes:
a fifth transistor configured to control the potential of the second node to be the on level in accordance with the initialization signal which becomes the on level when performing the initialization; and
a transistor having a first conduction terminal connected to the second node, a second conduction terminal to which the off potential is applied, and a control terminal connected to the output terminal, and
the unit circuit further comprises a transistor configured to control a potential of the output terminal to be the on level in accordance with the all-on control signal which becomes the on level when performing the all-on output.

6. The shift register according to claim 5, wherein the first transistor is configured to supply the negative signal of the all-on control signal to the first node in accordance with the input signal.

7. The shift register according to claim 5, wherein
the node control unit further includes:
a transistor configured to supply an on potential to the first transistor in accordance with the negative signal of the all-on control signal;
a transistor having a conduction terminal connected to the second node, a conduction terminal connected to a third node, and a control terminal to which the negative signal of the all-on control signal is supplied; and
a transistor configured to control the potential of the second node to be the off level in accordance with the all-on control signal, and a control terminal of the second transistor, a second conduction terminal of the fourth transistor, and a second conduction terminal of the fifth transistor are connected to the third node.

8. The shift register according to claim 4, wherein in the unit circuit in a first stage, the second control signal is supplied to a second conduction terminal of the third transistor.

9. The shift register according to claim 4, wherein the node control unit further includes a transistor having a conduction terminal connected to the first node, a conduction terminal connected to one conduction terminals of the first and second transistors, and a control terminal to which an on potential is fixedly applied.

10. The shift register according to claim 4, wherein one conduction terminals of the first and second transistors are connected to the first node.

11. The shift register according to claim 1, wherein the unit circuit comprises a plurality of the output transistors and a plurality of the output reset transistors.

12. A circuit comprising:
a shift register according to claim 1; and
a control signal generation circuit configured to generate a control signal to be supplied to the shift register, wherein
the control signal generation circuit includes:
a set transistor configured to apply an on potential to a node; and
a reset transistor having a first conduction terminal connected to the node, a control terminal to which a first control signal that becomes the off level at least when performing the normal operation is supplied from the outside, and a second conduction terminal to which a second control signal that becomes the off level when the first control signal is at the on level is supplied from the outside.

13. A display device comprising:
a plurality of scanning lines arranged in parallel to each other;
a plurality of data lines arranged in parallel to each other so as to intersect with the scanning lines perpendicularly;
a plurality of pixel circuits arranged corresponding to intersections of the scanning lines and the data lines; and
a shift register according to claim 1 as a scanning line drive circuit configured to drive the scanning lines.

14. A shift register having a configuration in which a plurality of unit circuits are connected in multi-stage and configured to operate in accordance with a clock signal and a control signal supplied from an outside, wherein
the unit circuit comprises:
an output transistor having a first conduction terminal connected to a clock terminal configured to input the clock signal, a second conduction terminal connected to an output terminal configured to output the clock signal, and a control terminal connected to a first node;
an output reset transistor having a first conduction terminal connected to the output terminal, a second conduction terminal to which an off potential is applied, and a control terminal to which a second clock signal is supplied; and
a node control unit configured to control a potential of the first node, the node control unit includes a control transistor configured to control the potential of the first node via a first conduction terminal,
the control transistor has a control terminal to which a first control signal that is included in the control signal and becomes an off level at least when performing a normal operation is supplied, and a second conduction terminal to which a second control signal that is included in the control signal and becomes the off level when the first control signal is at an on level is supplied,
the first control signal is an all-on control signal which becomes the on level when performing an all-on output, and
the second control signal is one of an initialization signal which becomes the on level when performing an initialization, a negative signal of the all-on control signal, and a start signal which becomes the on level when starting shift.

15. The shift register according to claim 14, wherein the node control unit further includes:
a first transistor configured to control the potential of the first node to be the on level in accordance with an input signal of the unit circuit; and
a second transistor configured to control the potential of the first node to be the off level in accordance with the second clock signal.

16. The shift register according to claim 15, wherein the unit circuit further comprises:
a transistor configured to control a potential of the output terminal to be the on level in accordance with the all-on control signal which becomes the on level when performing the all-on output; and
a transistor configured to control the potential of the output terminal to be the off level in accordance with the initialization signal which becomes the on level when performing the initialization, and
the node control unit further includes a transistor configured to supply the input signal to a first conduction terminal of the first transistor in accordance with the negative signal of the all-on control signal.

17. A shift register having a configuration in which a plurality of unit circuits are connected in multi-stage and configured to operate in accordance with a clock signal and a control signal supplied from an outside, wherein
the unit circuit comprises:
an output transistor having a first conduction terminal connected to a clock terminal configured to input the clock signal, a second conduction terminal connected to an output terminal configured to output the clock signal, and a control terminal connected to a first node;
an output reset transistor having a first conduction terminal connected to the output terminal, a second conduction terminal to which an off potential is applied, and a control terminal connected to a second node; and
a node control unit configured to control potentials of the first and second nodes,
the node control unit includes a control transistor provided corresponding to the first node and configured to control a potential of the first node via a first conduction terminal,
the control transistor has a control terminal to which a first control signal that is included in the control signal and becomes an off level at least when performing a normal operation is supplied, and a second conduction terminal to which a second control signal that is included in the control signal and becomes the off level when the first control signal is at an on level is supplied, the first control signal is an initialization signal which becomes the on level when performing an initialization, and the second control signal is one of an all-on control signal which becomes the on level when performing an all-on output, a start signal which becomes the on level when starting shift, and a negative signal of the initialization signal.

18. The shift register according to claim 17, wherein the node control unit further includes:
a first transistor configured to control the potential of the first node to be the on level in accordance with an input signal of the unit circuit;
a second transistor configured to control the potential of the first node to be the off level in accordance with the potential of the second node;
a third transistor configured to control the potential of the second node to be the off level in accordance with the input signal;
a fourth transistor configured to control the potential of the second node to be the on level in accordance with a second clock signal of the unit circuit;
a fifth transistor configured to control the potential of the second node to be the on level in accordance with the initialization signal which becomes the on level when performing the initialization; and
a transistor having a first conduction terminal connected to the second node, a second conduction terminal to which the off potential is applied, and a control terminal connected to the output terminal, and
the unit circuit further comprises a transistor configured to control a potential of the output terminal to be the on level in accordance with the all-on control signal which becomes the on level when performing the all-on output.

19. The shift register according to claim 17, wherein the node control unit further includes:
a first transistor configured to control the potential of the first node to be the on level in accordance with an input signal of the unit circuit;
a second transistor configured to control the potential of the first node to be the off level in accordance with the potential of the second node;
a third transistor configured to control the potential of the second node to be the off level in accordance with the input signal; and
a fourth transistor configured to control the potential of the second node to be the on level in accordance with a second clock signal of the unit circuit, and
in the unit circuit in a first stage, the second control signal is supplied to a second conduction terminal of the third transistor.

* * * * *